(12) United States Patent
Tanaka

(10) Patent No.: US 12,183,488 B2
(45) Date of Patent: Dec. 31, 2024

(54) ELECTRONIC COMPONENT

(71) Applicant: ROHM CO., LTD., Kyoto (JP)

(72) Inventor: Bungo Tanaka, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 203 days.

(21) Appl. No.: 17/794,476

(22) PCT Filed: Feb. 22, 2021

(86) PCT No.: PCT/JP2021/006606
§ 371 (c)(1),
(2) Date: Jul. 21, 2022

(87) PCT Pub. No.: WO2021/177071
PCT Pub. Date: Sep. 10, 2021

(65) Prior Publication Data
US 2023/0058805 A1    Feb. 23, 2023

(30) Foreign Application Priority Data

Mar. 3, 2020  (JP) .................................. 2020-036117

(51) Int. Cl.
| | |
|---|---|
| H05K 1/02 | (2006.01) |
| H01C 1/032 | (2006.01) |
| H01C 1/034 | (2006.01) |
| H01C 7/00 | (2006.01) |
| H05K 1/18 | (2006.01) |

(52) U.S. Cl.
CPC ............. *H01C 1/034* (2013.01); *H01C 1/032* (2013.01); *H01C 7/006* (2013.01); *H05K 1/0298* (2013.01); *H05K 1/185* (2013.01); *H05K 2201/10022* (2013.01)

(58) Field of Classification Search
CPC ............................ H05K 1/0298; H05K 1/185
See application file for complete search history.

(56) References Cited

U.S. PATENT DOCUMENTS

2002/0192886 A1  12/2002 Inoue
2009/0302993 A1  12/2009 Fujiwara et al.
(Continued)

FOREIGN PATENT DOCUMENTS

| JP | 2002-334880 A | 11/2002 |
| JP | 2005-235995 A | 9/2005 |
(Continued)

OTHER PUBLICATIONS

Written Opinion of the International Searching Authority for PCT/JP2021/006606, mailed on May 18, 2021.

*Primary Examiner* — Jeremy C Norris
(74) *Attorney, Agent, or Firm* — Rabin & Berdo, P.C.

(57) ABSTRACT

An electronic component of the present disclosure includes a first insulating layer that includes impurities, a thin film resistor formed on the first insulating layer, and a barrier layer that is formed in at least one part of a region between the thin film resistor and the first insulating layer and that obstructs transmission of the impurities. The first insulating layer includes a first surface and a concave portion that is hollowed with respect to the first surface, and the barrier layer may include a first part embedded in the concave portion and a second part formed along the first surface of the first insulating layer from an upper area of the first part.

18 Claims, 33 Drawing Sheets

(56) References Cited

U.S. PATENT DOCUMENTS

2012/0075029 A1    3/2012  Sekine
2015/0115410 A1*   4/2015  Tokumitsu .......... H01L 23/5228
                                                        257/536

FOREIGN PATENT DOCUMENTS

JP    2012-074481 A    4/2012
JP    2015-088585 A    5/2015

* cited by examiner

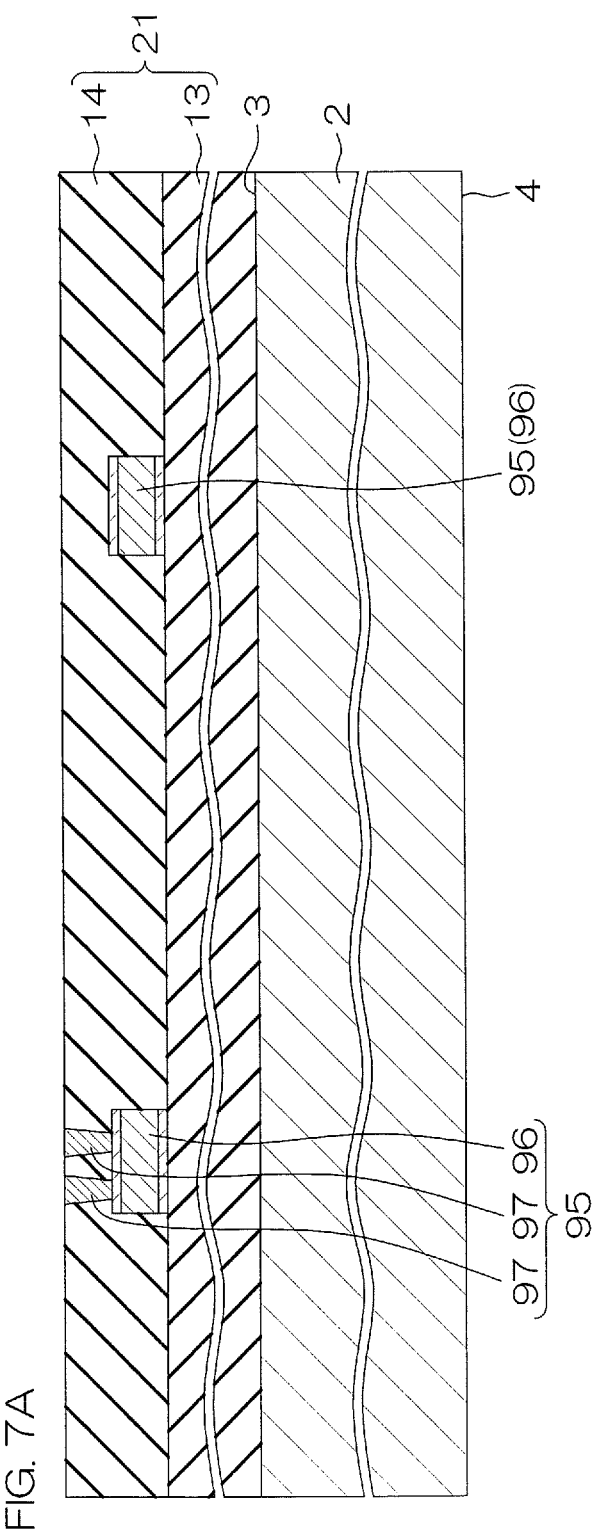

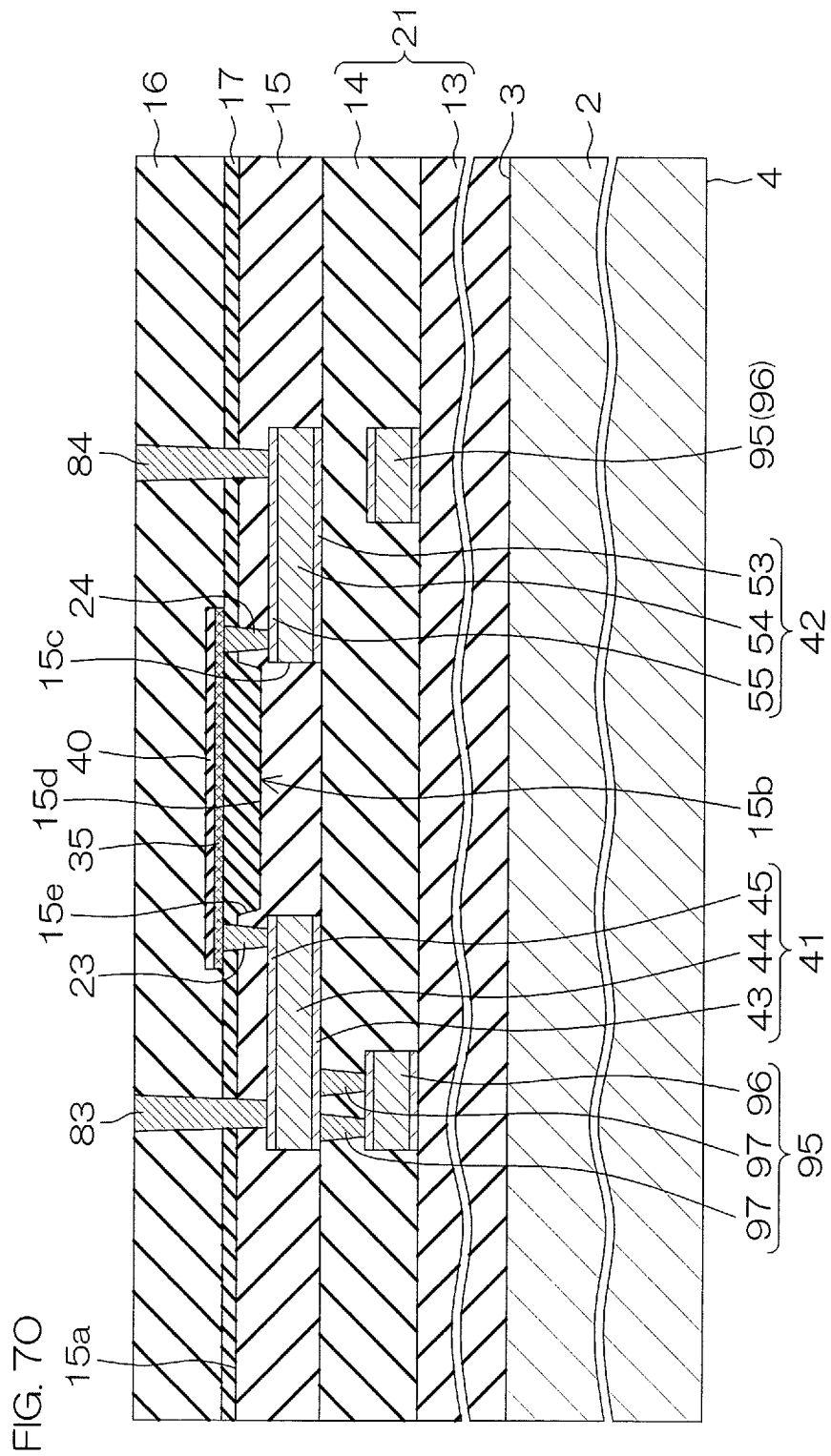

ELECTRONIC COMPONENT

TECHNICAL FIELD

This disclosure relates to an electronic component.

BACKGROUND ART

Patent Literature 1 discloses an electric component that includes a first-layer metal wiring pattern formed on a first interlayer insulating film, a second interlayer insulating film with which the first-layer metal wiring pattern is covered, a CrSi thin film resistor formed on the second interlayer insulating film, and a first electroconductive plug that electrically connects the CrSi thin film resistor and the first-layer metal wiring pattern together.

CITATION LIST

Patent Literature

Patent Literature 1: Japanese Patent Application Publication No. 2005-235995

SUMMARY OF INVENTION

Solution to Problem

An electronic component according to a preferred embodiment of the present disclosure includes a first insulating layer that includes impurities, a thin film resistor formed on the first insulating layer, and a barrier layer that is formed in at least one part of a region between the thin film resistor and the first insulating layer and that obstructs transmission of the impurities.

An electronic component producing method according to a preferred embodiment of the present disclosure includes a step of forming a lower wiring layer by sputtering by use of an inert gas, a first step of forming a first insulating layer so as to cover the lower wiring layer, a second step of forming a barrier layer, which obstructs transmission of compositions of the inert gas included in the first insulating layer, on the first insulating layer, and a third step of forming a thin film resistor on the barrier layer so as to allow at least one part of the thin film resistor to overlap the barrier layer.

BRIEF DESCRIPTION OF DRAWINGS

FIG. 7A is a cross-sectional view of a part, which corresponds to FIG. 2, of the electronic component shown in FIG. 1, and is a cross-sectional view shown to describe an example of a method of producing the electronic component.

FIG. 7O is a cross-sectional view shown to describe a step subsequent to that of FIG. 7N.

DESCRIPTION OF EMBODIMENTS

Preferred Embodiments of Present Disclosure

Next, preferred embodiments of the present disclosure will be described in detail with reference to the accompanying drawings.

First Preferred Embodiment

Figure 1:
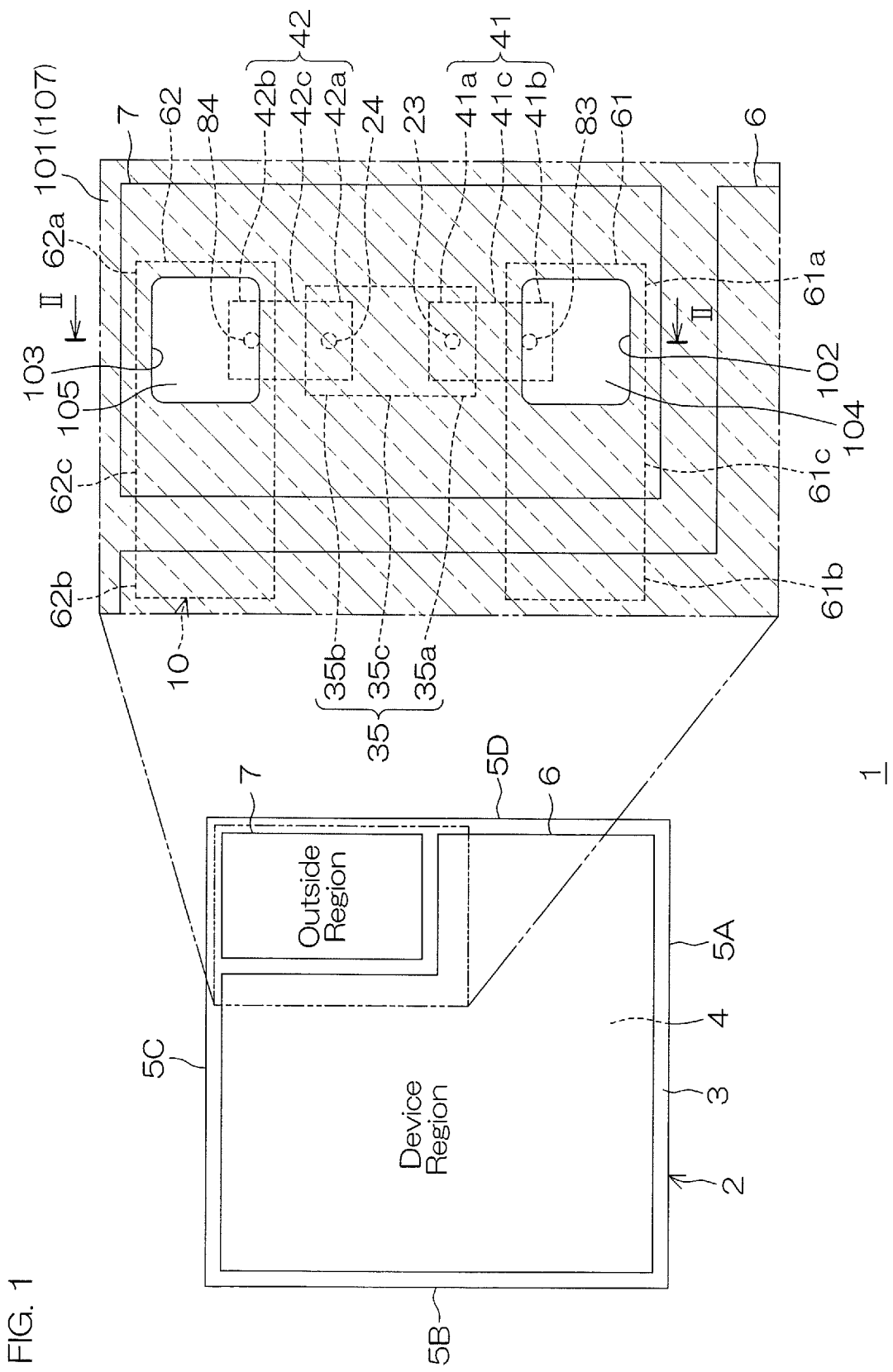
FIG. 1 is a schematic plan view showing an electronic component according to a first preferred embodiment of the present disclosure, and is a plan view showing a form in which a thin film resistor according to a first configuration example is incorporated.

FIG. 1 is a schematic plan view showing an electronic component 1 according to a first preferred embodiment of the present disclosure, and is a plan view showing a form in which a barrier layer 17 according to a first configuration example is incorporated.

The electronic component 1 is a semiconductor device including various functional devices that are made of conductor materials or semiconductor materials or that are formed by use of properties, etc., of semiconductor materials. The electronic component 1 includes a semiconductor layer 2 that is an example of a support substrate.

The semiconductor layer 2 is formed in a rectangular parallelepiped shape. The semiconductor layer 2 includes a first principal surface 3 on one side, a second principal surface 4 on the other side, and side surfaces 5A, 5B, 5C, and 5D that connect the first principal surface 3 and the second principal surface 4 together. The first principal surface 3 is a device forming surface. The first principal surface 3 and the second principal surface 4 are each formed in a quadrangular shape (in this embodiment, square shape) in a plan view seen from their normal directions (hereinafter, referred to simply as a "plan view").

The semiconductor layer 2 may be a Si semiconductor layer including Si (silicon). The Si semiconductor layer may have a laminated structure including a Si semiconductor substrate and a Si epitaxial layer. The Si semiconductor layer may have a single layer structure consisting of a Si semiconductor substrate.

The semiconductor layer 2 may be a SiC semiconductor layer including SiC (silicon carbide). The SiC semiconductor layer may have a laminated structure including a SiC semiconductor substrate and a SiC epitaxial layer. The SiC semiconductor layer may have a single layer structure consisting of a SiC semiconductor substrate.

The semiconductor layer 2 may be a compound semiconductor layer including compound semiconductive materials. The compound semiconductor layer may have a laminated structure including a compound semiconductor substrate and a compound semiconductor epitaxial layer. The compound semiconductor layer may have a single layer structure consisting of a compound semiconductor substrate.

The compound semiconductive material may be a group III-V compound semiconductor material. The semiconductor layer 2 may include at least one among AlN (aluminum nitride), InN (indium nitride), GaN (gallium nitride), and GaAs (gallium arsenide) each of which is an example of the group III-V compound semiconductor material.

The semiconductor layer 2 includes a device region 6 and an outside region 7. The device region 6 is a region in which a functional device is formed. The device region 6 is set at a distance from the side surfaces 5A to 5D of the semiconductor layer 2 toward an inward region. In this embodiment, the device region 6 is formed in the shape of the letter L in a plan view. The planar shape of the device region 6 is arbitrary, and is not limited to the planar shape shown in FIG. 1.

The functional device is formed by use of the first principal surface 3 and/or a surface layer portion of the first principal surface 3. The functional device may include at least one among a passive device, a semiconductor rectifier device, and a semiconductor switching device. The passive device may include a semiconductor passive device.

The passive device (semiconductor passive device) may include at least one among a resistor, a capacitor, and a coil. The semiconductor rectifier device may include at least one among a pn junction diode, a Zener diode, a Schottky barrier diode, and a fast recovery diode.

The semiconductor switching device may include at least one among BJT (Bipolar Junction Transistor), MISFET (Metal Insulator Field Effect Transistor), IGBT (Insulated Gate Bipolar Junction Transistor), and JFET (Junction Field Effect Transistor).

The functional device may include a circuit network in which at least two among a passive device (semiconductor passive device), a semiconductor rectifier device, and a semiconductor switching device are combined together. The circuit network may form a part or all of an integrated circuit. The integrated circuit may include SSI (Small Scale Integration), LSI (Large Scale Integration), MSI (Medium Scale Integration), VLSI (Very Large Scale Integration), or ULSI (Ultra-Very Large Scale Integration).

The outside region 7 is a region outside the device region 6. The outside region 7 does not include a functional device. In this embodiment, the outside region 7 is demarcated in a region between the side surfaces 5A to 5D and the device region 6. In this embodiment, the outside region 7 is formed in a quadrangular shape in a plan view. The disposition and the planar shape of the outside region 7 are arbitrary, and are not limited to those shown in FIG. 1. The outside region 7 may be formed at a central portion of the first principal surface 3 in a plan view.

The electronic component 1 includes a resistance circuit 10. A plurality of (two or more) resistance circuits 10 may be formed although an example in which one resistance circuit 10 is formed is described in this embodiment. The resistance circuit 10 is electrically connected to a functional device.

The resistance circuit 10 is formed in the outside region 7. This makes it possible to suppress an electrical influence exerted by the resistance circuit 10 on the device region 6, and makes it possible to suppress an electrical influence exerted by the device region 6 on the resistance circuit 10.

As an example, the resistance circuit 10 is disposed in the outside region 7, thus making it possible to suppress parasitic capacitance between the device region 6 and the resistance circuit 10. In other words, it is possible to reduce noise by raising the Q value of an electronic circuit.

Figure 2:
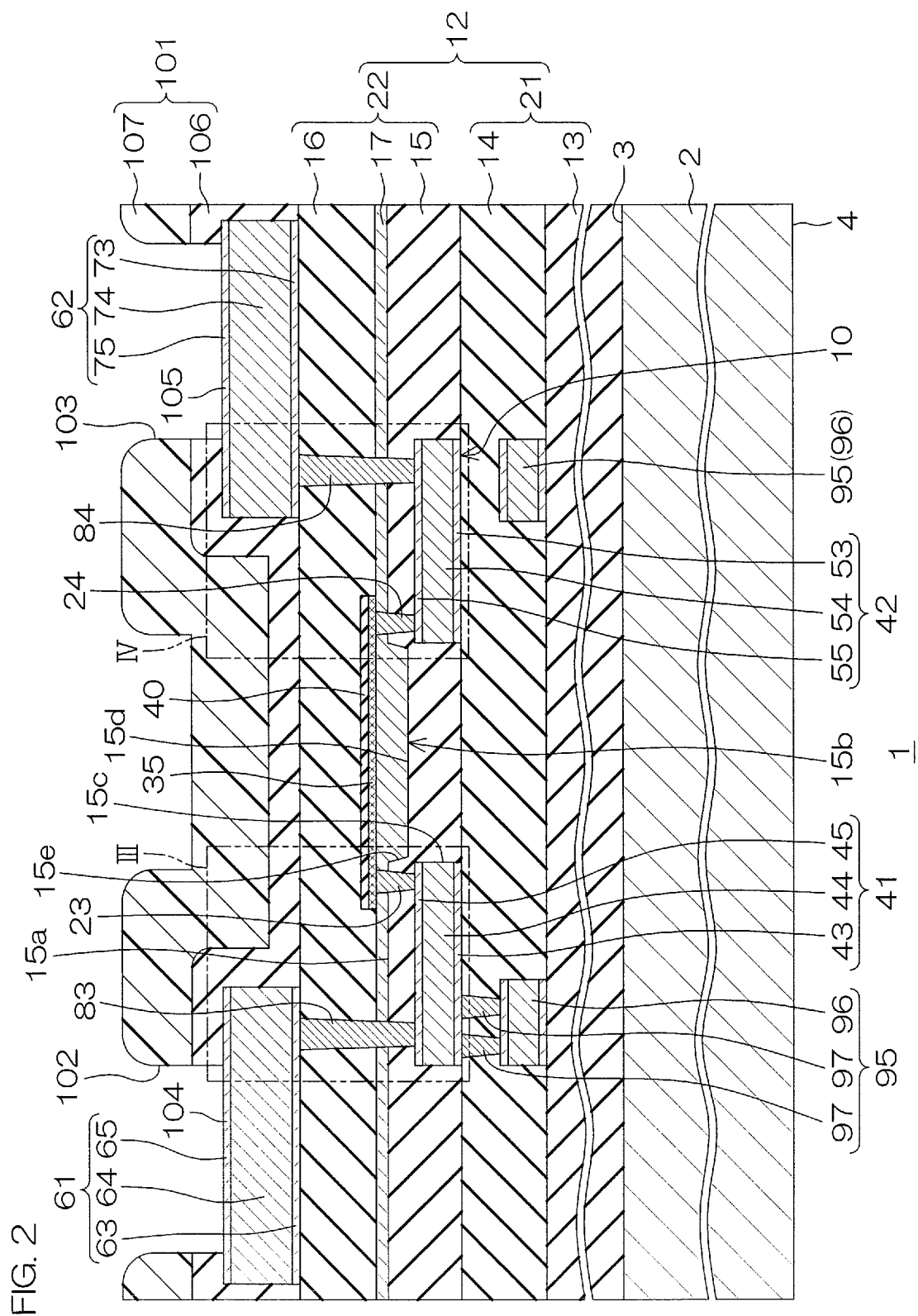
FIG. 2 is a cross-sectional view along line II-II shown in FIG. 1.
Figure 3:
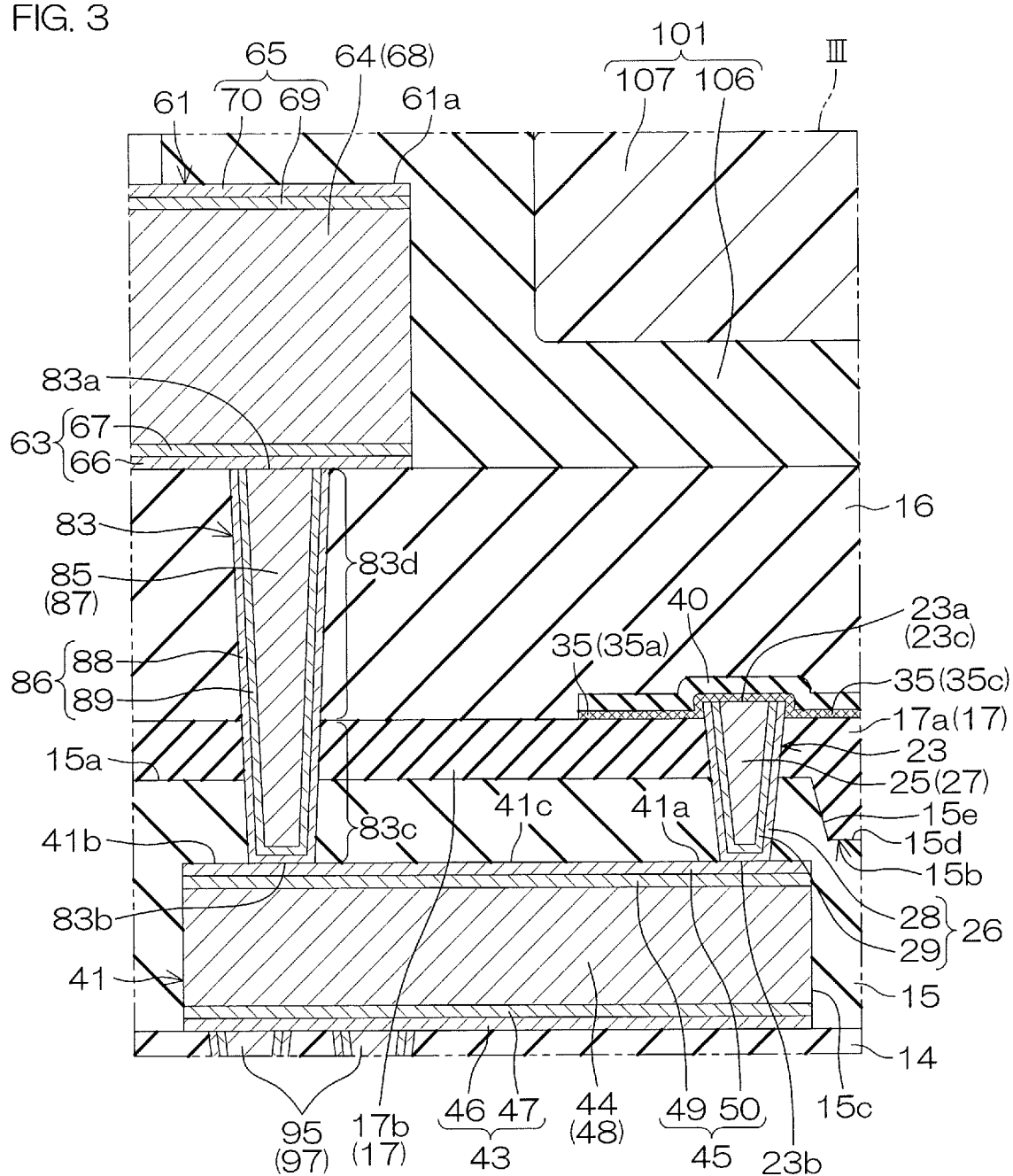
FIG. 3 is an enlarged view of region III shown in FIG. 2.
Figure 4:
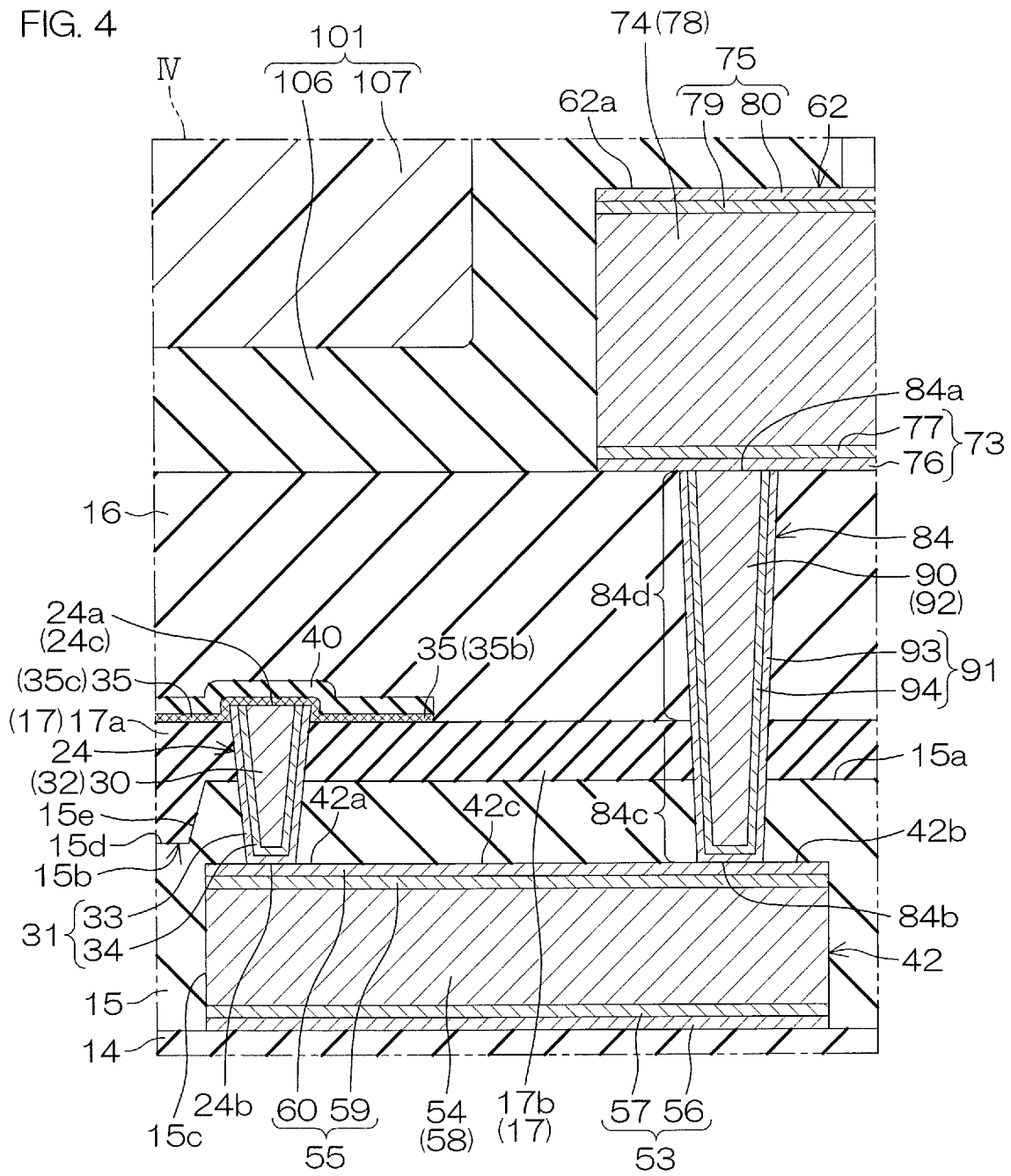
FIG. 4 is an enlarged view of region IV shown in FIG. 2.

A structure of the resistance circuit 10 will be hereinafter described in detail. FIG. 2 is a cross-sectional view along line II-II shown in FIG. 1. FIG. 2 is a cross-sectional view along line II-II shown in FIG. 1. FIG. 3 is an enlarged view of region III shown in FIG. 2. FIG. 4 is an enlarged view of region IV shown in FIG. 2.

Referring to FIG. 2 to FIG. 4, the electronic component 1 includes an insulating laminated structure 12 formed on the first principal surface 3 of the semiconductor layer 2 in the device region 6 and in the outside region 7. The insulating laminated structure 12 has a laminated structure in which a plurality of (in this embodiment, four) insulating layer s are laminated.

In this embodiment, the insulating laminated structure 12 includes a first insulating layer 13, a second insulating layer 14, a third insulating layer 15, a barrier layer 17, and a fourth insulating layer 16 that are laminated in that order from the first principal surface 3 side of the semiconductor layer 2.

The number of insulating layers laminated in the insulating laminated structure 12 is arbitrary, and is not limited to the number of the laminated layers shown in FIG. 2. Therefore, the insulating laminated structure 12 may include insulating layers whose number is less than five, or may include insulating layers whose number is six or more.

The first to fourth insulating layers 13 to 16 and the barrier layer 17 each have a principal surface. The principal surfaces of the first to fourth insulating layers 13 to 16 and the principal surface of the barrier layer 17 are each formed so as to be flat. The principal surfaces of the first to fourth insulating layers 13 to 16 and the principal surface of the barrier layer 17 each extend in parallel with the first principal surface 3 of the semiconductor layer 2. The principal surfaces of the first to fourth insulating layers 13 to 16 and the principal surface of the barrier layer 17 may be each a ground surface. In other words, the principal surfaces of the first to fourth insulating layers 13 to 16 and the principal surface of the barrier layer 17 may each have grinding marks.

The first to fourth insulating layers 13 to 16 and the barrier layer 17 may each have a laminated structure including a silicon oxide film and a silicon nitride film. In this case, the silicon nitride film may be formed on the silicon oxide film, and the silicon oxide film may be formed on the silicon nitride film.

The first to fourth insulating layers 13 to 16 and the barrier layer 17 may each have a single layer structure including a silicon oxide film or a silicon nitride film. Preferably, the first to fourth insulating layers 13 to 16 and the barrier layer 17 are made of the same kind of insulating material. In this embodiment, the first to fourth insulating layers 13 to 16 and the barrier layer 17 each have a single layer structure consisting of a silicon oxide film.

The third insulating layer 15 includes a silicon oxide film formed by, for example, HDP-CDV (High Density Plasma Chemical Vapor Deposition). The third insulating layer 15 may include an impurity. The impurity is an inert gas composition that is used in sputter etching of, for example, a metal thin film or a silicon oxide film, etc. The impurity is, for example, Ar, etc.

The barrier layer 17 includes a silicon oxide film (TEOS film) formed by, for example, P-CDV (Plasma Chemical Vapor Deposition). The barrier layer 17 obstructs the transmission of an impurity included in the third insulating layer 15. From the viewpoint of being made of an insulating material, the barrier layer 17 may be referred to as an "insulating barrier layer," or may be referred to simply as a "fifth insulating layer" in distinction from the first to fourth insulating layers 13 to 16. Additionally, the barrier layer 17 may be referred to as a thin film resistor support layer, a thin film resistor support insulating layer, or the like because the barrier layer 17 is a layer that supports a thin film resistor 35 as described later.

The thicknesses TI of the first to fourth insulating layers 13 to 16 and the thickness TI of the barrier layer 17 may be each not less than 100 nm and not more than 3500 nm. The thickness TI may be not less than 100 nm and not more than 500 nm, not less than 500 nm and not more than 1000 nm, not less than 1000 nm and not more than 1500 nm, not less than 1500 nm and not more than 2000 nm, not less than 2000 nm and not more than 2500 nm, not less than 2500 nm and not more than 3000 nm, or not less than 3000 nm and not more than 3500 nm. Preferably, the thickness TI is not less than 100 nm and not more than 1500 nm. The thicknesses TI of the first to fourth insulating layers 13 to 16 and the thickness TI of the barrier layer 17 may be equal to each other or may differ from each other.

The insulating laminated structure 12 includes a plurality of wirings formed in the first to fourth insulating layers 13 to 16 and in the barrier layer 17. As a result, a multilayer wiring structure is formed. More specifically, the insulating laminated structure 12 includes a wiring circuit forming layer 21 and a resistance circuit forming layer 22.

The wiring circuit forming layer 21 includes the first insulating layer 13 and the second insulating layer 14. Additionally, the wiring circuit forming layer 21 includes a wiring circuit formed in the first insulating layer 13 and in the second insulating layer 14. The wiring circuit of the wiring circuit forming layer 21 is routed from the device region 6 to the outside region 7. A detailed structure of the wiring circuit forming layer 21 is described later.

The resistance circuit forming layer 22 is formed on the wiring circuit forming layer 21. The resistance circuit forming layer 22 includes the third insulating layer 15 and the fourth insulating layer 16. Additionally, the resistance circuit forming layer 22 includes the resistance circuit 10 formed in the third insulating layer 15 and in the fourth insulating layer 16. The resistance circuit 10 is electrically connected to the device region 6 (functional device) through the wiring circuit of the wiring circuit forming layer 21.

For example, the resistance circuit 10 includes a thin film resistor 35, a first via electrode 23 and a second via electrode 24, a first lower wiring layer 41 and a second lower wiring layer 42, a first long via electrode 83 and a second long via electrode 84, and a first upper wiring layer 61 and a second upper wiring layer 62 as shown in FIG. 1 and FIG. 2. These will be hereinafter described in detail.

Referring to FIG. 1 to FIG. 3, the resistance circuit 10 includes the first via electrode 23 and the second via electrode 24. The first via electrode 23 is embedded in the third insulating layer 15 and in the barrier layer 17, and is exposed from the principal surface of the barrier layer 17. The second via electrode 24 is embedded in the third insulating layer 15 and in the barrier layer 17 at a distance from the first via electrode 23, and is exposed from the principal surface of the barrier layer 17.

In this embodiment, the first via electrode 23 is formed in a circular shape in a plan view. The planar shape of the first via electrode 23 is arbitrary. The first via electrode 23 may be formed in a polygonal shape, such as a triangular shape, a quadrangular shape, or a hexagonal shape, or may be formed in an elliptical shape in a plan view.

The first via electrode 23 includes a first end portion 23a on one side and a second end portion 23b on the other side with respect to the normal direction of the principal surface of the barrier layer 17. The first end portion 23a is exposed from the principal surface of the barrier layer 17. The second end portion 23b is placed inside the third insulating layer 15. The first via electrode 23 is formed in a tapered shape in which its width becomes smaller from the first end portion 23a toward the second end portion 23b in a cross-sectional view.

In this embodiment, the first end portion 23a includes a first projecting portion 23c that projects from the principal surface of the barrier layer 17 toward the fourth insulating layer 16. The first projecting portion 23c is formed by the principal surface and the side surface of the first via electrode 23.

The first via electrode 23 has a laminated structure including a main body layer 25 and a barrier layer 26. The main body layer 25 is embedded in the third insulating layer 15 and in the barrier layer 17. The main body layer 25 may include tungsten (W) or copper (Cu). In this embodiment, the main body layer 25 has a single layer structure consisting of a tungsten layer 27.

The barrier layer 26 is interposed between the third insulating layer 15 and the main body layer 25. In this embodiment, the barrier layer 26 has a laminated structure in which a plurality of electrode layers are laminated. In this embodiment, the barrier layer 26 includes a Ti layer 28 and a TiN layer 29 formed in that order from the third insulating layer 15. The Ti layer 28 is in contact with the third insulating layer 15. The TiN layer 29 is in contact with the main body layer 25. The barrier layer 26 may have a single layer structure consisting of the Ti layer 28 or the TiN layer 29.

In this embodiment, the second via electrode 24 is formed in a circular shape in a plan view. The planar shape of the second via electrode 24 is arbitrary. The second via electrode 24 may be formed in a polygonal shape, such as a triangular shape, a quadrangular shape, or a hexagonal shape, or may be formed in an elliptical shape in a plan view.

The second via electrode 24 includes a first end portion 24a on one side and a second end portion 24b on the other side with respect to the normal direction of the principal surface of the barrier layer 17. The first end portion 24a is exposed from the principal surface of the barrier layer 17. The second end portion 24b is placed inside the third insulating layer 15. The second via electrode 24 is formed in a tapered shape in which its width becomes smaller from the first end portion 24a toward the second end portion 24b in a cross-sectional view.

In this embodiment, the first end portion 24a includes a second projecting portion 24c that projects from the principal surface of the barrier layer 17 toward the fourth insulating layer 16. The second projecting portion 24c is formed by the principal surface and the side surface of the second via electrode 24.

The second via electrode 24 has a laminated structure including a main body layer 30 and a barrier layer 31. The main body layer 30 is embedded in the third insulating layer 15 and in the barrier layer 17. The main body layer 30 may include tungsten (W) or copper (Cu). In this embodiment, the main body layer 30 has a single layer structure consisting of a tungsten layer 32.

The barrier layer 31 is interposed between the third insulating layer 15 and the main body layer 30. In this embodiment, the barrier layer 31 has a laminated structure in which a plurality of electrode layers are laminated. In this embodiment, the barrier layer 31 includes a Ti layer 33 and a TiN layer 34 formed in that order from the third insulating layer 15. The Ti layer 33 is in contact with the third insulating layer 15. The TiN layer 34 is in contact with the main body layer 30. The barrier layer 31 may have a single layer structure consisting of the Ti layer 33 or the TiN layer 34.

Referring to FIG. 2 to FIG. 4, the resistance circuit 10 includes a thin film resistor 35 formed inside the insulating laminated structure 12. The thin film resistor 35 is formed at the resistance circuit forming layer 22. In other words, the thin film resistor 35 is formed on the first principal surface 3. More specifically, the thin film resistor 35 is formed at a distance from the first principal surface 3 in the lamination direction of the insulating laminated structure 12.

The thin film resistor 35 is formed in the outside region 7. This makes it possible to suppress an electrical influence exerted by the thin film resistor 35 on the device region 6, and makes it possible to suppress an electrical influence exerted by the device region 6 on the thin film resistor 35. As an example, it is possible to suppress parasitic capacitance between the device region 6 and the thin film resistor 35. In other words, it is possible to reduce noise by raising the Q value of an electronic circuit.

More specifically, the thin film resistor 35 is interposed in a region between the barrier layer 17 and the fourth insulating layer 16. The thin film resistor 35 is formed in a film shape on the principal surface of the barrier layer 17. The thin film resistor 35 occupies the principal surface of the barrier layer 17. A film-shaped or layer-shaped wiring excluding the thin film resistor 35 is not formed on the principal surface of the barrier layer 17 in the device region 6 and in the outside region 7.

Referring to FIG. 2, the barrier layer 17 overlaps the entirety of the thin film resistor 35. In this case, the barrier layer 17 may cover the entirety of the third insulating layer 15. The barrier layer 17 is merely required to be interposed in at least one part of a region between the thin film resistor 35 and the third insulating layer 15. Therefore, the barrier layer 17 may be configured to overlap only a part of the thin film resistor 35. The barrier layer 17 obstructs the transmission of impurities, and therefore the thin film resistor 35 becomes insusceptible to impurities by interposing the barrier layer 17 between the thin film resistor 35 and the third insulating layer 15.

Figure 5:
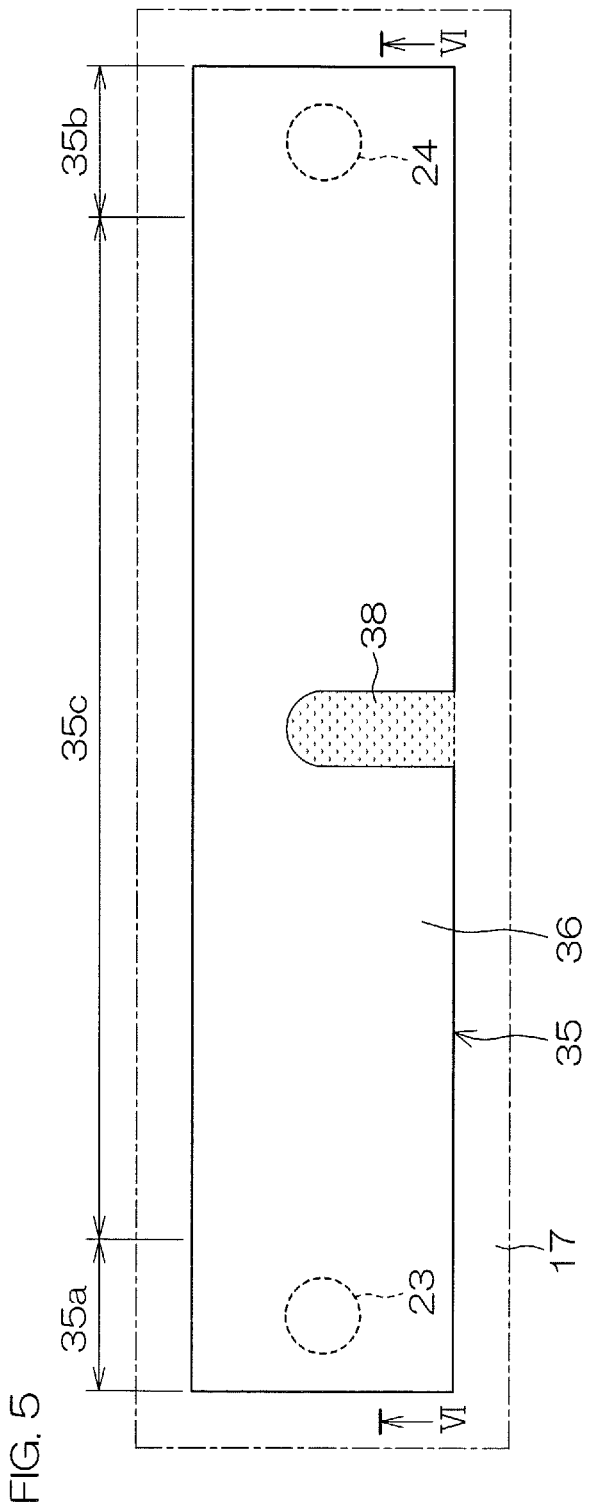
FIG. 5 is a plan view showing a thin film resistor.
Figure 6:
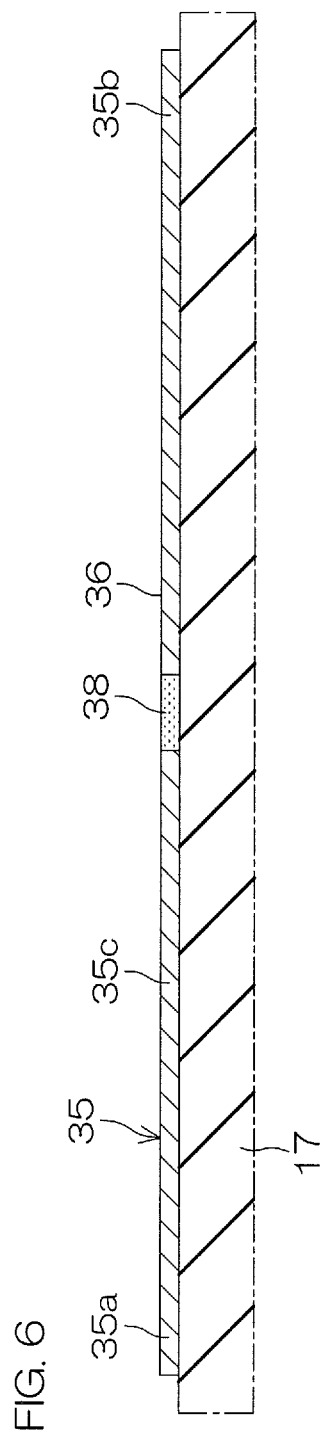
FIG. 6 is a cross-sectional view along line VI-VI shown in FIG. 5.

FIG. 5 is a plan view showing the thin film resistor 35. FIG. 6 is a cross-sectional view along line VI-VI shown in FIG. 5. Referring to FIG. 5 and FIG. 6, the thin film resistor 35 is formed so as to straddle the first via electrode 23 and the second via electrode 24. Hence, the thin film resistor 35 is electrically connected to the first via electrode 23 and to the second via electrode 24. In this embodiment, the thin film resistor 35 is formed in a quadrangular shape (in more detail, a rectangular shape) in a plan view. The planar shape of the thin film resistor 35 is arbitrary, and is not limited to the quadrangular shape.

The thin film resistor 35 includes a first end portion 35a on one side, a second end portion 35b on the other side, and a connection portion 35c that connects the first and second end portions 35a and 35b together. The first end portion 35a covers the first via electrode 23. More specifically, the first end portion 35a covers the first end portion 23a (first projecting portion 23c) of the first via electrode 23. The first end portion 35a is formed in a film shape along the principal surface and the side surface of the first via electrode 23.

The second end portion 35b covers the second via electrode 24. More specifically, the second end portion 35b covers the first end portion 24a (second projecting portion 24c) of the second via electrode 24. The second end portion 35b is formed in a film shape along the principal surface and the side surface of the second via electrode 24.

The connection portion 35c extends in a belt shape in a region between the first end portion 35a and the second end portion 35b. In this embodiment, the connection portion 35c extends in a belt shape along a straight line that connects the first end portion 35a and the second end portion 35b together. In this embodiment, the first end portion 35a, the second end portion 35b, and the connection portion 35c are each formed with a uniform width.

The thin film resistor 35 includes chromium silicide. In this embodiment, the thin film resistor 35 includes crystallized chromium silicide. The thin film resistor 35 is a so-called metal silicide thin film resistor. With the thin film resistor 35 that is a metal silicide thin film resistor, it is possible to appropriately realize film thinning and plane-area reduction unlike conductive polysilicon, etc.

This makes it possible to appropriately interpose the thin film resistor 35 in a region between the barrier layer 17 and the fourth insulating layer 16 while securing flatness. Additionally, it is possible to appropriately reduce the plane area of the thin film resistor 35, and therefore it is possible to relax a design rule. This makes it possible to appropriately dispose the thin film resistor 35 in the outside region 7.

Therefore, it is possible to appropriately suppress an electrical impact between the thin film resistor 35 and the device region 6.

The thin film resistor 35 may include at least one among CrSi, CrSi2, CrSiN, and CrSiO as an example of chromium silicide. CrSiN is also chromium nitride. CrSiO is also chromium oxide. In this embodiment, the thin film resistor 35 is made of CrSi.

The thin film resistor 35 has a thickness TR of 1 μm or less. Preferably, the thickness TR is equal to or less than 500 nm. More preferably, the thickness TR is not less than 0.1 nm and not more than 100 nm. The thickness TR may be not less than 0.1 nm and not more than 5 nm, not less than 5 nm and not more than 10 nm, not less than 10 nm and not more than 20 nm, not less than 20 nm and not more than 40 nm, not less than 40 nm and not more than 60 nm, not less than 60 nm and not more than 80 nm, or not less than 80 nm and not more than 100 nm. Most preferably, the thickness TR is not less than 1 nm and not more than 5 nm.

A sheet resistance value RT of the thin film resistor 35 may be not less than 100Ω/□ and not more than 50000Ω/□. The sheet resistance value RT may be not less than 100Ω/□ and not more than 5000Ω/□, not less than 5000Ω/□ and not more than 10000Ω/□, not less than 10000Ω/□ and not more than 15000Ω/□, not less than 15000Ω/□ and not more than 20000Ω/□, not less than 20000Ω/□ and not more than 25000Ω/□, not less than 25000Ω/□ and not more than 30000Ω/□, not less than 30000Ω/□ and not more than 35000Ω/□, not less than 35000Ω/□ and not more than 40000Ω/□, not less than 40000Ω/□ and not more than 45000Ω/□, or not less than 45000Ω/□ and not more than 50000 Ω/□.

The chromium content with respect to the overall weight of the thin film resistor 35 may be not less than 5% by weight and not more than 50% by weight. The Cr content may be not less than 5% by weight and not more than 10% by weight, not less than 10% by weight and not more than 20% by weight, not less than 20% by weight and not more than 30% by weight, not less than 30% by weight and not more than 40% by weight, or not less than 40% by weight and not more than 50% by weight.

Referring to FIG. 5, the thin film resistor 35 includes a trimming mark 38. The trimming mark 38 is shown by dot hatching in FIG. 5 and FIG. 6.

The trimming mark 38 is a region in which a part of the thin film resistor 35 (chromium silicide) has been eliminated. More specifically, the trimming mark 38 is a laser processing mark in which a part of the thin film resistor 35 (chromium silicide) has been eliminated by a laser irradiation method.

In this embodiment, the trimming mark 38 is formed at the connection portion 35c of the thin film resistor 35. The trimming mark 38 may be formed at either one or both of the first end portion 35a and the second end portion 35b.

The trimming mark 38 extends in a direction intersecting a direction in which the thin film resistor 35 extends. In this embodiment, the trimming mark 38 extends in a direction perpendicular to the direction in which the thin film resistor 35 extends. The trimming mark 38 may extend in the direction in which the thin film resistor 35 extends.

Referring again to FIG. 2 to FIG. 4, the resistance circuit 10 includes a protective layer 40 covering the thin film resistor 35. The protective layer 40 is interposed in a region between the barrier layer 17 and the fourth insulating layer 16, and covers the thin film resistor 35. More specifically, the protective layer 40 is formed in a film shape along a surface of the thin film resistor 35. The protective layer 40 additionally covers the trimming mark 38.

The protective layer 40 has a planar shape matching the planar shape of the thin film resistor 35. The protective layer 40 may have a side surface continuous with a side surface of the thin film resistor 35. The side surface of the protective layer 40 may be formed so as to be flush with the side surface of the thin film resistor 35.

The protective layer 40 may have a laminated structure including a silicon oxide layer and a silicon nitride layer. In this case, the silicon nitride layer may be formed on the silicon oxide layer, or the silicon oxide layer may be formed on the silicon nitride layer. The protective layer 40 may have a single layer structure consisting of a silicon oxide layer or a silicon nitride layer. In this embodiment, the protective layer 40 has a single layer structure consisting of a silicon oxide layer.

The thickness of the protective layer 40 may be not less than 1 nm and not more than 5 μm. The thickness of the protective layer 40 may be not less than 1 nm and not more than 10 nm, not less than 10 nm and not more than 50 nm, not less than 50 nm and not more than 100 nm, not less than 100 nm and not more than 200 nm, not less than 200 nm and not more than 400 nm, not less than 400 nm and not more than 600 nm, not less than 600 nm and not more than 800 nm, or not less than 800 nm and not more than 1 μm.

The thickness of the protective layer 40 may be not less than 1 μm and not more than 1.5 μm, not less than 1.5 μm and not more than 2 μm, not less than 2 μm and not more than 2.5 μm, not less than 2.5 μm and not more than 3 μm, not less than 3 μm and not more than 3.5 μm, not less than 3.5 μm and not more than 4 μm, not less than 4 μm and not more than 4.5 μm, or not less than 4.5 μm and not more than 5 μm.

Preferably, the thickness of the protective layer 40 is equal to or more than the thickness TR of the thin film resistor 35. With the protective layer 40 having a thickness equal to or more than the thickness TR of the thin film resistor 35, it is possible to appropriately bury a bulge formed at the thin film resistor 35.

The resistance circuit 10 includes the first lower wiring layer 41 and the second lower wiring layer 42. The first lower wiring layer 41 is formed inside the third insulating layer 15. More specifically, the first lower wiring layer 41 is formed on the wiring circuit forming layer 21 (second insulating layer 14), and is covered with the third insulating layer 15. The first lower wiring layer 41 is electrically connected to the thin film resistor 35 through the first via electrode 23.

The second lower wiring layer 42 is formed inside the third insulating layer 15. More specifically, the second lower wiring layer 42 is formed on the wiring circuit forming layer 21 (second insulating layer 14), and is covered with the third insulating layer 15. The second lower wiring layer 42 is formed at a distance from the first lower wiring layer 41. The second lower wiring layer 42 is electrically connected to the thin film resistor 35 through the second via electrode 24.

Hence, the thin film resistor 35 is connected in series with the first lower wiring layer 41 and with the second lower wiring layer 42. The thin film resistor 35 is formed on a line that connects the first lower wiring layer 41 and the second lower wiring layer 42 together in a plan view. In this embodiment, the thin film resistor 35 linearly extends in a region between the first lower wiring layer 41 and the second lower wiring layer 42 in a plan view.

The first lower wiring layer 41 and the second lower wiring layer 42 each have a first thickness TL1. The first thickness TL1 may be not less than 100 nm and not more than 3000 nm. The first thickness TL1 of each of the first and second lower wiring layers 41 and 42 may be not less than 100 nm and not more than 500 nm, not less than 500 nm and not more than 1000 nm, not less than 1000 nm and not more than 1500 nm, not less than 1500 nm and not more than 2000 nm, not less than 2000 nm and not more than 2500 nm, or not less than 2500 nm and not more than 3000 nm.

Preferably, the first thickness TL1 is not less than 100 nm and not more than 1500 nm. The first thickness TL1 of the first lower wiring layer 41 and the first thickness TL1 of the second lower wiring layer 42 may differ from each other. Preferably, the first thickness TL1 of the first lower wiring layer 41 and the first thickness TL1 of the second lower wiring layer 42 is equal to each other.

Referring to FIG. 1 and FIG. 3, the first lower wiring layer 41 includes a first end portion 41a on one side, a second end portion 41b on the other side, and a connection portion 41c that connects the first end portion 41a and the second end portion 41b together. The first end portion 41a overlaps the first end portion 35a of the thin film resistor 35 in a plan view. The first end portion 41a is electrically connected to the first end portion 35a of the thin film resistor 35 through the first via electrode 23.

The second end portion 41b is placed in a region outside the thin film resistor 35 in a plan view. In this embodiment, the second end portion 41b is placed in the outside region 7. The connection portion 41c extends in a belt shape in a region between the first end portion 41a and the second end portion 41b in a plan view. In this embodiment, the connection portion 41c extends in a belt shape along a straight line that connects the first end portion 41a and the second end portion 41b together.

In this embodiment, the first lower wiring layer 41 has a laminated structure in which a plurality of electrode layers are laminated. The first lower wiring layer 41 includes a first barrier layer 43, a main body layer 44, and a second barrier layer 45 that are laminated in that order from the top of the wiring circuit forming layer 21 (second insulating layer 14).

In this embodiment, the first barrier layer 43 has a laminated structure including a Ti layer 46 and a TiN layer 47 that are laminated in that order from the top of the wiring circuit forming layer 21 (second insulating layer 14). The first barrier layer 43 may have a single layer structure consisting of the Ti layer 46 or the TiN layer 47.

The main body layer 44 has a resistance value less than the resistance value of the first barrier layer 43 and the resistance value of the second barrier layer 45. The main body layer 44 has a thickness exceeding the thickness of the first barrier layer 43 and the thickness of the second barrier layer 45. The main body layer 44 may include at least one among Al, Cu, an AlSiCu alloy, an AlSi alloy, and an AlCu alloy. In this embodiment, the main body layer 44 has a single layer structure consisting of an AlCu alloy layer 48.

In this embodiment, the second barrier layer 45 has a laminated structure including a Ti layer 49 and a TiN layer 50 that are laminated in that order from the top of the main body layer 44. The second barrier layer 45 may have a single layer structure consisting of the Ti layer 49 or the TiN layer 50.

Referring to FIG. 4, the second lower wiring layer 42 includes a first end portion 42a on one side, a second end portion 42b on the other side, and a connection portion 42c that connects the first end portion 42a and the second end portion 42b together. The first end portion 42a overlaps the second end portion 35b of the thin film resistor 35 in a plan view. The first end portion 42a is electrically connected to the second end portion 35b of the thin film resistor 35 through the second via electrode 24.

The second end portion 42b is placed in a region outside the thin film resistor 35 in a plan view. In this embodiment, the second end portion 42b is placed in the outside region 7. The connection portion 42c extends in a belt shape in a region between the first end portion 42a and the second end portion 42b in a plan view. In this embodiment, the connection portion 42c extends in a belt shape along a straight line that connects the first end portion 42a and the second end portion 42b together.

In this embodiment, the second lower wiring layer 42 has a laminated structure in which a plurality of electrode layers are laminated. The second lower wiring layer 42 includes a first barrier layer 53, a main body layer 54, and a second barrier layer 55 that are laminated in that order from the top of the wiring circuit forming layer 21 (second insulating layer 14).

In this embodiment, the first barrier layer 53 has a laminated structure including a Ti layer 56 and a TiN layer 57 that are laminated in that order from the top of the wiring circuit forming layer 21 (second insulating layer 14). The first barrier layer 53 may have a single layer structure consisting of the Ti layer 56 or the TiN layer 57.

The main body layer 54 has a resistance value less than the resistance value of the first barrier layer 53 and the resistance value of the second barrier layer 55. The main body layer 54 has a thickness exceeding the thickness of the first barrier layer 53 and the thickness of the second barrier layer 55. The main body layer 54 may include at least one among Al, Cu, an AlSiCu alloy, an AlSi alloy, and an AlCu alloy. In this embodiment, the main body layer 54 has a single layer structure consisting of an AlCu alloy layer 58.

In this embodiment, the second barrier layer 55 has a laminated structure including a Ti layer 59 and a TiN layer 60 that are laminated in that order from the top of the main body layer 54. The second barrier layer 55 may have a single layer structure consisting of the Ti layer 59 or the TiN layer 60.

Referring to FIG. 2 to FIG. 4, the third insulating layer 15 has a stepped surface on which the shape of the first lower wiring layer 41 and the shape of the second lower wiring layer 42 are reflected. In other words, the third insulating layer 15 has a first surface 15a serving as a principal surface and a concave portion 15b that is hollowed from the first surface 15a in a region 15c between the first lower wiring layer 41 and the second lower wiring layer 42. The barrier layer 17 may have a first part 17a embedded in the concave portion 15b and a second part 17b formed along the first surface 15a of the third insulating layer 15 from an upper area of the first part 17a. In other words, the barrier layer 17 is thicker than surroundings in the region 15c between the first lower wiring layer 41 and the second lower wiring layer 42.

The concave portion 15b has a bottom surface 15d and an inclined surface 15e that connects the bottom surface 15d and the first surface 15a together. The bottom surface 15d is formed at a position higher than an upper surface of the first lower wiring layer 41 and than an upper surface of the second lower wiring layer 42. Referring to FIG. 3, the concave portion 15b may partially overlap the first end portion 41a of the first lower wiring layer 41. Additionally, referring to FIG. 4, the concave portion 15b may partially overlap the first end portion 42a of the second lower wiring layer 42.

The resistance circuit 10 includes the first upper wiring layer 61 and the second upper wiring layer 62. The first upper wiring layer 61 is formed on the fourth insulating layer 16. The first upper wiring layer 61 forms one of the uppermost wiring layers of the insulating laminated structure 12. The first upper wiring layer 61 is electrically connected to the first lower wiring layer 41.

The second upper wiring layer 62 is formed on the fourth insulating layer 16 at a distance from the first upper wiring layer 61. The second upper wiring layer 62 forms one of the uppermost wiring layers of the insulating laminated structure 12. The second upper wiring layer 62 is electrically connected to the second lower wiring layer 42.

Hence, the thin film resistor 35 is electrically connected to the first upper wiring layer 61 through the first lower wiring layer 41. Additionally, the thin film resistor 35 is electrically connected to the second upper wiring layer 62 through the second lower wiring layer 42. The thin film resistor 35 is connected in series with the first upper wiring layer 61 and with the second upper wiring layer 62 through the first lower wiring layer 41 and through the second lower wiring layer 42.

Referring to FIG. 1, the first upper wiring layer 61 is formed at a distance from the thin film resistor 35 in a plan view. The first upper wiring layer 61 does not overlap the thin film resistor 35 in a plan view. The entirety of the thin film resistor 35 is exposed from the first upper wiring layer 61 in a plan view.

The second upper wiring layer 62 is formed at a distance from the thin film resistor 35 in a plan view. The second upper wiring layer 62 does not overlap the thin film resistor 35 in a plan view. The entirety of the thin film resistor 35 is exposed from the second upper wiring layer 62 in a plan view.

In other words, the thin film resistor 35 is formed in a region between the first upper wiring layer 61 and the second upper wiring layer 62 in a plan view. Hence, it is possible to suppress parasitic capacitance in a region between the thin film resistor 35 and the first upper wiring layer 61. Additionally, it is possible to suppress parasitic capacitance in a region between the thin film resistor 35 and the second upper wiring layer 62.

In this embodiment, the thin film resistor 35 is formed at a distance from the first upper wiring layer 61 and from the second upper wiring layer 62 in a plan view. Hence, it is possible to appropriately suppress parasitic capacitance in the region between the thin film resistor 35 and the first upper wiring layer 61.

The first upper wiring layer 61 and the second upper wiring layer 62 each have a second thickness TL2. The second thickness TL2 is equal to or more than a first thickness TL1 (TL1≤TL2). More specifically, the second thickness TL2 exceeds the first thickness TL1 (TL1<TL2).

The second thickness TL2 may be not less than 100 nm and not more than 15000 nm. The second thickness TL2 may be not less than 100 nm and not more than 1500 nm, not less than 1500 nm and not more than 3000 nm, not less than 3000 nm and not more than 4500 nm, not less than 4500 nm and not more than 6000 nm, not less than 6000 nm and not more than 7500 nm, not less than 7500 nm and not more than 9000 nm, not less than 9000 nm and not more than 10500 nm, not less than 10500 nm and not more than 12000 nm, not less than 12000 nm and not more than 13500 nm, or not less than 13500 nm and not more than 15000 nm.

The second thickness TL2 of the first upper wiring layer 61 and the second thickness TL2 of the second upper wiring layer 62 may differ from each other. Preferably, the second thickness TL2 of the first upper wiring layer 61 and the second thickness TL2 of the second upper wiring layer 62 are equal to each other.

Referring to FIG. 1 and FIG. 3, the first upper wiring layer 61 includes a first end portion 61a on one side, a second end portion 61b on the other side, and a connection portion 61c that connects the first end portion 61a and the second end portion 61b together. The first end portion 61a is placed in a region in which the first end portion 61a overlaps the first end portion 41a of the first lower wiring layer 41 in a plan view.

The second end portion 61b is placed in a region outside the thin film resistor 35 in a plan view. In this embodiment, the second end portion 61b is placed in the device region 6 in a plan view. The second end portion 61b may be placed in the outside region 7. The connection portion 61c extends in a belt shape in a region between the first end portion 61a and the second end portion 61b in a plan view. In this embodiment, the connection portion 61c extends in a belt shape along a straight line that connects the first end portion 61a and the second end portion 61b together.

In this embodiment, the first upper wiring layer 61 has a laminated structure in which a plurality of electrode layers are laminated. The first upper wiring layer 61 includes a first barrier layer 63, a main body layer 64, and a second barrier layer 65 that are laminated in that order from the top of the resistance circuit forming layer 22 (fourth insulating layer 16).

In this embodiment, the first barrier layer 63 has a laminated structure including a Ti layer 66 and a TiN layer 67 that are laminated in that order from the top of the resistance circuit forming layer 22 (fourth insulating layer 16). The first barrier layer 63 may have a single layer structure consisting of the Ti layer 66 or the TiN layer 67.

The main body layer 64 has a resistance value less than the resistance value of the first barrier layer 63 and the resistance value of the second barrier layer 65. The main body layer 64 has a thickness exceeding the thickness of the first barrier layer 63 and the thickness of the second barrier layer 65. The main body layer 64 may include at least one among Al, Cu, an AlSiCu alloy, an AlSi alloy, and an AlCu alloy. In this embodiment, the main body layer 64 has a single layer structure consisting of an AlCu alloy layer 68.

In this embodiment, the second barrier layer 65 has a laminated structure including a Ti layer 69 and a TiN layer 70 that are laminated in that order from the top of the main body layer 64. The second barrier layer 65 may have a single layer structure consisting of the Ti layer 69 or the TiN layer 70.

Referring to FIG. 1 and FIG. 4, the second upper wiring layer 62 includes a first end portion 62a on one side, a second end portion 62b on the other side, and a connection portion 62c that connects the first end portion 62a and the second end portion 62b together. The first end portion 62a is placed in a region in which the first end portion 62a overlaps the second end portion 42b of the second lower wiring layer 42 in a plan view.

The second end portion 62b is placed in a region outside the thin film resistor 35 in a plan view. In this embodiment, the second end portion 62b is placed in the device region 6 in a plan view. The second end portion 62b may be placed in the outside region 7 in a plan view. The connection portion 62c extends in a belt shape in a region between the first end portion 62a and the second end portion 62b in a plan view. In this embodiment, the connection portion 62c extends in a belt shape along a straight line that connects the first end portion 62a and the second end portion 62b together.

On the other hand, in this embodiment, the second upper wiring layer 62 has a laminated structure in which a plurality of electrode layers are laminated. The second upper wiring layer 62 includes a first barrier layer 73, a main body layer 74, and a second barrier layer 75 that are laminated in that order from the top of the resistance circuit forming layer 22 (fourth insulating layer 16).

In this embodiment, the first barrier layer 73 has a laminated structure including a Ti layer 76 and a TiN layer 77 that are laminated in that order from the top of the resistance circuit forming layer 22 (fourth insulating layer 16). The first barrier layer 73 may have a single layer structure consisting of the Ti layer 76 or the TiN layer 77.

The main body layer 74 has a resistance value less than the resistance value of the first barrier layer 73 and the resistance value of the second barrier layer 75. The main body layer 74 has a thickness exceeding the thickness of the first barrier layer 73 and the thickness of the second barrier layer 75. The main body layer 74 may include at least one among Al, Cu, an AlSiCu alloy, an AlSi alloy, and an AlCu alloy. In this embodiment, the main body layer 74 has a single layer structure consisting of an AlCu alloy layer 78.

In this embodiment, the second barrier layer 75 has a laminated structure including a Ti layer 79 and a TiN layer 80 that are laminated in that order from the top of the main body layer 74. The second barrier layer 75 may have a single layer structure consisting of the Ti layer 79 or the TiN layer 80.

Referring to FIG. 1 to FIG. 4, the resistance circuit 10 includes a first long via electrode 83 and a second long via electrode 84. The first long via electrode 83 is electrically connected to the first lower wiring layer 41 and to the first upper wiring layer 61. The second long via electrode 84 is electrically connected to the second lower wiring layer 42 and to the second upper wiring layer 62.

Hence, the thin film resistor 35 is electrically connected to the first upper wiring layer 61 through the first via electrode 23, the first lower wiring layer 41, and the first long via electrode 83. Alternatively, the thin film resistor 35 is electrically connected to the second upper wiring layer 62 through the second via electrode 24, the second lower wiring layer 42, and the second long via electrode 84.

The first long via electrode 83 is formed beside the thin film resistor 35. In this embodiment, the first long via electrode 83 is placed on a straight line that connects the first via electrode 23 and the second via electrode 24 together.

The second long via electrode 84 is formed beside the thin film resistor 35 at a distance from the first long via electrode 83. In this embodiment, the second long via electrode 84 faces the first long via electrode 83 with the thin film resistor 35 between the second long via electrode 84 and the first long via electrode 83. The second long via electrode 84 is placed on the straight line that connects the first via electrode 23 and the second via electrode 24 together.

Hence, the thin film resistor 35 is placed on a straight line that connects the first long via electrode 83 and the second long via electrode 84 together. The thin film resistor 35 is placed on the straight line that connects the first via electrode 23, the second via electrode 24, the first long via electrode 83, and the second long via electrode 84 together. In this embodiment, the thin film resistor 35 extends along the straight line that connects the first long via electrode 83 and the second long via electrode 84 together.

In this embodiment, the first long via electrode 83 is formed in a circular shape in a plan view. The planar shape of the first long via electrode 83 is arbitrary. The first long via electrode 83 may be formed in a polygonal shape, such as a triangular shape, a quadrangular shape, or a hexagonal shape, or may be formed in an elliptical shape in a plan view.

The first long via electrode 83 crosses the thin film resistor 35 in the normal direction of the principal surface of the third insulating layer 15 in a lateral view. The first long via electrode 83 passes through the third insulating layer 15, the barrier layer 17, and the fourth insulating layer 16, and is embedded in these layers, i.e., is embedded in the third insulating layer 15, the barrier layer 17, and the fourth insulating layer 16. The first long via electrode 83 is exposed from the principal surface of the fourth insulating layer 16.

The first long via electrode 83 includes a first end portion 83a on one side and a second end portion 83b on the other side with respect to the normal direction of the principal surface of the third insulating layer 15. The first end portion 83a is exposed from the principal surface of the fourth insulating layer 16. The first end portion 83a is electrically connected to the first end portion 61a of the first upper wiring layer 61.

The second end portion 83b is placed inside the third insulating layer 15. The second end portion 83b is electrically connected to the second end portion 41b of the first lower wiring layer 41. The first long via electrode 83 is formed in a tapered shape in which its width becomes smaller from the first end portion 83a toward the second end portion 83b in a cross-sectional view.

The first long via electrode 83 has a lower part 83c placed on the third insulating layer 15 side with respect to the thin film resistor 35 and an upper part 83d placed on the fourth insulating layer 16 side with respect to the thin film resistor 35. The length of the upper part 83d is equal to or more than the length of the lower part 83c with respect to the normal direction of the principal surface of the third insulating layer 15. More specifically, the length of the upper part 83d exceeds the length of the lower part 83c.

The first long via electrode 83 has a laminated structure including a main body layer 85 and a barrier layer 86. The main body layer 85 is embedded in the third insulating layer 15 and in the fourth insulating layer 16. The main body layer 85 may include tungsten (W) or copper (Cu). In this embodiment, the first long via electrode 83 has a single layer structure consisting of a tungsten layer 87.

The barrier layer 86 is interposed between the main body layer 85 and the third insulating layer 15 and between the main body layer 85 and the fourth insulating layer 16. In this embodiment, the barrier layer 86 has a laminated structure in which a plurality of electrode layers are laminated. In this embodiment, the barrier layer 86 includes a Ti layer 88 and a TiN layer 89 that are formed in that order from the third insulating layer 15.

The Ti layer 88 is in contact with the third insulating layer 15 and with the fourth insulating layer 16. The TiN layer 89 is in contact with the main body layer 85. The barrier layer 86 may have a single layer structure consisting of the Ti layer 88 or the TiN layer 89.

In this embodiment, the second long via electrode 84 is formed in a circular shape in a plan view. The planar shape of the second long via electrode 84 is arbitrary. The second long via electrode 84 may be formed in a polygonal shape, such as a triangular shape, a quadrangular shape, or a hexagonal shape, or may be formed in an elliptical shape in a plan view.

On the other hand, the second long via electrode 84 crosses the thin film resistor 35 in the normal direction of the principal surface of the third insulating layer 15 in a lateral view. The second long via electrode 84 passes through the third insulating layer 15, the barrier layer 17, and the fourth insulating layer 16, and is embedded in these layers, i.e., is embedded in the third insulating layer 15, the barrier layer 17, and the fourth insulating layer 16. The second long via electrode 84 is exposed from the principal surface of the fourth insulating layer 16.

The second long via electrode 84 includes a first end portion 84a on one side and a second end portion 84b on the other side with respect to the normal direction of the principal surface of the third insulating layer 15. The first end portion 84a is exposed from the principal surface of the fourth insulating layer 16. The first end portion 84a is electrically connected to the first end portion 62a of the second upper wiring layer 62.

The second end portion 84b is placed inside the third insulating layer 15. The second end portion 84b is electrically connected to the second end portion 42b of the second lower wiring layer 42. The second long via electrode 84 is formed in a tapered shape in which its width becomes smaller from the first end portion 84a toward the second end portion 84b in a cross-sectional view.

The second long via electrode 84 has a lower part 84c placed on the third insulating layer 15 side with respect to the thin film resistor 35 and an upper part 84d placed on the fourth insulating layer 16 side with respect to the thin film resistor 35. The length of the upper part 84d is equal to or more than the length of the lower part 84c with respect to the normal direction of the principal surface of the third insulating layer 15. More specifically, the length of the upper part 84d exceeds the length of the lower part 84c.

The second long via electrode 84 has a laminated structure including a main body layer 90 and a barrier layer 91. The main body layer 90 is embedded in the third insulating layer 15 and in the fourth insulating layer 16. The main body layer 90 may include tungsten (W) or copper (Cu). In this embodiment, the second long via electrode 84 has a single layer structure consisting of a tungsten layer 92.

The barrier layer 91 is interposed between the main body layer 90 and the third insulating layer 15 and between the main body layer 90 and the fourth insulating layer 16. In this embodiment, the barrier layer 91 has a laminated structure in which a plurality of electrode layers are laminated. In this embodiment, the barrier layer 91 includes a Ti layer 93 and a TiN layer 94 that are formed in that order from the third insulating layer 15.

The Ti layer 93 is in contact with the third insulating layer 15 and with the fourth insulating layer 16. The TiN layer 94 is in contact with the main body layer 90. The barrier layer 91 may have a single layer structure consisting of the Ti layer 93 or the TiN layer 94.

Referring to FIG. 2, the wiring circuit forming layer 21 includes a wiring 95 that electrically connects a functional device and the thin film resistor 35 together. The wiring 95 is selectively formed inside the first insulating layer 13 and inside the second insulating layer 14, and is routed from the device region 6 to the outside region 7.

More specifically, the wiring 95 includes a single or a plurality of connection wiring layers 96 that is or are electrically connected to the functional device in the device region 6. The single or the plurality of connection wiring layers 96 is or are formed either on the first insulating layer 13 or on the second insulating layer 14, or alternatively, both on the first insulating layer 13 and on the second insulating layer 14. In FIG. 2, an example is shown in which two connection wiring layers 96 are formed on the first insulating layer 13.

The single or the plurality of connection wiring layers 96 is or are selectively routed from the device region 6 to the outside region 7. The connection wiring layer 96 has the same laminated structure as the first lower wiring layer 41 (second lower wiring layer 42) and as the first upper wiring layer 61 (second upper wiring layer 62). A detailed description of the connection wiring layer 96 is omitted.

The wiring 95 includes a single or a plurality of connection via electrodes 97. The single or the plurality of connection via electrodes 97 connect(s) the single or the plurality of connection wiring layers 96 to an arbitrary first lower wiring layer 41 (second lower wiring layer 42) or to an arbitrary first upper wiring layer 61 (second upper wiring layer 62).

The single or the plurality of connection via electrodes 97 is or are formed either on the first insulating layer 13 or on the second insulating layer 14, or alternatively, both on the first insulating layer 13 and on the second insulating layer 14. In FIG. 2, an example is shown in which a single connection wiring layer 96 is connected to the first lower wiring layer 41 by means of two connection via electrodes 97.

The connection via electrode 97 has the same laminated structure as the first via electrode 23 (second via electrode 24) and as the first long via electrode 83 (second long via electrode 84). A detailed description of the connection via electrode 97 is omitted.

The second end portion 61b of the first upper wiring layer 61 may be connected to an arbitrary connection wiring layer 96 through the connection via electrode 97. The second end portion 62b of the second upper wiring layer 62 may be connected to an arbitrary connection wiring layer 96 through the connection via electrode 97.

Referring to FIG. 2, an uppermost insulating layer 101 is formed on the insulating laminated structure 12. The uppermost insulating layer 101 covers the first upper wiring layer 61 and the second upper wiring layer 62. The uppermost insulating layer 101 covers a connection portion between the first upper wiring layer 61 and the first long via electrode 83 in a plan view. The uppermost insulating layer 101 covers a connection portion between the second upper wiring layer 62 and the second long via electrode 84 in a plan view.

A first pad opening 102 and a second pad opening 103 are formed in the uppermost insulating layer 101 in the outside region 7. The first pad opening 102 exposes a region of a part of the first upper wiring layer 61 so as to serve as a first pad region 104. More specifically, the first pad opening 102 exposes a region other than the connection portion between the first upper wiring layer 61 and the first long via electrode 83 in the first upper wiring layer 61 so as to serve as the first pad region 104.

The second pad opening 103 exposes a region of a part of the second upper wiring layer 62 so as to serve as a second pad region 105. More specifically, the second pad opening 103 exposes a region other than the connection portion between the second upper wiring layer 62 and the second long via electrode 84 in the second upper wiring layer 62 so as to serve as the second pad region 105.

In this embodiment, the uppermost insulating layer 101 has a laminated structure including a passivation layer 106 and a resin layer 107. For clarity, the resin layer 107 is shown by hatching in FIG. 1.

The passivation layer 106 may have a laminated structure including a silicon oxide layer and a silicon nitride layer. In this case, the silicon nitride layer may be formed on the silicon oxide layer, or the silicon oxide layer may be formed on the silicon nitride layer.

The passivation layer 106 may have a single layer structure consisting of a silicon oxide layer or a silicon nitride layer. Preferably, the passivation layer 106 is made of an insulating material differing from that of the insulating laminated structure 12. In this embodiment, the passivation layer 106 has a single layer structure consisting of a silicon nitride layer.

The resin layer 107 may include a photosensitive resin. The photosensitive resin may be a positive type or a negative type. The resin layer 107 may include at least one among polyimide, polyamide, and polybenzoxazole. Preferably, the resin layer 107 is made of polyamide or polybenzoxazole.

The first via electrode 23, the first lower wiring layer 41, the first long via electrode 83, and the first upper wiring layer 61 form a first wiring that is connected to the thin film resistor 35. An end (first via electrode 23) of the first wiring is connected to the thin film resistor 35 inside the insulating laminated structure 12, and the other end (first upper wiring layer 61) of the first wiring serves as an external terminal exposed outwardly.

The second via electrode 24, the second lower wiring layer 42, the second long via electrode 84, and the second upper wiring layer 62 form a second wiring that is connected to the thin film resistor 35. An end (second via electrode 24) of the second wiring is connected to the thin film resistor 35 inside the insulating laminated structure 12, and the other end (second upper wiring layer 62) of the second wiring serves as an external terminal exposed outwardly. A high voltage may be applied to the first wiring, and a low voltage may be applied to the second wiring. A low voltage may be applied to the first wiring, and a high voltage may be applied to the second wiring.

As described above, the electronic component 1 includes the third insulating layer 15 (first insulating layer) including impurities, the thin film resistor 35 formed on the third insulating layer 15, and the barrier layer 17 that is interposed in at least a part of a region between the thin film resistor 35 and the third insulating layer 15 and that obstructs the transmission of the impurities.

With this electronic component 1, the barrier layer 17 obstructs the transmission of impurities included in the third insulating layer 15, and therefore it is possible to suppress the movement of the impurities from the third insulating layer 15 to the thin film resistor 35. As a result, the surface resistance of the thin film resistor 35 becomes insusceptible to the impurities, and therefore it is possible to reduce the in-plane variation of its surface resistance.

The barrier layer 17 overlaps the entirety of the thin film resistor 35. Hence, impurities are prevented from being moved from the third insulating layer 15 to the thin film resistor 35 over the entirety of the thin film resistor 35, and therefore it is possible to more considerably reduce the in-plane variation of the surface resistance of the thin film resistor 35.

The impurities include Ar. This makes it possible to form the third insulating layer 15 by using Ar as an inert gas, and makes it possible to form the thin film resistor 35 whose in-plane variation of the surface resistance has been reduced on the third insulating layer 15.

Figure 7B:
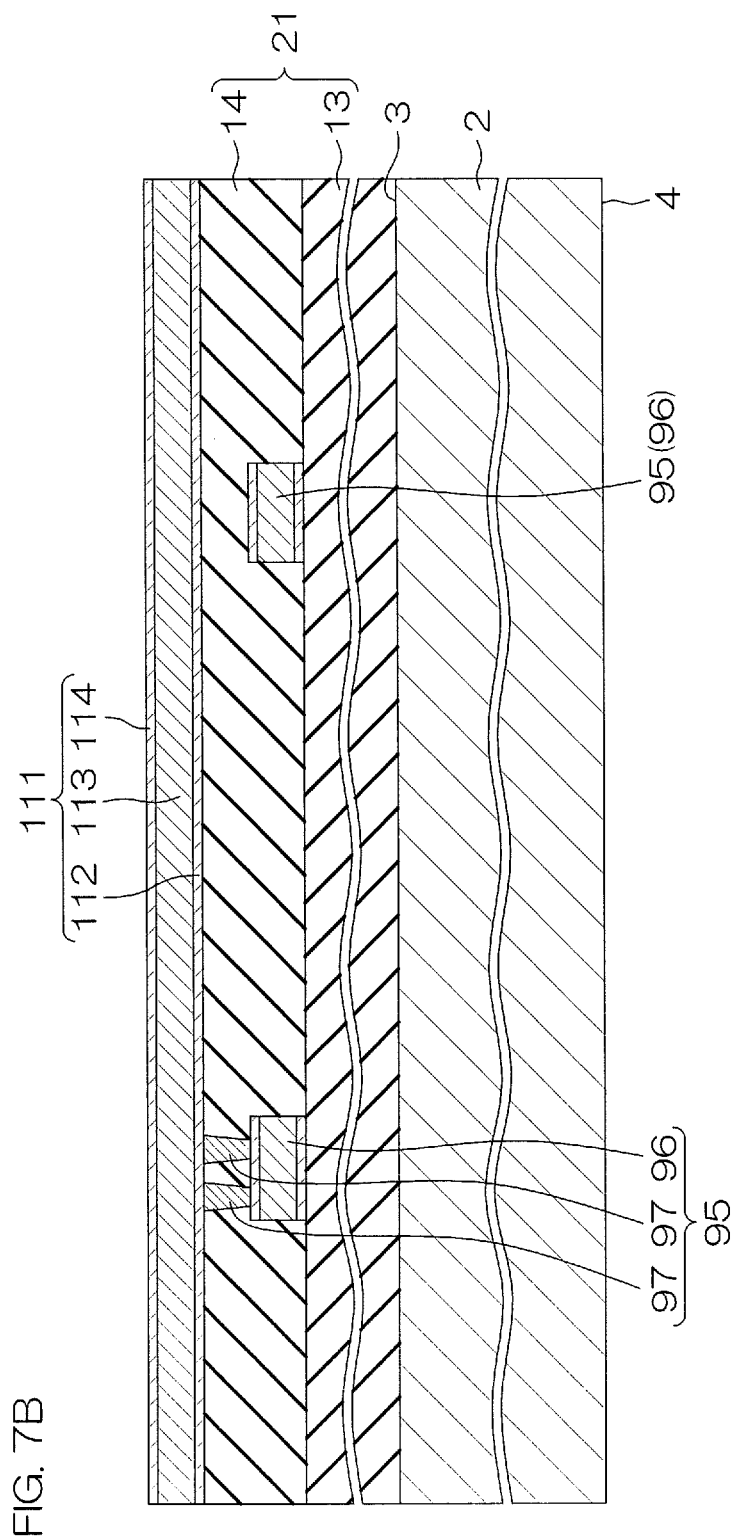
FIG. 7B is a cross-sectional view shown to describe a step subsequent to that of FIG. 7A.
Figure 7C:
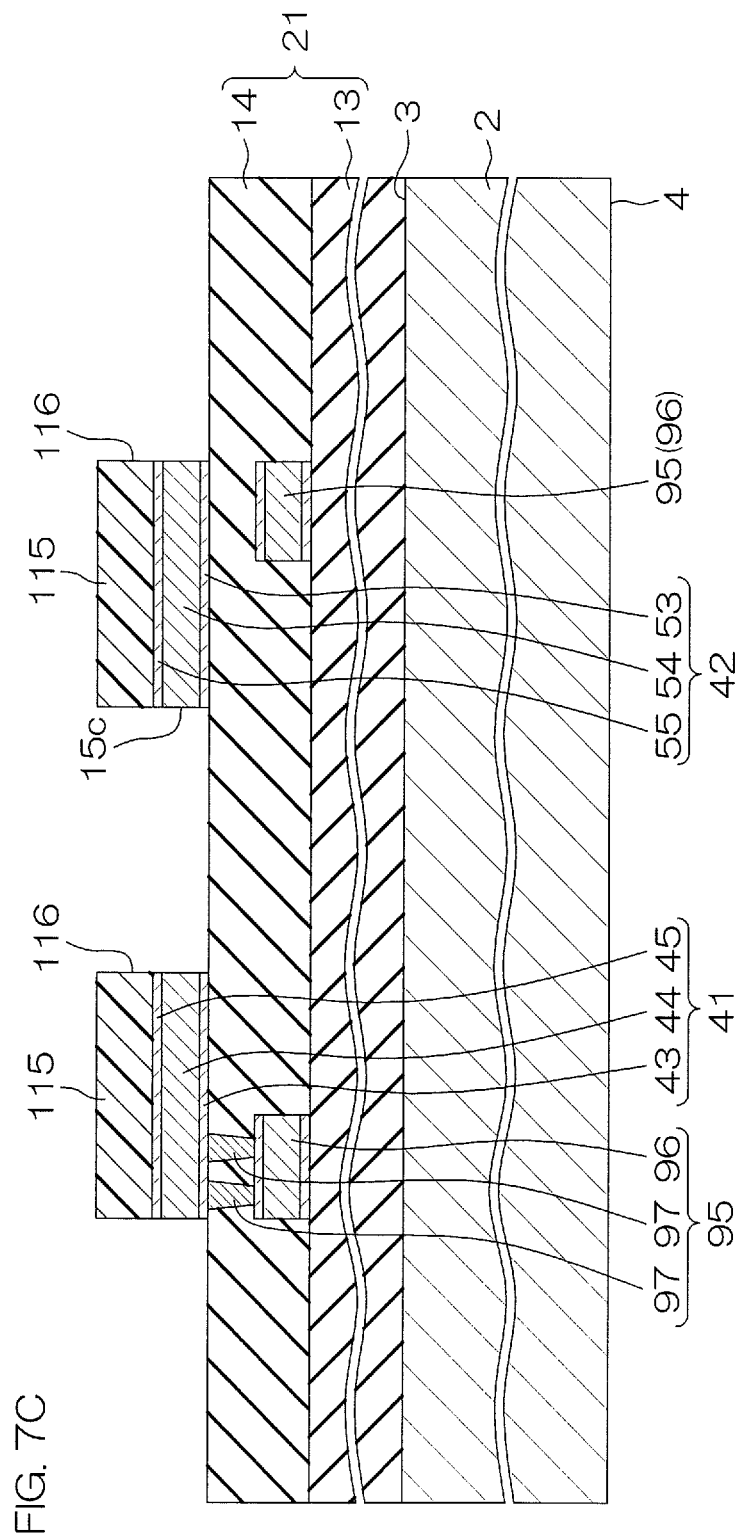
FIG. 7C is a cross-sectional view shown to describe a step subsequent to that of FIG. 7B.
Figure 7D:
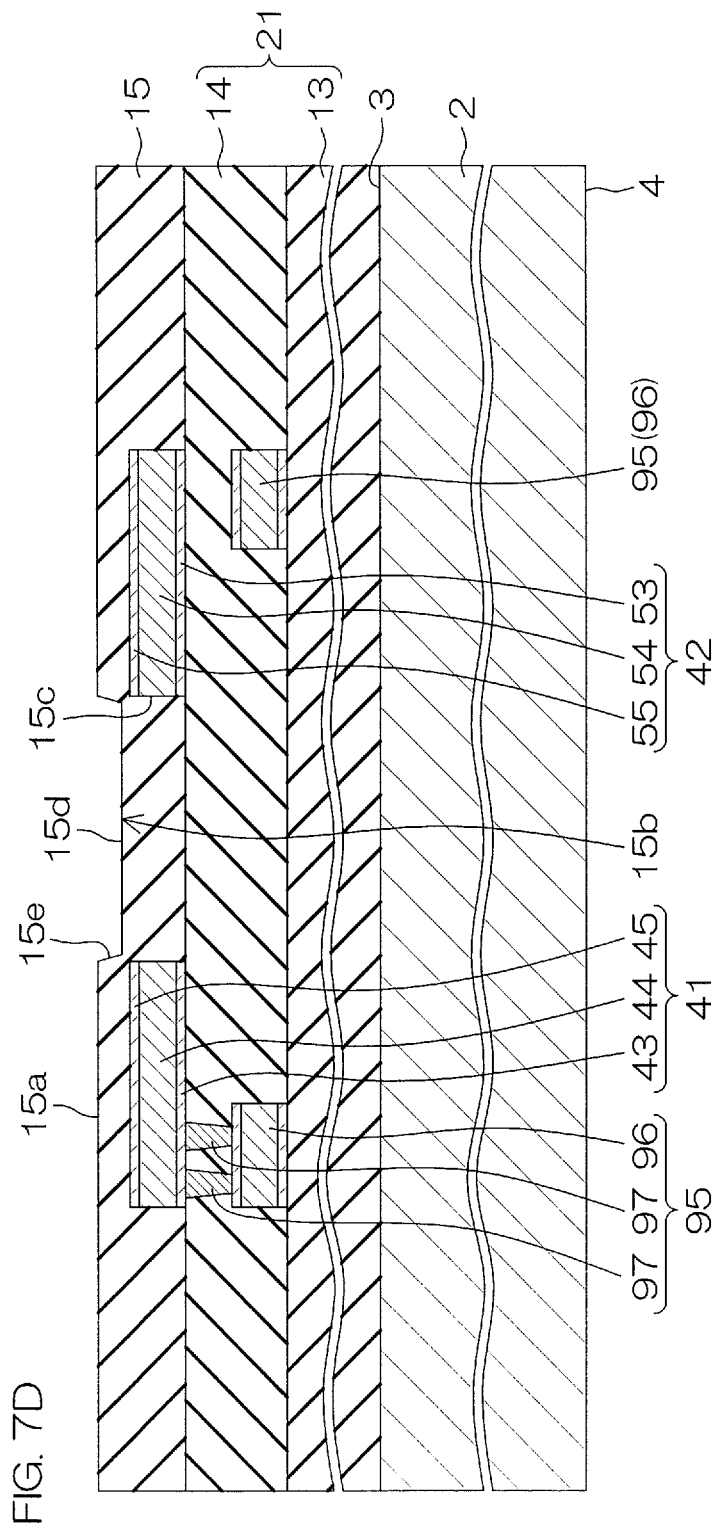
FIG. 7D is a cross-sectional view shown to describe a step subsequent to that of FIG. 7C.
Figure 7E:
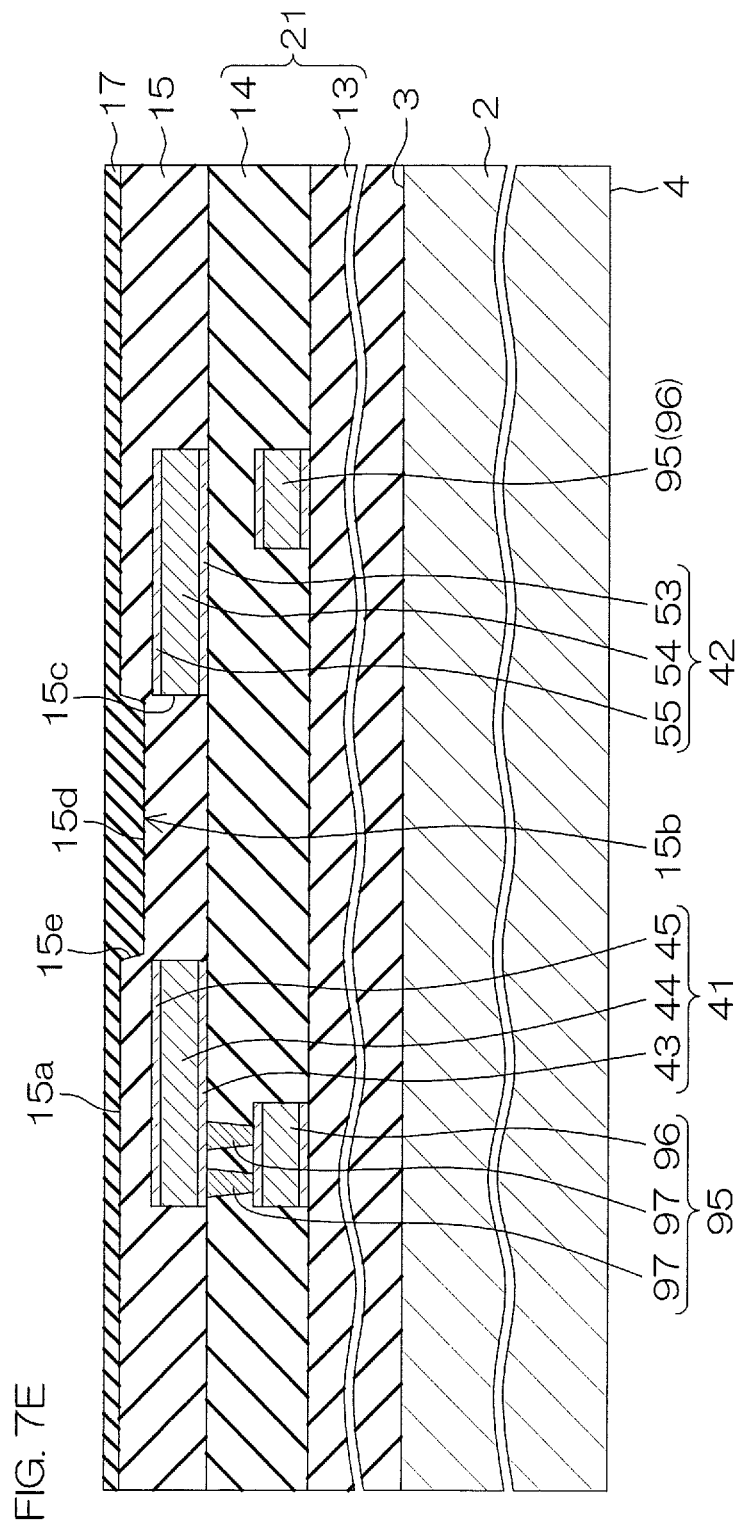
FIG. 7E is a cross-sectional view shown to describe a step subsequent to that of FIG. 7D.
Figure 7F:
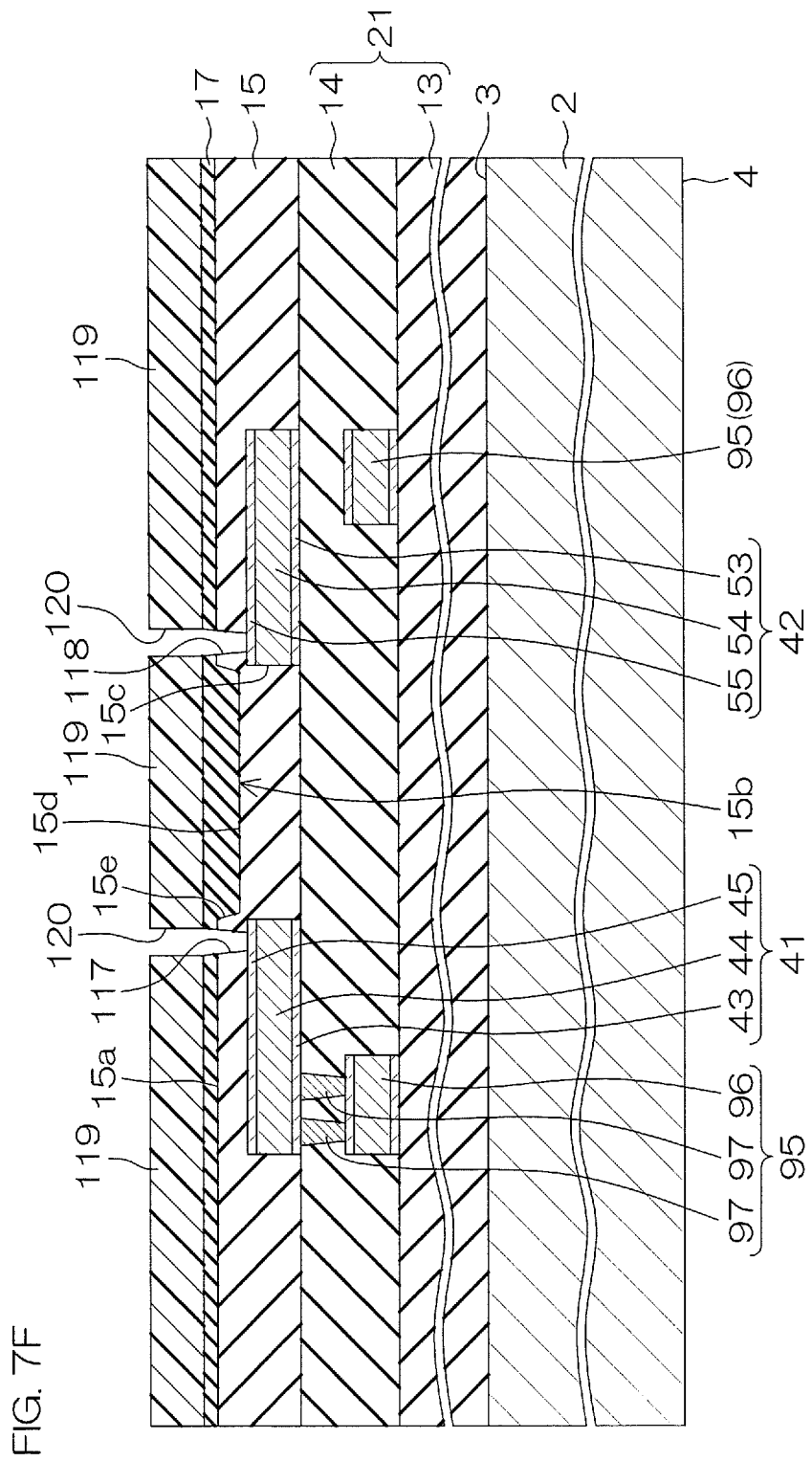
FIG. 7F is a cross-sectional view shown to describe a step subsequent to that of FIG. 7E.
Figure 7G:
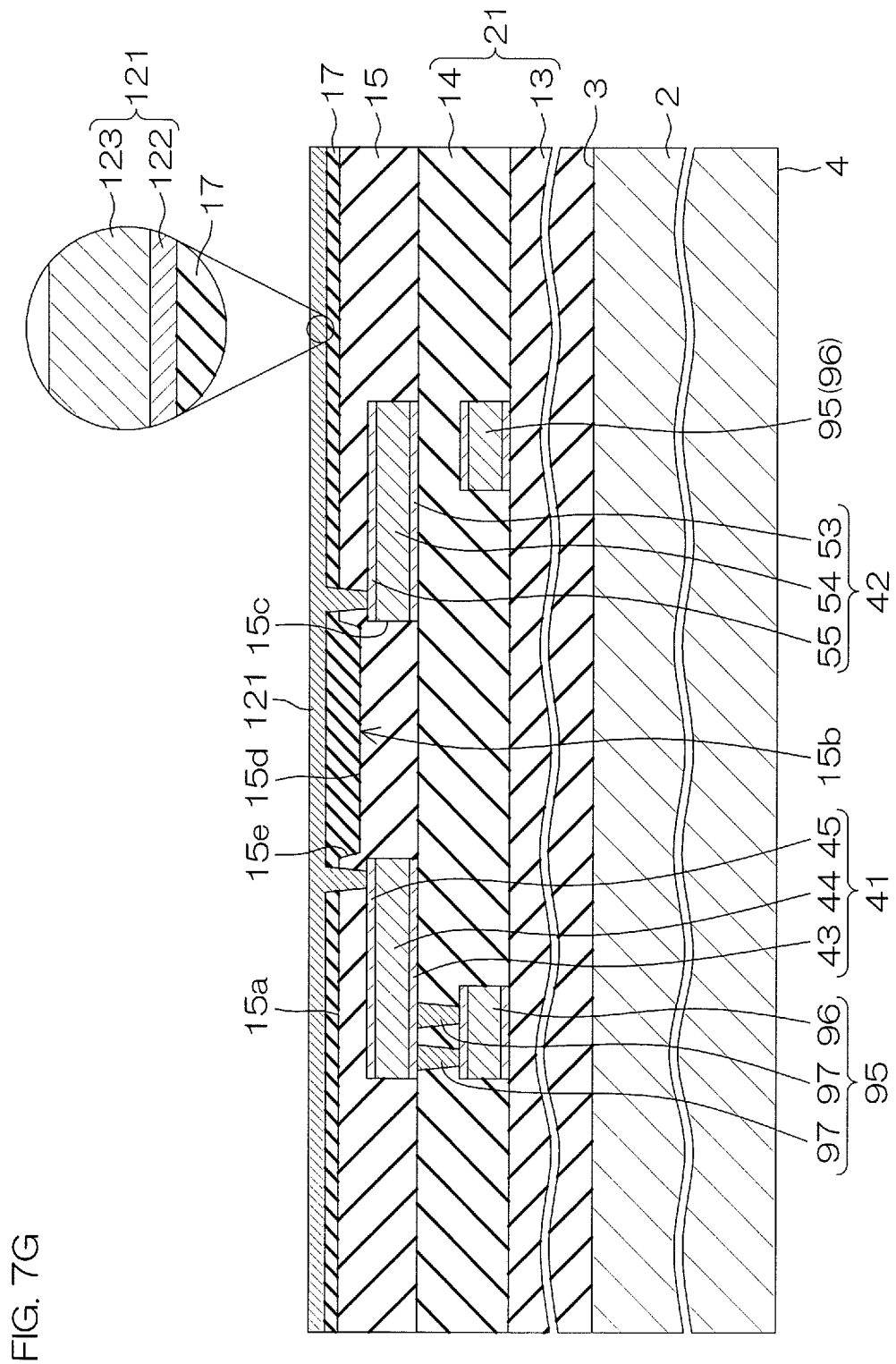
FIG. 7G is a cross-sectional view shown to describe a step subsequent to that of FIG. 7F.
Figure 7H:
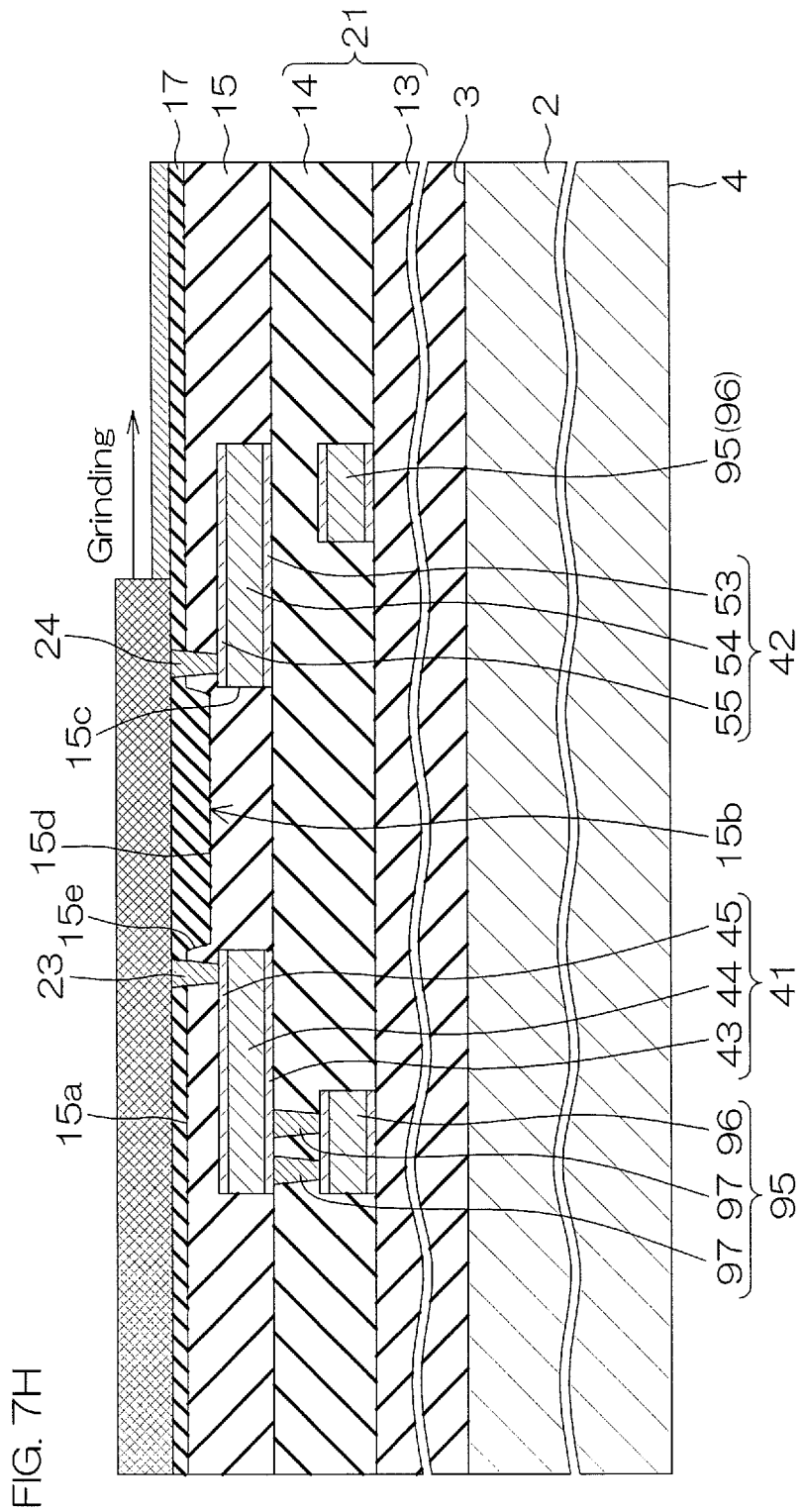
FIG. 7H is a cross-sectional view shown to describe a step subsequent to that of FIG. 7G.
Figure 7I:
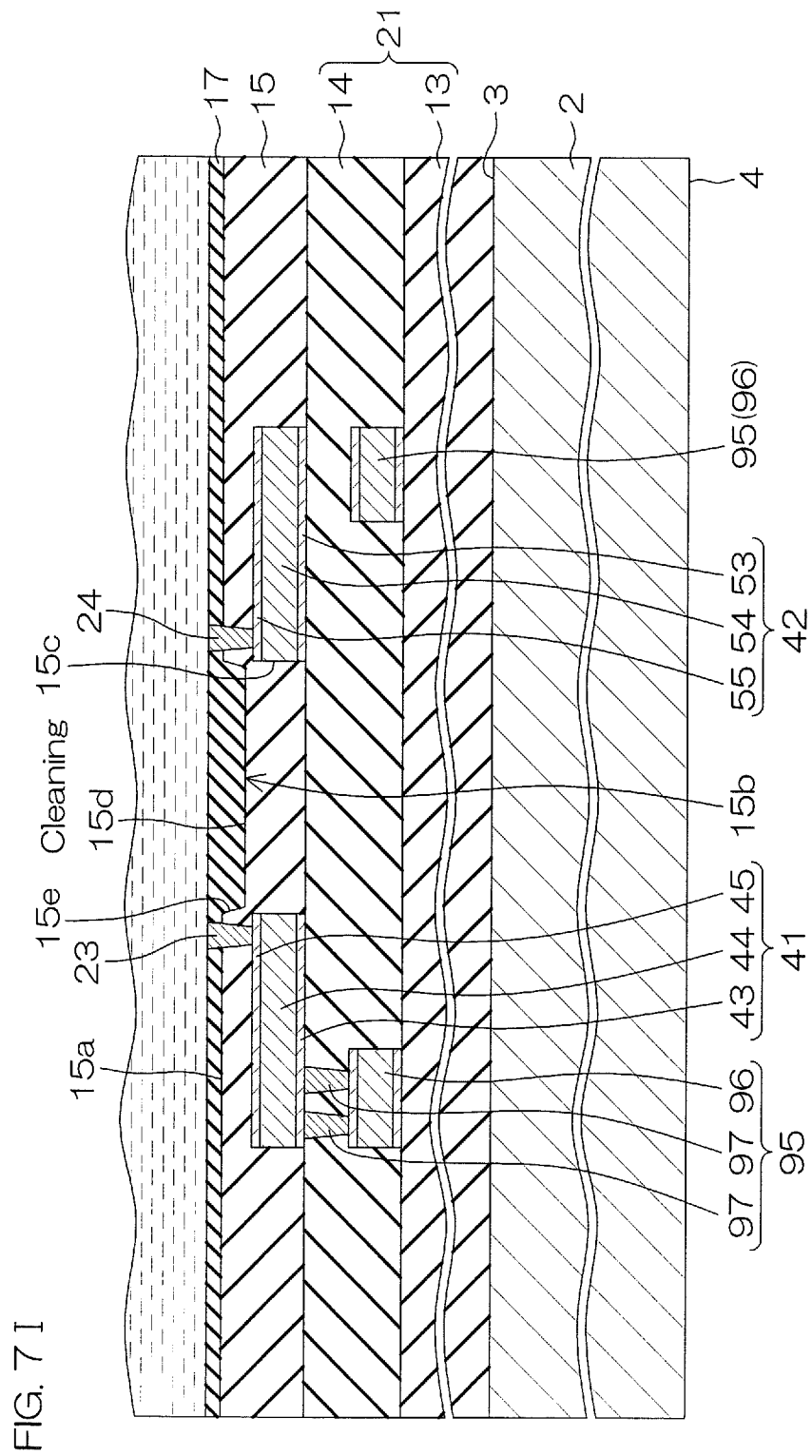
FIG. 7I is a cross-sectional view shown to describe a step subsequent to that of FIG. 7H.
Figure 7J:
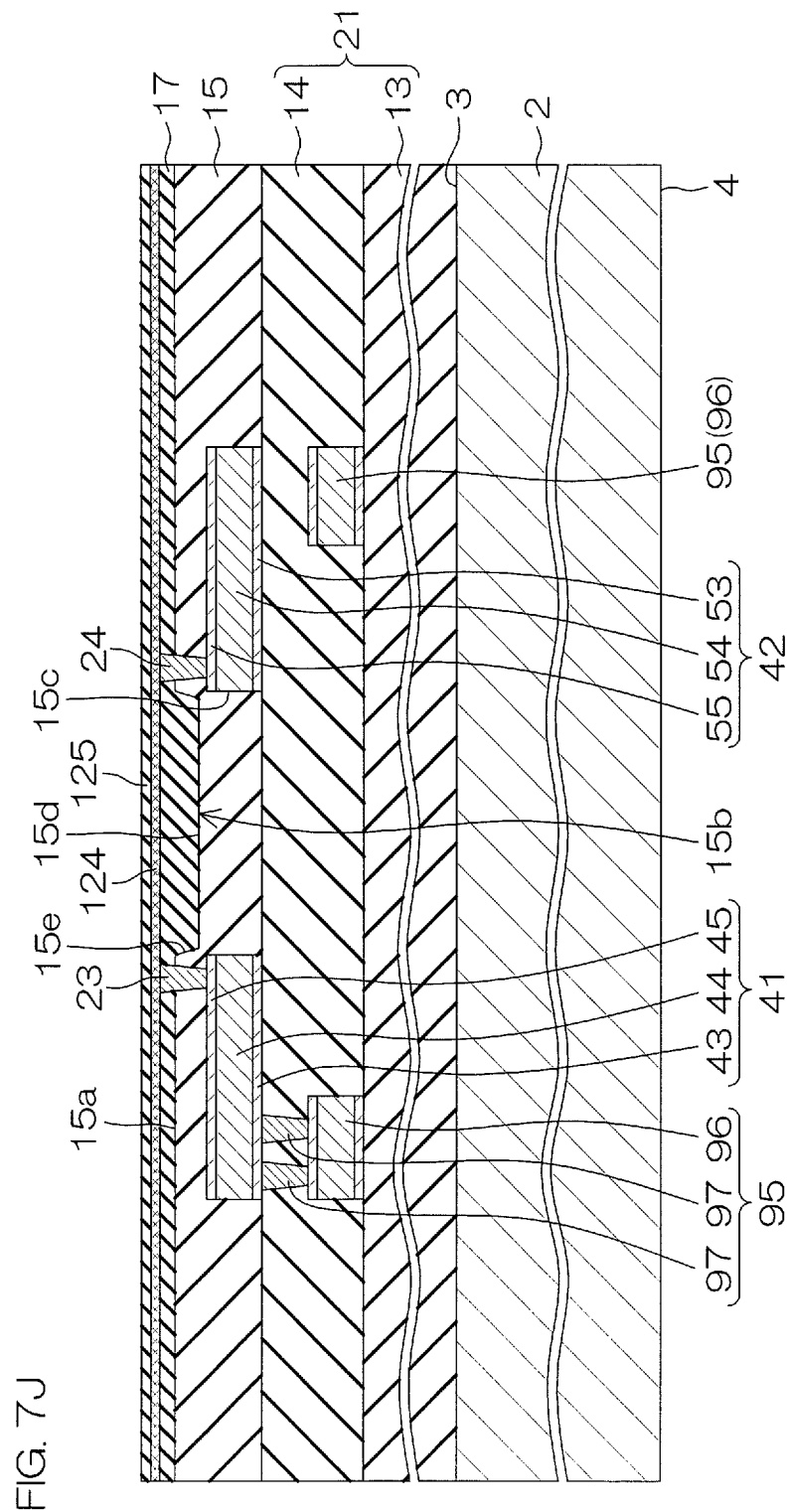
FIG. 7J is a cross-sectional view shown to describe a step subsequent to that of FIG. 7I.
Figure 7K:
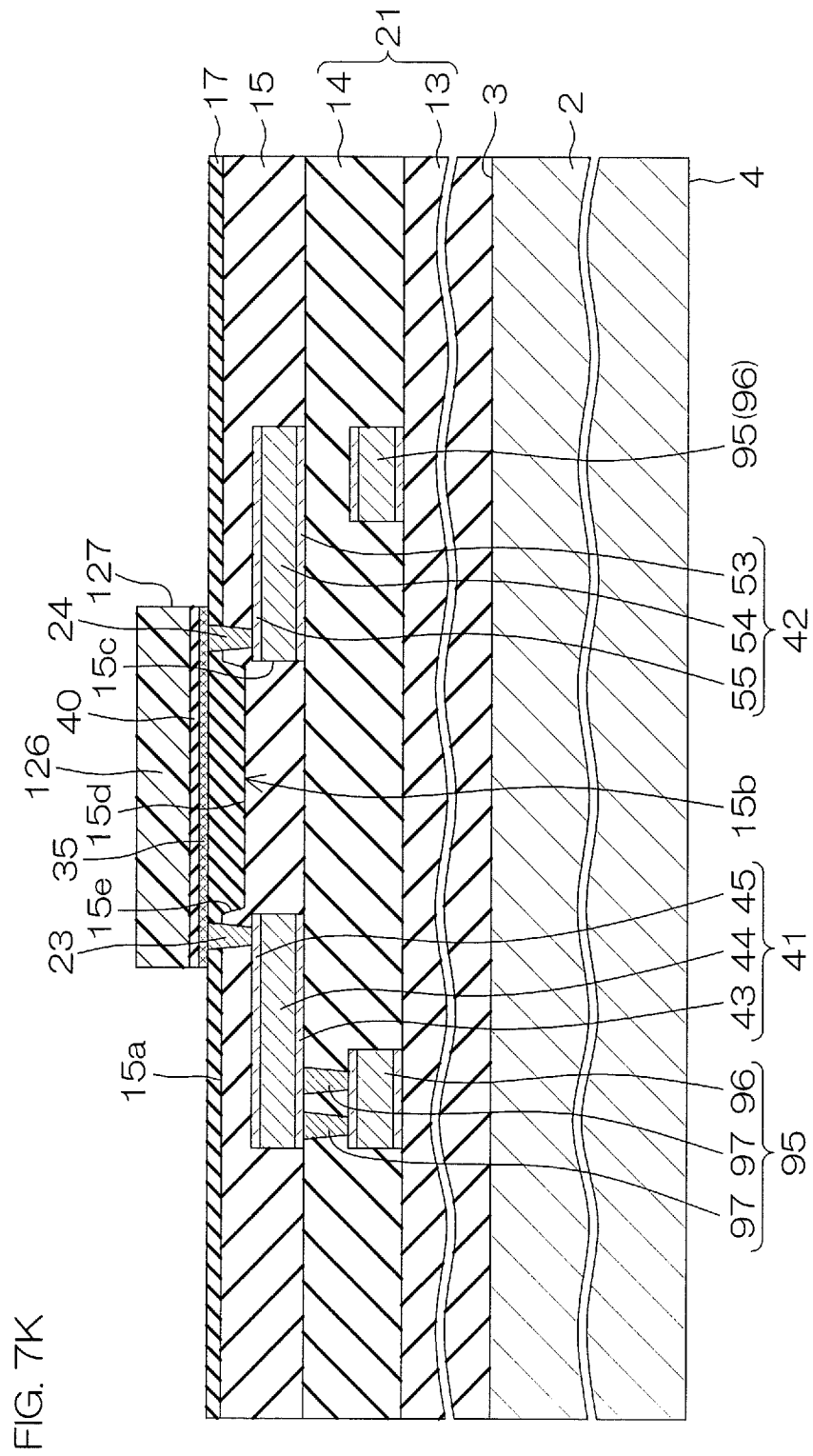
FIG. 7K is a cross-sectional view shown to describe a step subsequent to that of FIG. 7J.
Figure 7L:
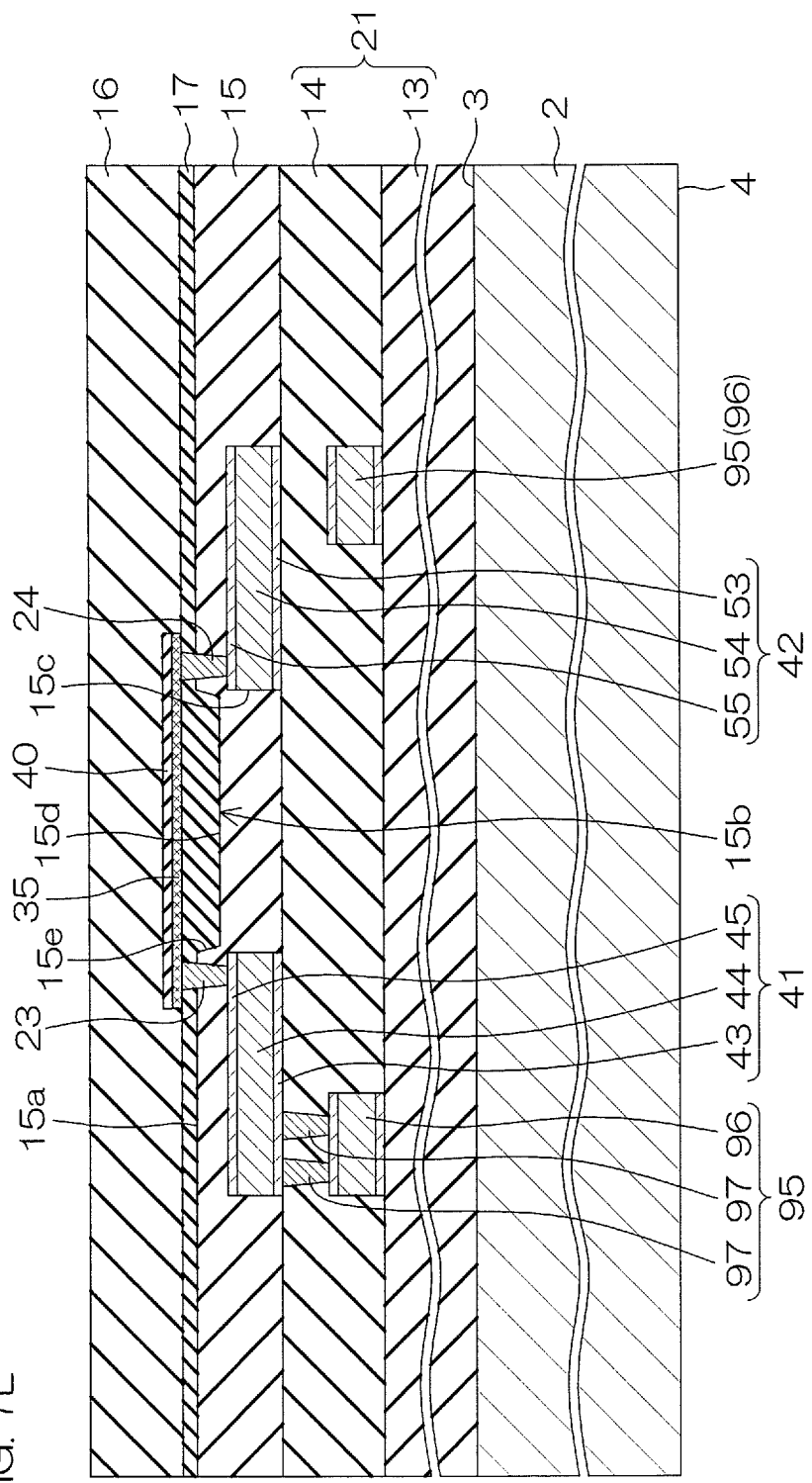
FIG. 7L is a cross-sectional view shown to describe a step subsequent to that of FIG. 7K.
Figure 7M:
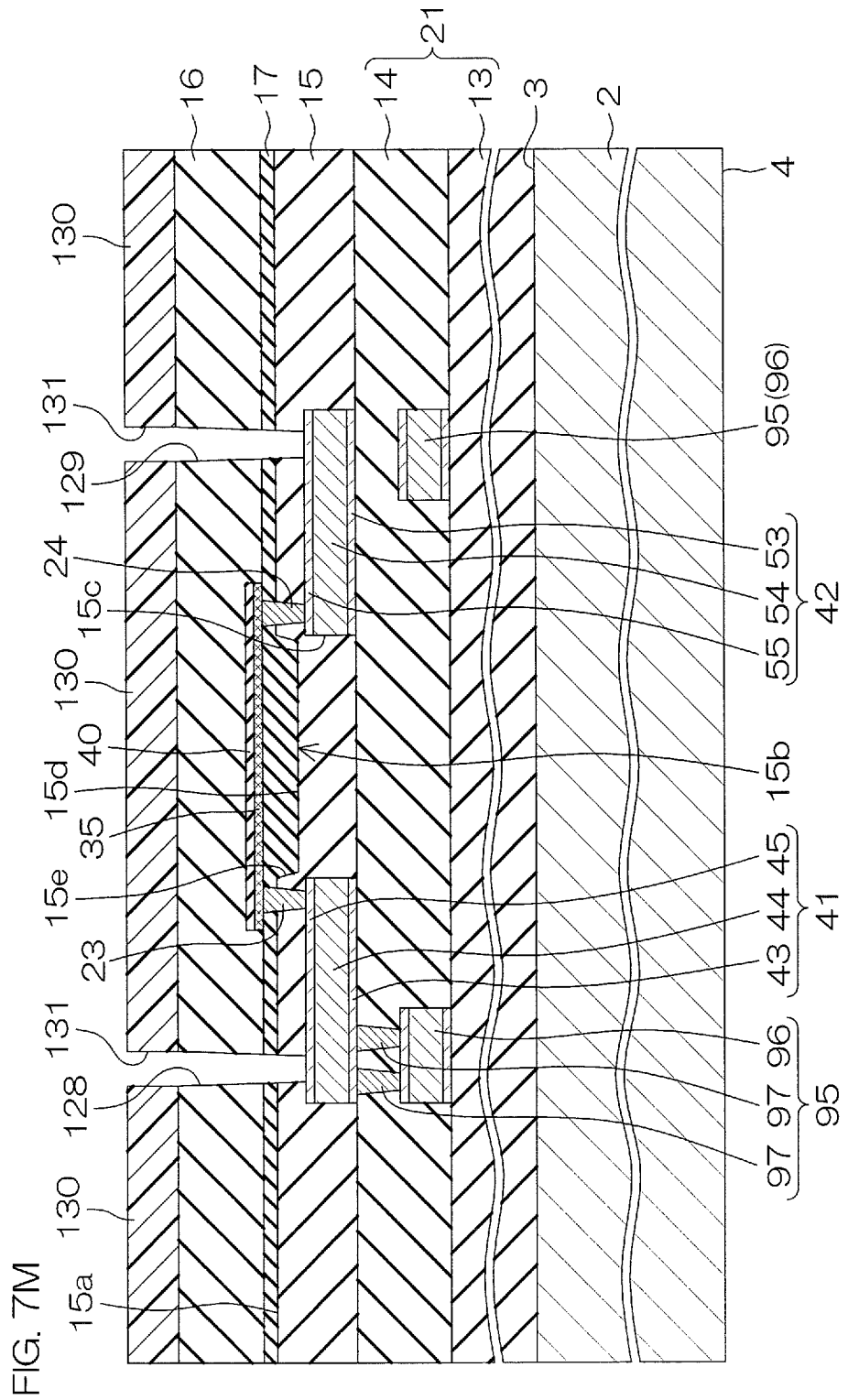
FIG. 7M is a cross-sectional view shown to describe a step subsequent to that of FIG. 7L.
Figure 7N:
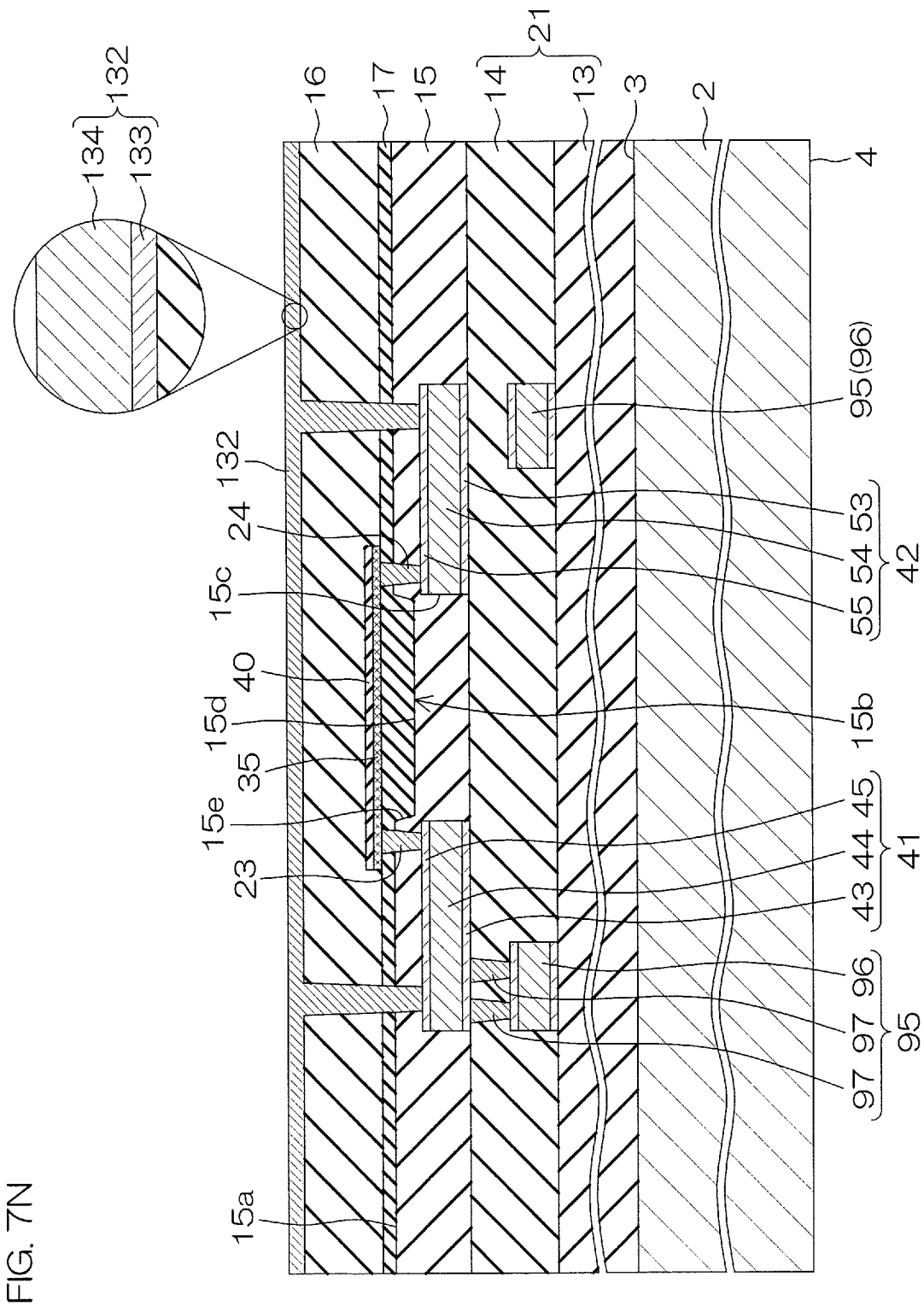
FIG. 7N is a cross-sectional view shown to describe a step subsequent to that of FIG. 7M.
Figure 7P:
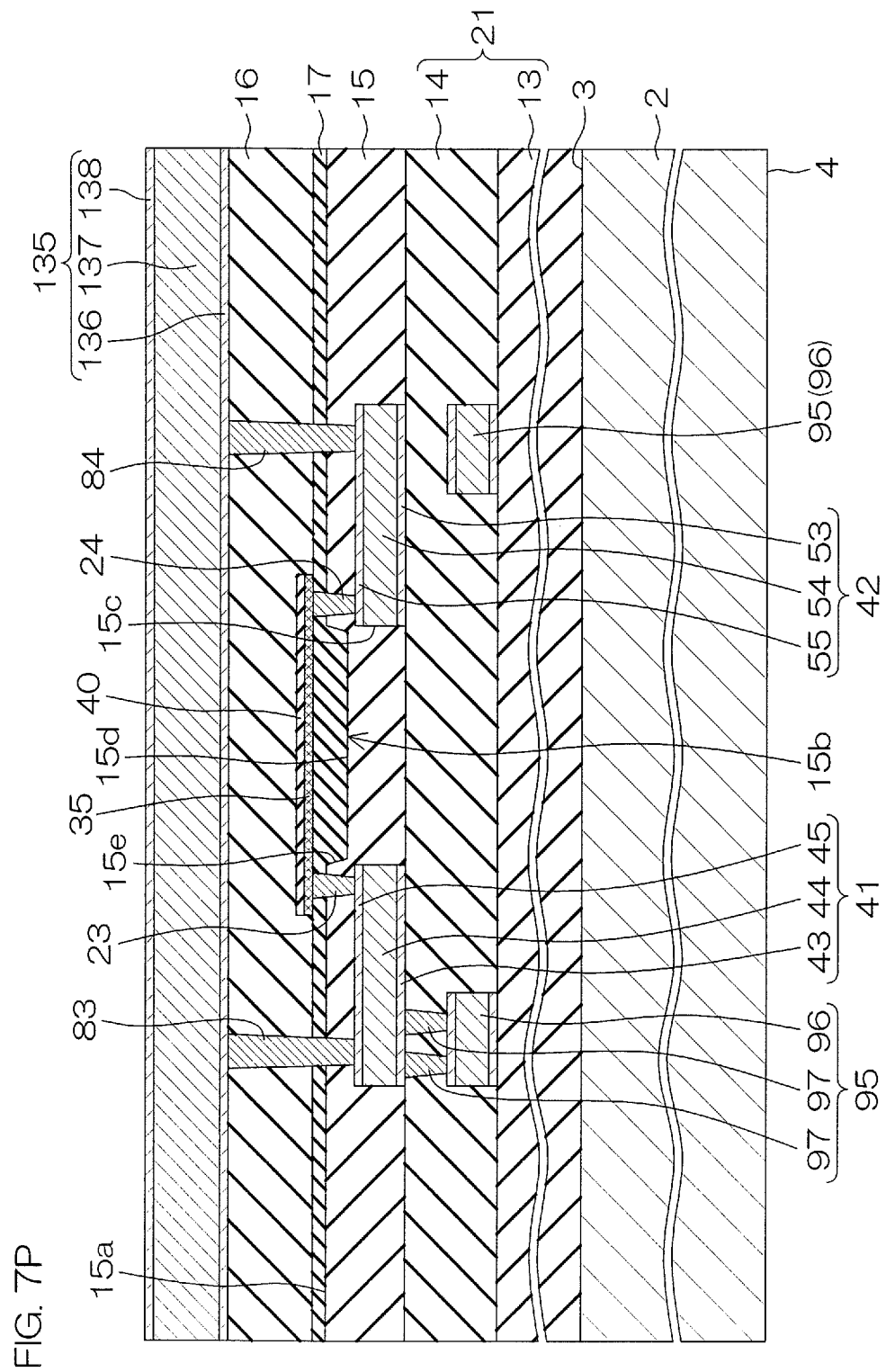
FIG. 7P is a cross-sectional view shown to describe a step subsequent to that of FIG. 7O.
Figure 7Q:
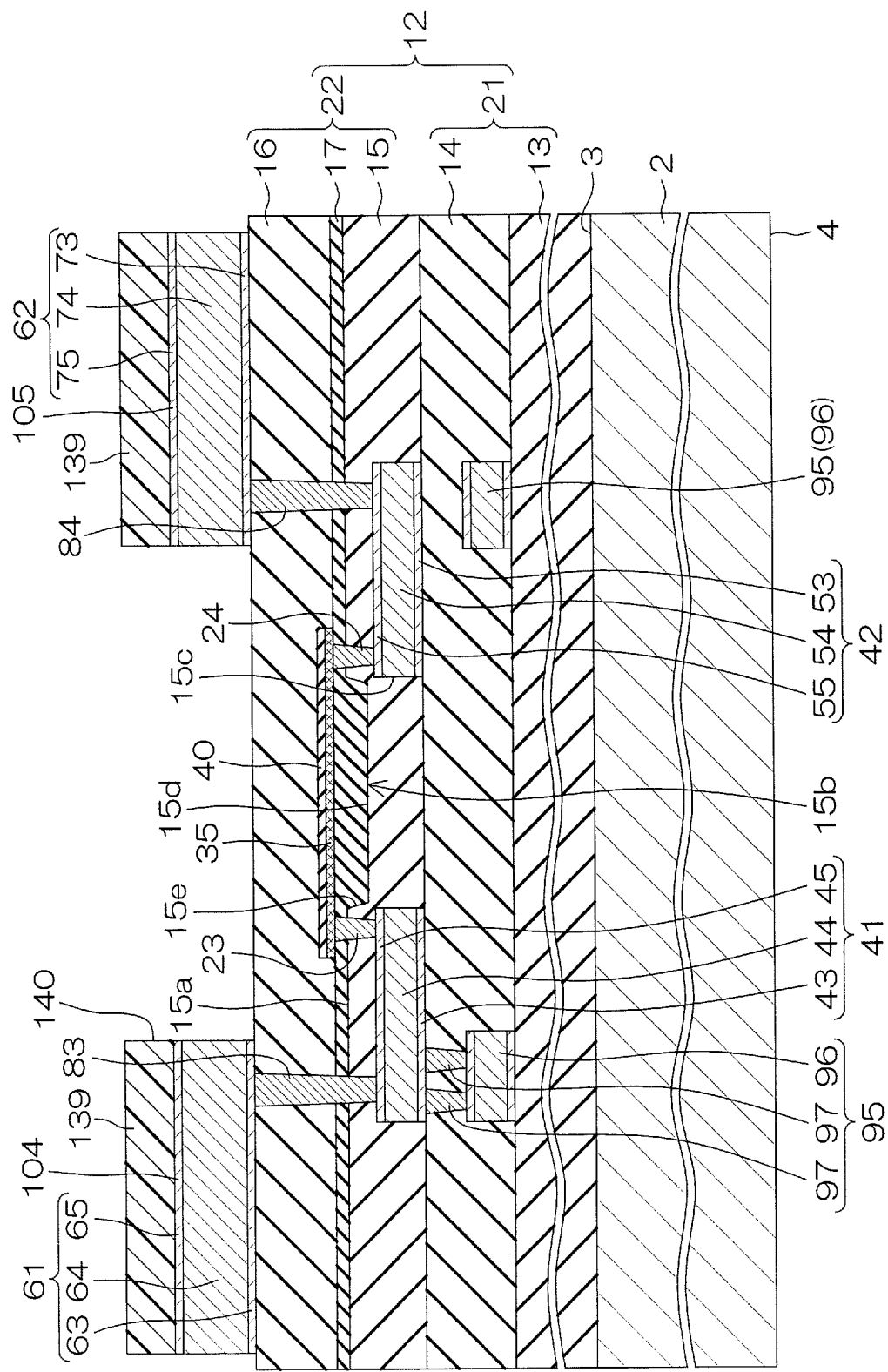
FIG. 7Q is a cross-sectional view shown to describe a step subsequent to that of FIG. 7P.
Figure 7R:
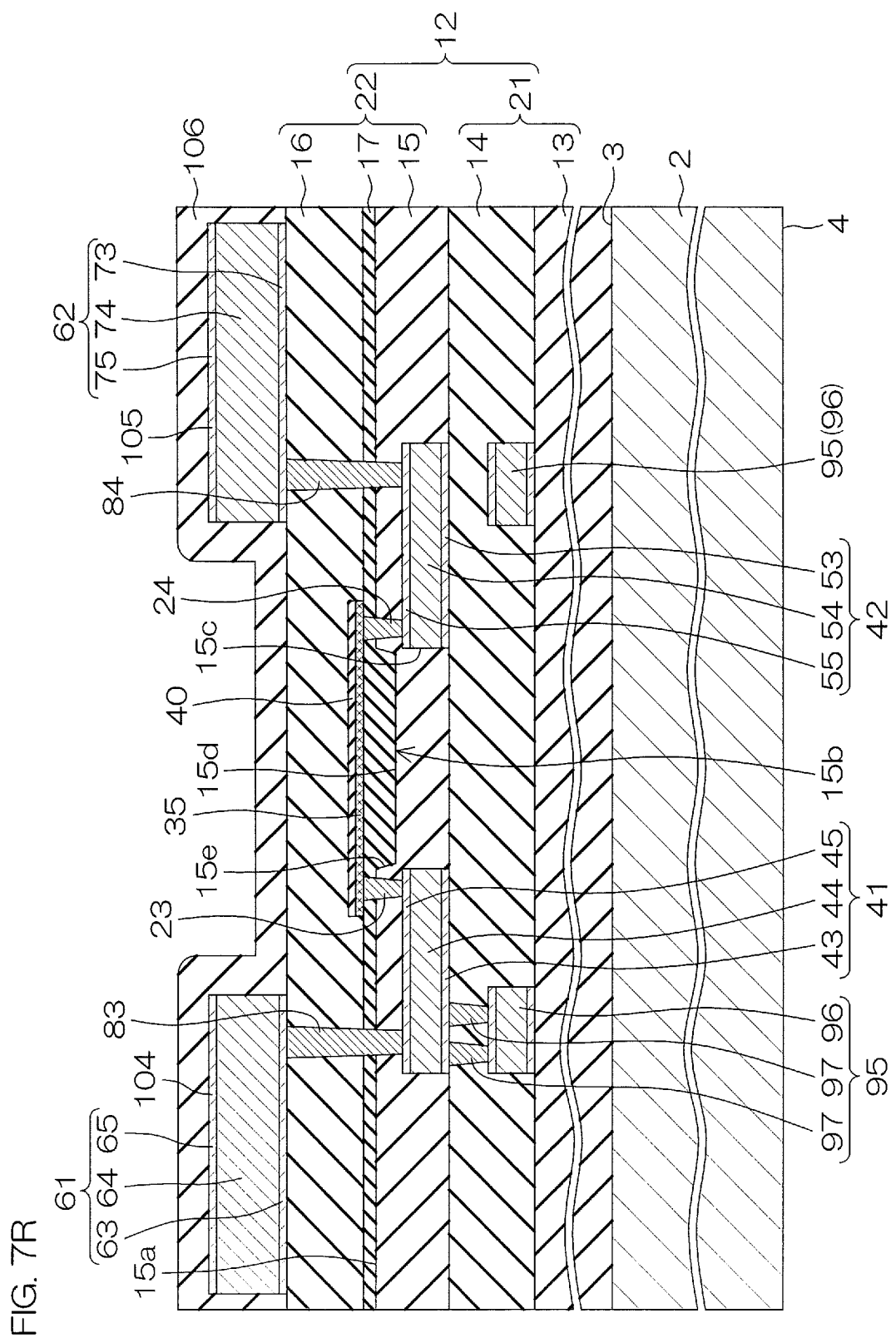
FIG. 7R is a cross-sectional view shown to describe a step subsequent to that of FIG. 7Q.
Figure 7S:
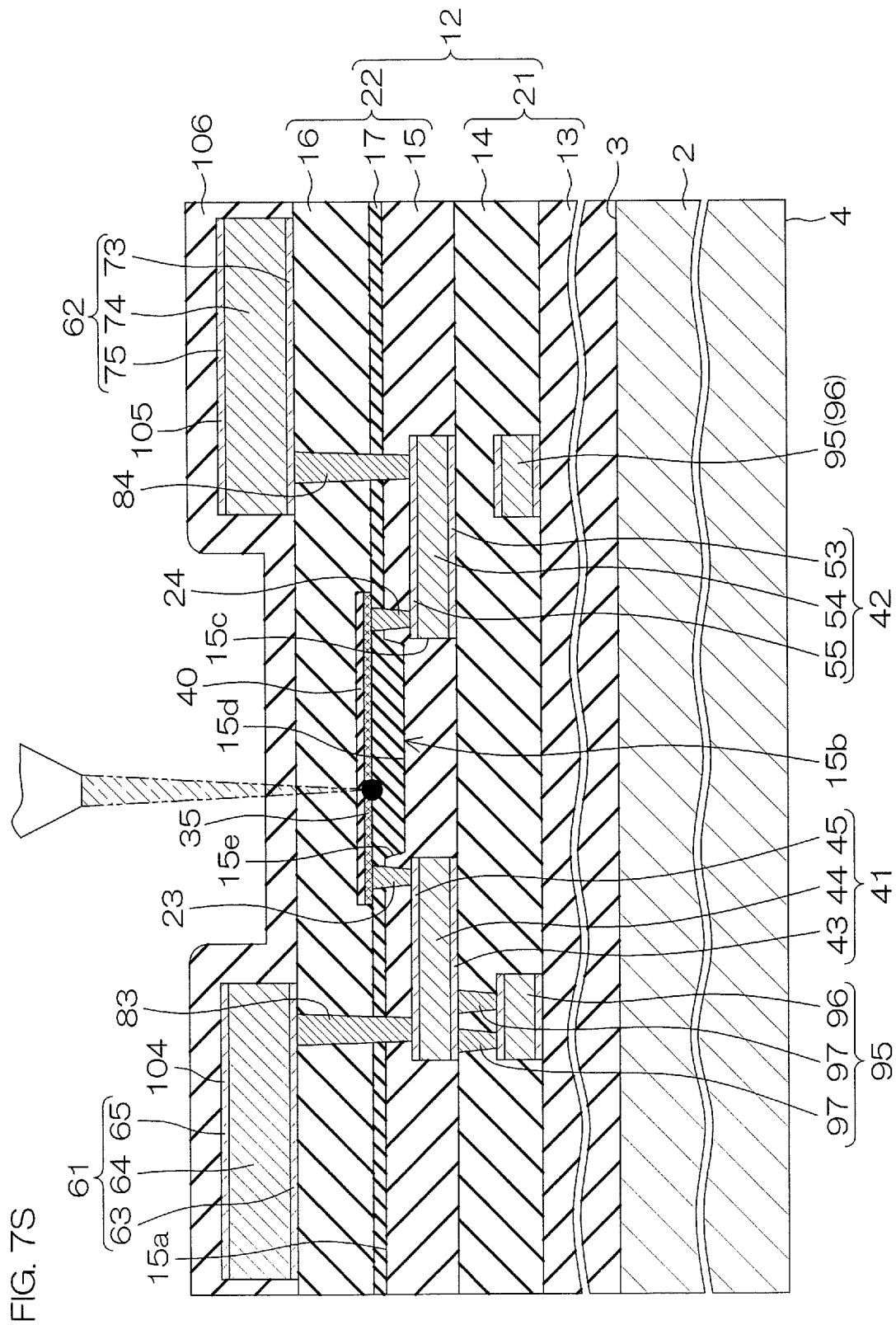
FIG. 7S is a cross-sectional view shown to describe a step subsequent to that of FIG. 7R.
Figure 7T:
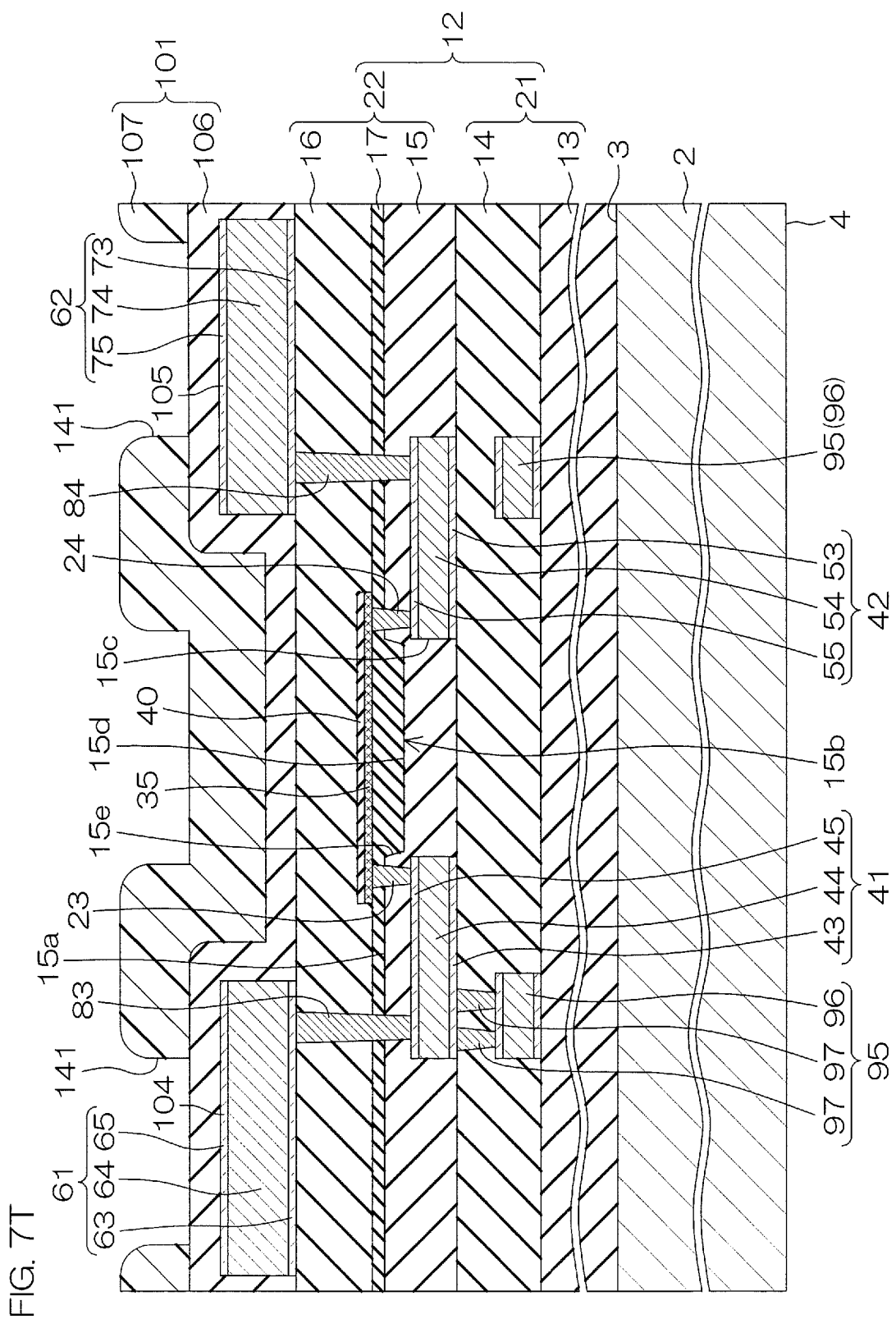
FIG. 7T is a cross-sectional view shown to describe a step subsequent to that of FIG. 7S.
Figure 7U:
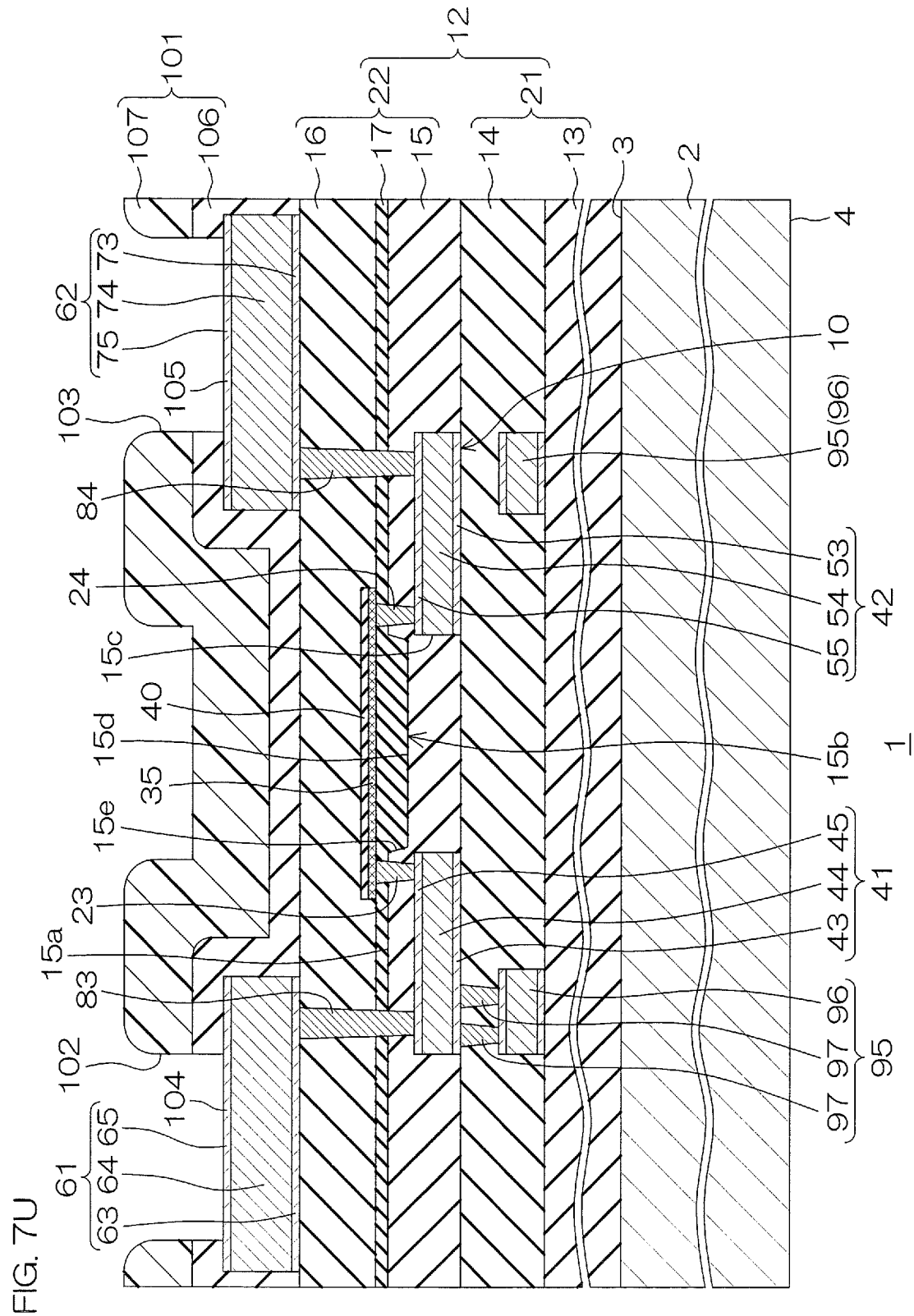
FIG. 7U is a cross-sectional view shown to describe a step subsequent to that of FIG. 7T.

FIG. 7A to FIG. 7U are cross-sectional views shown to describe an example of a method of producing the electronic component 1 of FIG. 1. FIG. 7A to FIG. 7U are cross-sectional views of a part, which corresponds to FIG. 2, of the electronic component 1.

Referring to FIG. 10A, the semiconductor layer 2 is prepared. The semiconductor layer 2 includes the device region 6 and the outside region 7. Next, the wiring circuit forming layer 21 of the insulating laminated structure 12 is formed on the first principal surface 3 of the semiconductor layer 2. The wiring circuit forming layer 21 includes the first insulating layer 13, the second insulating layer 14, the single or plurality of connection wiring layers 96, and the single or plurality of connection via electrodes 97. A description of forming step of the wiring circuit forming layer 21 is omitted.

Next, referring to FIG. 7B, a first base wiring layer 111 that serves as a base of the first lower wiring layer 41 and as a base of the second lower wiring layer 42 is formed on the wiring circuit forming layer 21. The forming step of the first base wiring layer 111 includes a step of forming a first barrier layer 112, a main body layer 113, and a second barrier layer 114 in that order from the top of the wiring circuit forming layer 21.

The forming step of the first barrier layer 112 includes a step of forming a Ti layer and a TiN layer in that order from the top of the wiring circuit forming layer 21. The Ti layer and the TiN layer may be each formed by a sputtering method. The forming step of the main body layer 113 includes a step of forming an AlCu alloy layer on the first barrier layer 112. The AlCu alloy layer may be formed by the sputtering method.

The forming step of the second barrier layer 114 includes a step of forming a Ti layer and a TiN layer in that order from the top of the main body layer 113. The Ti layer and the TiN layer may be each formed by the sputtering method.

Next, referring to FIG. 7C, a mask 115 having a predetermined pattern is formed on the first base wiring layer 111. The mask 115 has an opening 116 that covers a region in which the first lower wiring layer 41 and the second lower wiring layer 42 in the first base wiring layer 111 are to be formed and that exposes regions other than the region in which the first lower wiring layer 41 and the second lower wiring layer 42 are to be formed.

Next, unnecessary portions of the first base wiring layer 111 are removed by an etching method through the mask 115. Hence, the first base wiring layer 111 is divided into the first lower wiring layer 41 and the second lower wiring layer 42. The mask 115 is removed afterward.

Next, referring to FIG. 7D, the third insulating layer 15 covering the first and second lower wiring layers 41 and 42 is formed on the wiring circuit forming layer 21. The third insulating layer 15 is formed by HDP-CDV (High Density Plasma Chemical Vapor Deposition). As a result, a stepped surface on which the shape of the first lower wiring layer 41 and the shape of the second lower wiring layer 42 are reflected is formed at the third insulating layer 15. In other words, the first surface 15a serving as a principal surface and the concave portion 15b hollowed from the first surface 15a in the region 15c between the first lower wiring layer 41 and the second lower wiring layer 42 are formed at the third insulating layer 15.

Next, referring to FIG. 7E, the barrier layer 17 is formed on the third insulating layer 15. In other words, a silicon oxide film (TEOS film) serving as the barrier layer 17 is formed by P-CDV (Plasma Chemical Vapor Deposition). The barrier layer 17 is formed so as to flatten its upper surface. As a result, the thickness of the barrier layer 17 becomes larger than surroundings in the region 15c between the first lower wiring layer 41 and the second lower wiring layer 42.

Next, referring to FIG. 7F, a first via hole 117 that exposes the first lower wiring layer 41 and a second via hole 118 that exposes the second lower wiring layer 42 are formed in the third insulating layer 15 and the barrier layer 17. In this step, a mask 119 having a predetermined pattern is first formed on the third insulating layer 15. The mask 119 has a plurality of openings 120 that expose a region in which the first via hole 117 and the second via hole 118 are to be formed in the barrier layer 17.

Next, unnecessary portions of the third insulating layer 15 and unnecessary portions of the barrier layer 17 are removed by the etching method through the mask 119. Hence, the first via hole 117 and the second via hole 118 are formed in the third insulating layer 15 and the barrier layer 17. The mask 119 is removed afterward.

Next, referring to FIG. 7G, a base electrode layer 121 that serves as a base of the first via electrode 23 and as a base of the second via electrode 24 is formed on the barrier layer 17. The forming step of the base electrode layer 121 includes a step of forming a barrier layer 122 and a main body layer 123 in that order from the top of the barrier layer 17.

The forming step of the barrier layer 122 includes a step of forming a Ti layer and a TiN layer in that order from the top of the barrier layer 17. The Ti layer and the TiN layer may be each formed by the sputtering method. The forming step of the main body layer 123 includes a step of forming a tungsten layer on the barrier layer 122. The tungsten layer may be formed by a CVD method.

Next, referring to FIG. 7H, the removing step of the base electrode layer 121 is performed. The base electrode layer 121 is removed until the barrier layer 17 is exposed. The removing step of the base electrode layer 121 may include a step of removing the base electrode layer 121 by grinding.

In this embodiment, the grinding step of the base electrode layer 121 is performed by a CMP (Chemical Mechanical Polishing) method that uses a polishing agent (abrasive grains). The grinding step of the base electrode layer 121 may include a step of flattening the principal surface of the barrier layer 17. Hence, the first via electrode 23 is formed inside the first via hole 117. Additionally, the second via electrode 24 is formed inside the second via hole 118.

Thereafter, referring to FIG. 7I, the polishing agent (abrasive grains) that has adhered to the principal surface of the barrier layer 17 is removed by washing while using a chemical liquid. A part of the barrier layer 17 is removed together with the polishing agent (abrasive grains) by means of the chemical liquid in this step. Hence, a part of the first via electrode 23 is formed as the first projecting portion 23c that projects from the barrier layer 17. Additionally, a part of the second via electrode 24 is formed as the second projecting portion 24c that projects from the barrier layer 17.

Next, referring to FIG. 7J, a base resistance layer 124 that serves as a base of the thin film resistor 35 is formed on the principal surface of the barrier layer 17. The base resistance layer 124 includes chromium silicide. The base resistance layer 124 may include at least one among CrSi, CrSi2, CrSiN, and CrSiO as an example of the chromium silicide. In this embodiment, the base resistance layer 124 is made of CrSi. The base resistance layer 124 may be formed by the sputtering method.

Next, a base protective layer 125 that serves as a base of the protective layer 40 is formed on the base resistance layer 124. The base protective layer 125 includes silicon oxide. The base protective layer 125 may be formed by the CVD method.

Next, the base resistance layer 124 (CrSi) is crystallized. The crystallization step of the base resistance layer 124 includes a step of performing annealing treatment at temperature and time at which the base resistance layer 124 (CrSi) is crystallized. The base resistance layer 124 may be heated during a period of time of not less than 60 minutes and not more than 120 minutes at a temperature of not less than 400° and not more than 600°. The crystallization step of the base resistance layer 124 may be performed prior to the forming step of the protective layer 40 after the forming step of the base resistance layer 124.

Next, referring to FIG. 7K, a mask 126 having a predetermined pattern is formed on the base protective layer 125. The mask 126 has an opening 127 that covers a region in which the protective layer 40 is to be formed in the base protective layer 125 and that exposes regions other than the region in which the protective layer 40 is to be formed. Next, unnecessary portions of the base protective layer 125 are removed by the etching method through the mask 126. Hence, the protective layer 40 is formed.

Next, unnecessary portions of the base resistance layer 124 are removed by an etching method in which the mask 126 and the protective layer 40 are each used as a mask. Hence, the thin film resistor 35 is formed. The mask 126 is removed afterward. The mask 126 may be removed prior to the forming step of the thin film resistor 35 after the forming step of the protective layer 40.

Next, referring to FIG. 7L, the fourth insulating layer 16 covering the protective layer 40 and the thin film resistor 35 is formed on the barrier layer 17. The fourth insulating layer 16 may be formed by the CVD method.

Next, referring to FIG. 7M, a first via hole 128 that exposes the first lower wiring layer 41 and a second via hole 129 that exposes the second lower wiring layer 42 are formed in the third insulating layer 15, the barrier layer 17, and the fourth insulating layer 16.

In this step, a mask 130 having a predetermined pattern is first formed on the fourth insulating layer 16. The mask 130 has a plurality of openings 131 that expose a region in which the first via hole 128 and the second via hole 129 are to be formed in the fourth insulating layer 16.

Next, unnecessary portions of the third insulating layer 15, unnecessary portions of the barrier layer 17, and unnecessary portions of the fourth insulating layer 16 are removed by the etching method through the mask 130. Hence, the first via hole 128 and the second via hole 129 are formed in the third insulating layer 15, the barrier layer 17, and the fourth insulating layer 16. The mask 130 is removed afterward.

Next, referring to FIG. 7N, a base electrode layer 132 that serves as a base of the first long via electrode 83 and as a base of the second long via electrode 84 is formed on the fourth insulating layer 16. The forming step of the base electrode layer 132 includes a step of forming a barrier layer 133 and a main body layer 134 in that order from the top of the fourth insulating layer 16.

The forming step of the barrier layer 133 includes a step of forming a Ti layer and a TiN layer in that order from the top of the fourth insulating layer 16. The Ti layer and the TiN layer may be each formed by the sputtering method. The forming step of the main body layer 134 includes a step of forming a tungsten layer on the barrier layer 133. The tungsten layer may be formed by the CVD method.

Next, referring to FIG. 7O, the removing step of the base electrode layer 132 is performed. The base electrode layer 132 is removed until the fourth insulating layer 16 is exposed. The removing step of the base electrode layer 132 may include a step of removing the base electrode layer 132 by grinding.

In this embodiment, the grinding step of the base electrode layer 132 is performed by the CMP method using a polishing agent (abrasive grains). The grinding step of the base electrode layer 132 may include a step of flattening the principal surface of the fourth insulating layer 16. Hence, the first long via electrode 83 and the second long via electrode 84 are formed in the first via hole 128 and the second via hole 129, respectively.

The polishing agent (abrasive grains) that has adhered to the principal surface of the fourth insulating layer 16 may be removed by washing while using a chemical liquid after the grinding step of the base electrode layer 132. A part of the fourth insulating layer 16 may be removed together with the polishing agent (abrasive grains) by means of a chemical liquid. In this case, a part of the first long via electrode 83 may be formed as a projecting portion that projects from the fourth insulating layer 16. Additionally, a part of the second long via electrode 84 may be formed as a projecting portion that projects from the fourth insulating layer 16.

Next, referring to FIG. 7P, a second base wiring layer 135 that serves as a base of the first upper wiring layer 61 and as a base of the second upper wiring layer 62 is formed on the fourth insulating layer 16. The forming step of the second base wiring layer 135 includes a step of forming a first barrier layer 136, a main body layer 137, and a second barrier layer 138 in that order from the top of the fourth insulating layer 16.

The forming step of the first barrier layer 136 includes a step of forming a Ti layer and a TiN layer in that order from the top of the fourth insulating layer 16. The Ti layer and the TiN layer may be each formed by the sputtering method. The forming step of the main body layer 137 includes a step of forming an AlCu alloy layer on the first barrier layer 136. The AlCu alloy layer may be formed by the sputtering method.

The forming step of the second barrier layer 138 includes a step of forming a Ti layer and a TiN layer in that order from the top of the main body layer 137. The Ti layer and the TiN layer may be each formed by the sputtering method.

Next, referring to FIG. 7Q, a mask 139 having a predetermined pattern is formed on the second base wiring layer 135. The mask 139 has an opening 140 that covers a region in which the first upper wiring layer 61 and the second upper wiring layer 62 in the second base wiring layer 135 are to be formed in the outside region 7 and that exposes regions other than the region in which the first upper wiring layer 61 and the second upper wiring layer 62 are to be formed.

Next, unnecessary portions of the second base wiring layer 135 are removed by the etching method through the mask 139. Hence, the second base wiring layer 135 is divided into the first upper wiring layer 61 and the second upper wiring layer 62. Additionally, hence, the insulating laminated structure 12 including the wiring circuit forming layer 21 and the resistance circuit forming layer 22 is formed on the first principal surface 3 of the semiconductor layer 2. The mask 139 is removed afterward.

Next, referring to FIG. 7R, the passivation layer 106 is formed on the insulating laminated structure 12. The passivation layer 106 includes silicon nitride. The passivation layer 106 may be formed by the CVD method.

Next, referring to FIG. 7S, the trimming mark 38 is formed in a predetermined region of the thin film resistor 35 (see FIG. 5). In this step, the trimming mark 38 is formed at the thin film resistor 35 by removing (trimming) a part of the thin film resistor 35 by means of a laser radiation method. Hence, the resistance value of the thin film resistor 35 is adjusted so as to be a desired value.

Next, referring to FIG. 7T, a photosensitive resin that becomes the resin layer 107 is applied onto the passivation layer 106. The photosensitive resin may include at least one among polyimide, polyamide, and polybenzoxazole. Preferably, the photosensitive resin is made of polyimide or polybenzoxazole. Next, the photosensitive resin is selectively exposed to light, and is then developed. Hence, the resin layer 107 having a plurality of openings 141 that serve as a base of the first pad opening 102 and as a base of the second pad opening 103 is formed.

Next, referring to FIG. 7U, unnecessary portions of the passivation layer 106 are removed by the etching method through the resin layer 107. Hence, the first pad opening 102 and the second pad opening 103 that expose the first upper wiring layer 61 and the second upper wiring layer 62, respectively, are formed. The electronic component 1 is produced through a process including these steps.

Second Preferred Embodiment

Figure 8:
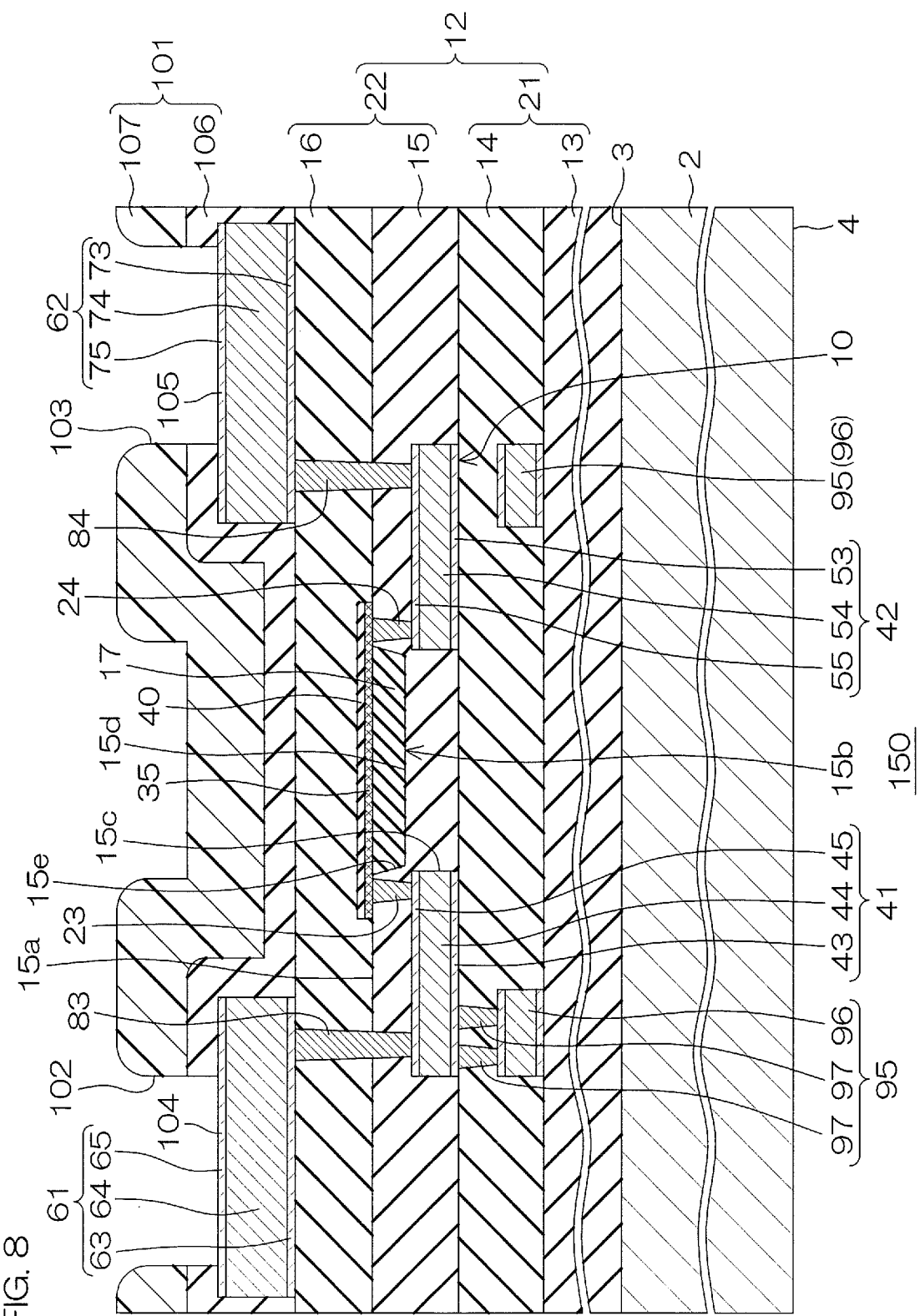
FIG. 8 is a cross-sectional view showing an electronic component according to a second preferred embodiment of the present disclosure.

FIG. 8 is a cross-sectional view, which corresponds to FIG. 2, showing an electronic component 150 according to a second preferred embodiment of the present disclosure. The same reference sign is hereinafter given to a constituent corresponding to each constituent described with respect to the electronic component 1 according to the first preferred embodiment, and a description of this constituent is omitted.

The electronic component 150 according to the second preferred embodiment has a configuration in which the barrier layer 17 overlaps only one part of the thin film resistor 35. The barrier layer 17 overlaps a central region of the thin film resistor 35, whereas the barrier layer 17 does not overlap end regions of the thin film resistor 35. The barrier layer 17 is formed on the bottom surface 15*d* of the third insulating layer 15, and yet is not formed on the first surface 15*a* of the third insulating layer 15. More specifically, the barrier layer 17 may have only its part embedded in the concave portion 15*b* of the third insulating layer 15, and the first surface 15*a* of the third insulating layer 15 is exposed from the barrier layer 17. Hence, a part of the thin film resistor 35 is in contact with the first surface 15*a* of the third insulating layer 15.

The fourth insulating layer 16 is in contact with the first surface 15*a* of the third insulating layer 15. Therefore, the first via electrode 23 and the second via electrode 24 are embedded in the third insulating layer 15. Additionally, the first long via electrode 83 and the second long via electrode 84 are embedded in the third insulating layer 15 and the fourth insulating layer 16.

Likewise, with the thus formed electronic component 150, the barrier layer 17 obstructs the transmission of impurities included in the third insulating layer 15, and therefore the surface resistance of the thin film resistor 35 becomes insusceptible to the impurities. As a result, it is possible to reduce the in-plane variation of the surface resistance of the thin film resistor 35.

Figure 9:
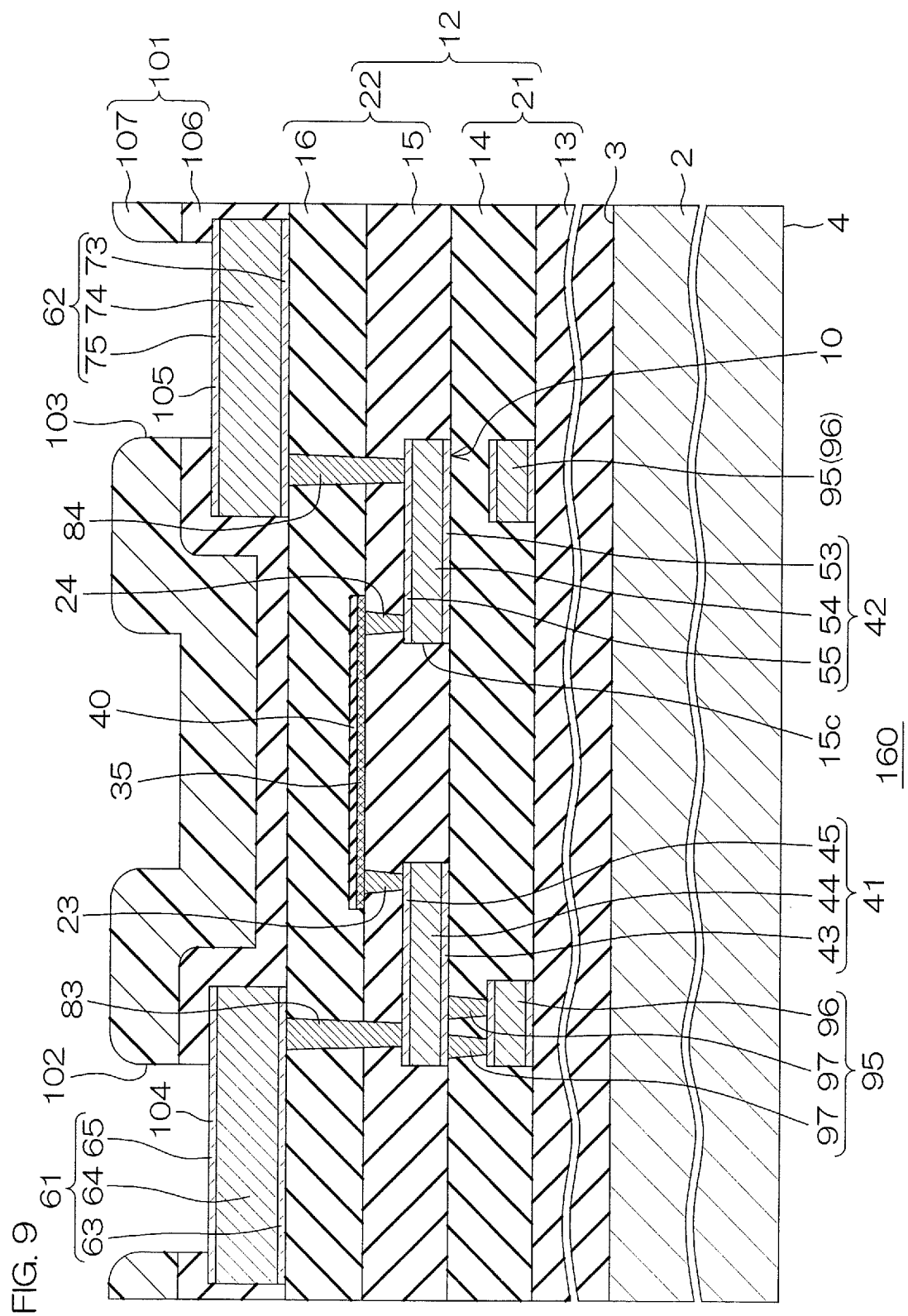
FIG. 9 is a cross-sectional view showing an electronic component that does not have a barrier layer in the present disclosure.
Figure 10:
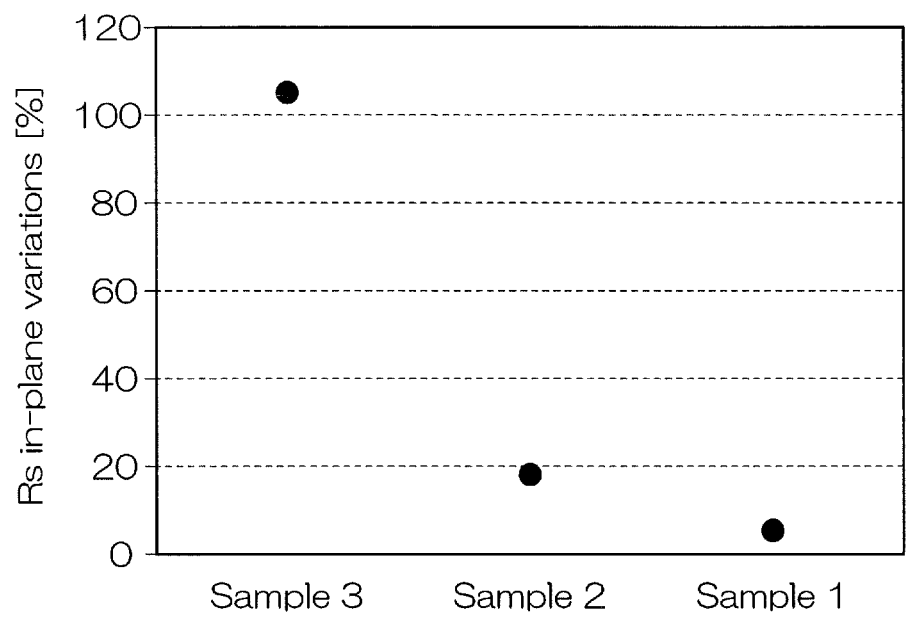
FIG. 10 is a graph showing in-plane variations of surface resistance in the thin film resistor.

Next, samples in which the present disclosure has been carried out will be described. The present disclosure is not limited to the following samples. FIG. 9 is a cross-sectional view, which corresponds to FIG. 2, showing an electronic component 160 according to Sample 3. FIG. 10 is a graph showing in-plane variations of surface resistance Rs in the thin film resistor 35.

A reference example is the electronic component 160 that does not have the barrier layer 17 and in which the fourth insulating layer 16 is laminated on the third insulating layer 15. Sample 1 corresponds to the electronic component 1 according to the first preferred embodiment shown in FIG. 2. Sample 2 corresponds to the electronic component 150 according to the second preferred embodiment shown in FIG. 8.

As shown in FIG. 10, it was ascertained that the in-plane variation of the surface resistance Rs exceeds 100% in the reference example, whereas the in-plane variation of the surface resistance Rs is suppressed to 20% or less in Sample 2, and is suppressed to 10% or less in Sample 1.

Third Preferred Embodiment

Figure 11:
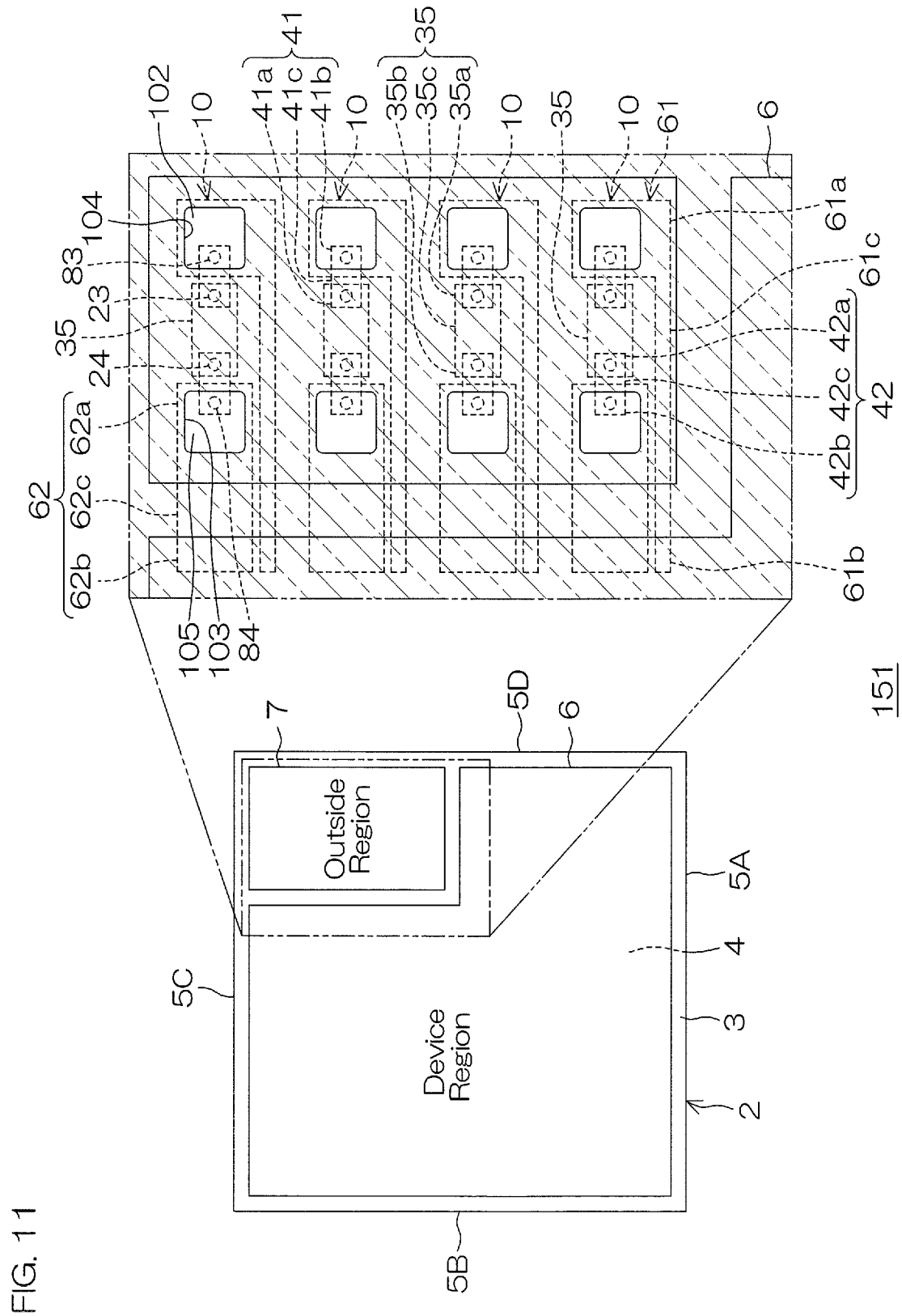
FIG. 11 is a schematic plan view showing an electronic component according to a third preferred embodiment of the present disclosure.

FIG. 11 is a schematic plan view showing an electronic component 151 according to a third preferred embodiment of the present disclosure, and is a plan view showing a form in which the thin film resistor 35 according to a first configuration example is incorporated therein.

The electronic component 1 includes the single resistance circuit 10 (thin film resistor 35) formed in the outside region 7. On the other hand, referring to FIG. 11, the electronic component 151 includes a plurality of (two or more: in this embodiment, four) resistance circuits 10 (thin film resistors 35) formed in the outside region 7. The number of resistance circuits 10 (thin film resistors 35) is arbitrary, and may be set so as to be five or more in accordance with the form of the functional device.

The resistance circuits 10 (thin film resistors 35) are each electrically connected to the device region 6 (functional device) through the wiring circuit forming layer 21. Each of the resistance circuits 10 (thin film resistors 35) may be electrically connected to the device region 6 independently of each other. At least two among the resistance circuits 10 (thin film resistors 35) may be connected in parallel or in series with each other.

As described above, the electronic component 151 is likewise enabled to fulfill the same effect as the effect described with respect to the electronic component 1.

Figure 12:
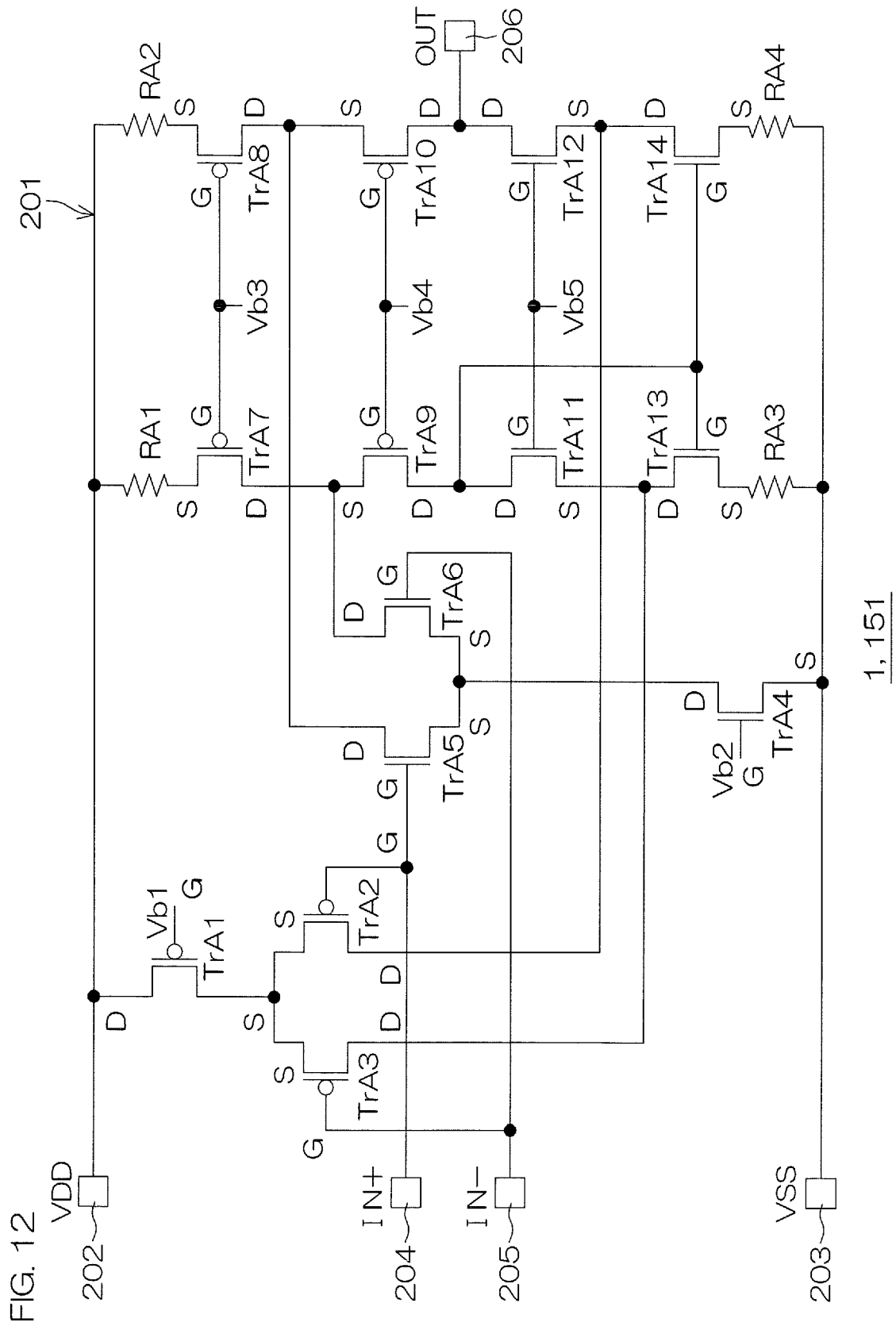
FIG. 12 is a circuit diagram showing an electric structure according to the first configuration example of the electronic component according to the first preferred embodiment and of the electronic component according to the second preferred embodiment.

The electronic component 1 according to the first preferred embodiment, the electronic component 150 according to the second preferred embodiment, and the electronic component 151 according to the third preferred embodiment may have an electric structure shown in FIG. 12. FIG. 12 is a circuit diagram showing an electric structure according to the first configuration example of the electronic component 1 according to the first preferred embodiment and of the electronic component 151 according to the second preferred embodiment.

Referring to FIG. 12, the electronic components 1 and 151 include an operational amplifier circuit 201. The operational amplifier circuit 201 includes a positive supply terminal 202, a negative supply terminal 203, a non-inverted positive supply terminal 204, an inverted positive supply terminal 205, an output terminal 206, transistors TrA1 to TrA14 (semiconductor switching devices), and resistors RA1 to RA4 (passive devices).

A power supply voltage VDD is input to the positive supply terminal 202. A reference voltage VSS is input to the negative supply terminal 203. The reference voltage VSS may be a ground voltage. A non-inverted voltage VIN+ is input to the non-inverted positive supply terminal 204. An inverted voltage VIN− is input to the inverted positive supply terminal 205. The operational amplifier circuit 201 amplifies a difference voltage between the non-inverted voltage VIN+ and the inverted voltage VIN−, and outputs it from the output terminal 206. In short, the operational amplifier circuit 201 is a differential operational amplifier circuit.

The transistors TrA1 to TrA14 are each formed in the device region 6 in the semiconductor layer 2. In other words, the functional device formed in the device region 6 includes a circuit network formed by the transistors TrA1 to TrA14. The transistors TrA1 to TrA3 and TrA7 to TrA10 each consist of a p type MISFET. The transistors TrA4 to TrA6 and TrA11 to TrA14 each consist of an n type MISFET.

On the other hand, the resistors RA1 to RA4 are formed in the outside region 7 in the semiconductor layer 2. At least one or all of the resistors RA1 to RA4 are formed by the thin film resistor 35. The resistors RA1 to RA4 form current-value setting resistance, and determine a current amplification factor. The resistors RA1 to RA4 are selectively connected to a circuit network formed by the transistors TrA1 to TrA14 through the wiring circuit forming layer 21 (connection wiring layer 96 and connection via electrode 97).

A bias voltage Vb1 is input to a gate of the transistor TrA1. A drain of the transistor TrA1 is connected to the positive supply terminal 202. A source of the transistor TrA1 is connected to a source of the transistor TrA2 and to a source of the transistor TrA3. A gate of the transistor TrA2 is connected to the non-inverted positive supply terminal 204. A gate of the transistor TrA3 is connected to the inverted positive supply terminal 205.

A bias voltage Vb2 is input to a gate of the transistor TrA4. A drain of the transistor TrA4 is connected to a source of the transistor TrA5 and to a source of the transistor TrA6.

A source of the transistor TrA4 is connected to the negative supply terminal 203. A gate of the transistor TrA5 is connected to the non-inverted positive supply terminal 204. A gate of the transistor TrA6 is connected to the inverted positive supply terminal 205.

A gate of the transistor TrA7 is connected to a gate of the transistor TrA8. A bias voltage Vb3 is input to the gate of the transistor TrA7 and to the gate of the transistor TrA8. A source of the transistor TrA7 is connected to the positive supply terminal 202 through the resistor RA1.

A drain of the transistor TrA7 is connected to a source of the transistor TrA9. A source of the transistor TrA8 is connected to the positive supply terminal 202 through the resistor RA2. A drain of the transistor TrA8 is connected to a source of the transistor TrA10.

A gate of the transistor TrA9 is connected to a gate of the transistor TrA10. A bias voltage Vb4 is input to the gate of the transistor TrA9 and to the gate of the transistor TrA10. A drain of the transistor TrA9 is connected to a drain of the transistor TrA11. A drain of the transistor TrA10 is connected to a drain of the transistor TrA12.

A drain of the transistor TrA6 is connected to a connection portion between the drain of the transistor TrA7 and the source of the transistor TrA9. A drain of the transistor TrA5 is connected to a connection portion between the drain of the transistor TrA8 and the source of the transistor TrA10.

A gate of the transistor TrA11 is connected to a gate of the transistor TrA12. A bias voltage Vb5 is input to the gate of the transistor TrA11 and to the gate of the transistor TrA12. A source of the transistor TrA11 is connected to a drain of the transistor TrA13. A source of the transistor TrA12 is connected to a drain of the transistor TrA14.

A gate of the transistor TrA13 is connected to a gate of the transistor TrA14. The gate of the transistor TrA13 and the gate of the transistor TrA14 are connected to the drain of the transistor TrA11.

A source of the transistor TrA13 is connected to the negative supply terminal 203 through the resistor RA3. A source of the transistor TrA14 is connected to the negative supply terminal 203 through the resistor RA4.

An example in which the operational amplifier circuit 201 includes the transistors TrA1 to TrA6 has been described in this embodiment. However, the operational amplifier circuit 201 that does not include the transistors TrA1 to TrA3 may be employed, or the operational amplifier circuit 201 that does not include the transistors TrA4 to TrA6 may be employed.

Figure 13:
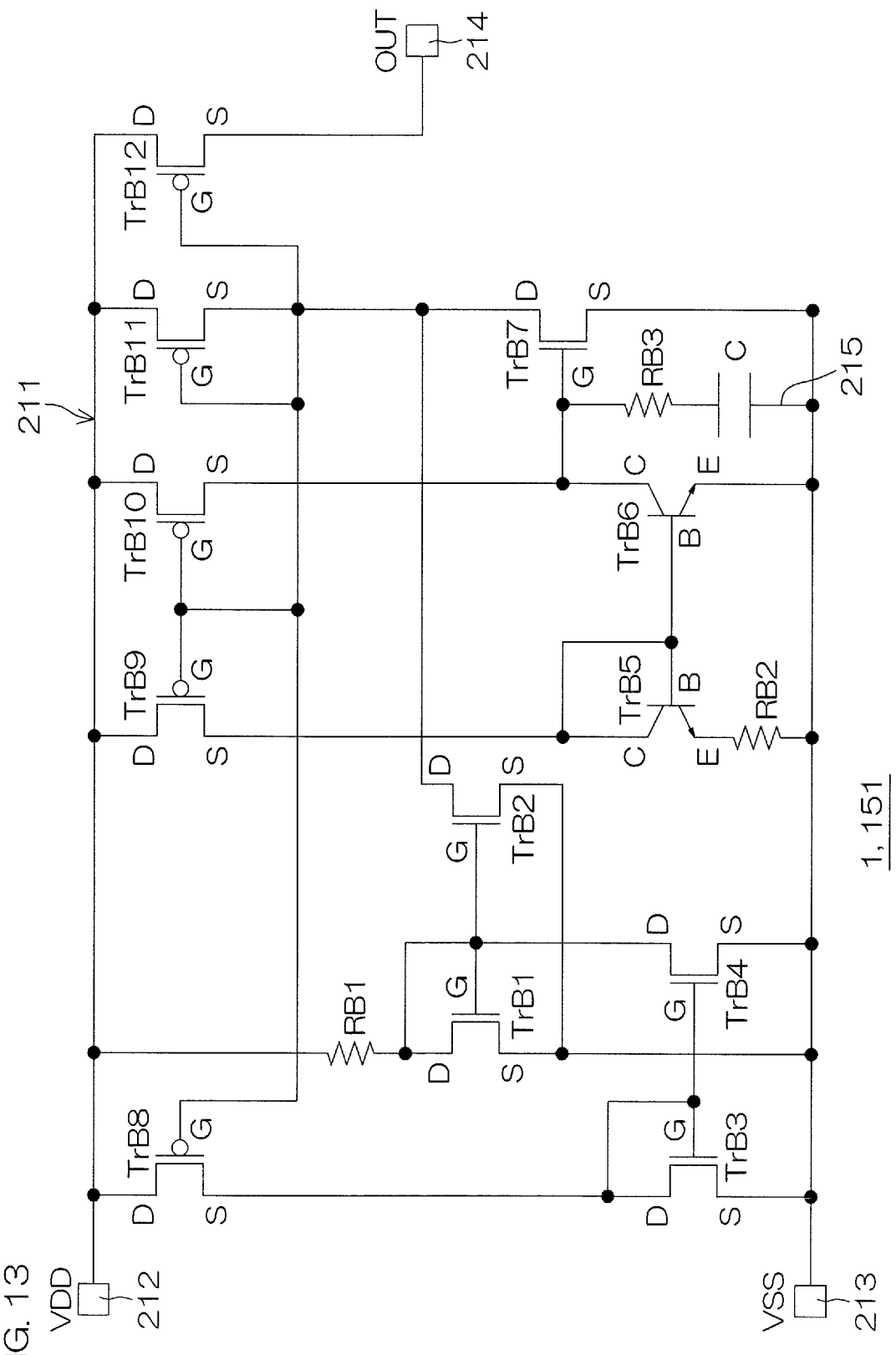
FIG. 13 is a circuit diagram showing an electric structure according to a second configuration example of the electronic component according to the first preferred embodiment and of the electronic component according to the second preferred embodiment.

The electronic component 1 according to the first preferred embodiment, the electronic component 150 according to the second preferred embodiment, and the electronic component 151 according to the third preferred embodiment may have an electric structure shown in FIG. 13. FIG. 13 is a circuit diagram showing an electric structure according to a second configuration example of the electronic component 1 according to the first preferred embodiment, of the electronic component 150 according to the second preferred embodiment, and of the electronic component 151 according to the third preferred embodiment.

Referring to FIG. 13, the electronic components 1 and 151 include a current amplification type constant current regulator 211. The constant current regulator 211 includes a positive supply terminal 212, a negative supply terminal 213, an output terminal 214, transistors TrB1 to TrB12 (semiconductor switching devices), resistors RB1 to RB3 (passive devices), and a capacitor C (passive device).

A power supply voltage VDD is input to the positive supply terminal 212. A reference voltage VSS is input to the negative supply terminal 213. The reference voltage VSS may be a ground voltage. The constant current regulator 211 outputs a constant current according to a potential difference between the power supply voltage VDD and the reference voltage VSS from the output terminal 214.

The transistors TrB1 to TrB12, the resistors RB1 and RB3, and the capacitor C are each formed in the device region 6 in the semiconductor layer 2. In other words, the functional device formed in the device region 6 includes a circuit network formed by the transistors TrB1 to TrB12, the resistors RB1 and RB3, and the capacitor C.

The transistors TrB1 to TrB4 and TrB7 each consist of an n type MISFET. The transistor TrB5 and TrB6 each consist of an npn type BJT. The transistors TrB8 to TrB12 each consist of a p type MISFET. The resistors RB1 and RB3 may be each made of polysilicon resistance.

The resistor RB2 is formed in the outside region 7 in the semiconductor layer 2. The resistor RB2 is formed by the thin film resistor 35. The resistor RB2 forms current-value setting resistance, and determines a current amplification factor. The resistor RB2 is selectively connected to a circuit network formed by the transistors TrB1 to TrB12, the resistors RB1 and RB3, and the capacitor C through the wiring circuit forming layer 21 (connection wiring layer 96 and connection via electrode 97).

A gate of the transistor TrB1 is connected to a gate of the transistor TrB2. The gate of the transistor TrB1 and the gate of the transistor TrB2 are connected to a drain of the transistor TrB1.

The drain of the transistor TrB1 is connected to the positive supply terminal 212 through the resistor RB1. A source of the transistor TrB1 is connected to the negative supply terminal 213. A source of the transistor TrB2 is connected to the source of the transistor TrB1.

A gate of the transistor TrB3 is connected to a gate of the transistor TrB4. The gate of the transistor TrB3 and the gate of the transistor TrB4 are connected to a drain of the transistor TrB3.

A source of the transistor TrB3 is connected to the negative supply terminal 213. A drain of the transistor TrB2 is connected to the gate of the transistor TrB1 and to the gate of the transistor TrB2. A source of the transistor TrB4 is connected to the negative supply terminal 213.

A base of the transistor TrB5 is connected to a base of the transistor TrB6. The base of the transistor TrB5 and the base of the transistor TrB6 are connected to a collector of the transistor TrB5. An emitter of the transistor TrB5 is connected to the negative supply terminal 213 through the resistor RB2. An emitter of the transistor TrB6 is connected to the negative supply terminal 213.

A gate of the transistor TrB7 is connected to a collector of the transistor TrB6. A drain of the transistor TrB7 is connected to the drain of the transistor TrB2. A source of the transistor TrB7 is connected to the negative supply terminal 213.

The resistor RB3 forms an RC series circuit 215 with the capacitor C. The RC series circuit 215 is connected to an area between the gate of the transistor TrB7 and the negative supply terminal 213.

Gates of the transistors TrB8 to TrB12 are connected to each other. The gates of the transistor TrB8 to TrB12 are each connected to the gate of the transistor TrB7. Drains of the transistors TrB8 to TrB12 are each connected to the positive supply terminal 212.

A source of the transistor TrB8 is connected to the drain of the transistor TrB3. A source of the transistor TrB9 is connected to the collector of the transistor TrB5. A source of the transistor TrB10 is connected to the collector of the transistor TrB6.

A source of the transistor TrB11 is connected to the gates of the transistors TrB8, TrB9, TrB10, and TrB12, and is connected to the drain of the transistor TrB7. A source of the transistor TrB12 is connected to the output terminal 214.

Besides, various design changes can be made within the range of items listed in the claims.

The following features can be extracted from the present disclosure besides the invention described in the claims.

[Appendix 1]

An electronic component including:
a first insulating layer that includes impurities,
a thin film resistor formed on the first insulating layer, and
a barrier layer that is formed in at least one part of a region between the thin film resistor and the first insulating layer and that obstructs transmission of the impurities.

According to this configuration, the barrier layer obstructs transmission of impurities included in the first insulating layer, and therefore it is possible to suppress the movement of the impurities from the first insulating layer to the thin film resistor. As a result, the surface resistance of the thin film resistor becomes insusceptible to the impurities, and therefore it is possible to reduce the in-plane variation of the surface resistance.

[Appendix 2]

The electronic component according to Appendix 1, where the barrier layer overlaps entirety of the thin film resistor.

According to this configuration, the impurities are prevented from being moved from the first insulating layer to the thin film resistor over the entirety of the thin film resistor, and therefore it is possible to more considerably reduce the in-plane variation of the surface resistance of the thin film resistor.

[Appendix 3]

The electronic component according to Appendix 1 or Appendix 2, where the first insulating layer includes a first surface and a concave portion that is hollowed with respect to the first surface, and the barrier layer is embedded in the concave portion.

[Appendix 4]

The electronic component according to Appendix 3, where the barrier layer includes a first part embedded in the concave portion and a second part formed along the first surface of the first insulating layer from an upper area of the first part.

[Appendix 5]

The electronic component according to Appendix 3 or Appendix 4, where the concave portion has a bottom surface and an inclined surface that connects the bottom surface and the first surface together.

[Appendix 6]

The electronic component according to any one of Appendix 1 to Appendix 5, where the impurities include Ar.

According to this configuration, it is possible to form the first insulating layer by using Ar as an inert gas, and it is possible to form the thin film resistor whose in-plane variation of the surface resistance has been reduced on the first insulating layer.

[Appendix 7]

The electronic component according to any one of Appendix 1 to Appendix 6, further including:
 a second insulating layer that is formed on the first insulating layer and that covers the thin film resistor,
 a first via electrode that is embedded in the first insulating layer and that is in contact with a first end portion of the thin film resistor, and
 a second via electrode that is embedded in the first insulating layer and that is in contact with a second end portion on a side opposite to the first end portion in the thin film resistor.

[Appendix 8]

The electronic component according to Appendix 7, further including:
 a first lower wiring layer that is formed in a region on a side of the first insulating layer with respect to the thin film resistor and that is electrically connected to the first via electrode, and
 a second lower wiring layer that is formed in a region on a side of the first insulating layer with respect to the thin film resistor and that is electrically connected to the second via electrode.

[Appendix 9]

The electronic component according to Appendix 8, where the thin film resistor is connected in series with the first lower wiring layer and with the second lower wiring layer.

[Appendix 10]

The electronic component according to Appendix 8 or Appendix 9, further including:
 a first upper wiring layer that is formed on the second insulating layer and that is electrically connected to the first lower wiring layer, and
 a second upper wiring layer that is formed on the second insulating layer and that is electrically connected to the second lower wiring layer.

[Appendix 11]

The electronic component according to Appendix 10, where the thin film resistor is connected in series with the first upper wiring layer and with the second upper wiring layer.

[Appendix 12]

The electronic component according to Appendix 10 or Appendix 11, where the first upper wiring layer is away from the thin film resistor in a plan view, and the second upper wiring layer is away from the thin film resistor in a plan view.

[Appendix 13]

The electronic component according to any one of Appendix 10 to Appendix 12, where the first upper wiring layer forms an uppermost wiring layer, and
 the second upper wiring layer forms an uppermost wiring layer.

[Appendix 14]

The electronic component according to any one of Appendix 10 to Appendix 13, where the first upper wiring layer has a thickness equal to or more than a thickness of the first lower wiring layer.

[Appendix 15]

The electronic component according to any one of Appendix 10 to Appendix 14, where the second upper wiring layer has a thickness equal to or more than a thickness of the second lower wiring layer.

[Appendix 16]

The electronic component according to any one of Appendix 10 to Appendix 15, further including:
 a first long via electrode that is allowed to pass though and is embedded in the first insulating layer and the second insulating layer and that is electrically connected to the first lower wiring layer and to the first upper wiring layer, and
 a second long via electrode that is allowed to pass though and is embedded in the first insulating layer and the second insulating layer and that is electrically connected to the second lower wiring layer and to the second upper wiring layer.

[Appendix 17]

The electronic component according to Appendix 16, where the thin film resistor is placed on a straight line that connects the first long via electrode and the second long via electrode together in a plan view.

[Appendix 18]

The electronic component according to Appendix 16 or Appendix 17, where the first long via electrode has a first lower part placed on a side of the first lower wiring layer with respect to the thin film resistor and a first upper part that is placed on a side of the first upper wiring layer with respect to the thin film resistor and that has a length equal to or more than a length of the first lower part.

[Appendix 19]

The electronic component according to any one of Appendix 16 to Appendix 18, where the second long via electrode has a second lower part placed on a side of the second lower wiring layer with respect to the thin film resistor and a second upper part that is placed on a side of the second upper wiring layer with respect to the thin film resistor and that has a length equal to or more than a length of the second lower part.

[Appendix 20]

The electronic component according to any one of Appendix 16 to Appendix 19, further including an insulating layer that covers the first upper wiring layer and the second upper wiring layer and that has a first pad opening by which the first upper wiring layer is exposed and a second pad opening by which the second upper wiring layer is exposed.

[Appendix 21]

The electronic component according to Appendix 20, where the insulating layer covers a connection portion between the first upper wiring layer and the first long via electrode in a plan view.

[Appendix 22]

The electronic component according to Appendix 20 or Appendix 21, where the insulating layer covers a connection portion between the second upper wiring layer and the second long via electrode in a plan view.

[Appendix 23]

The electronic component according to any one of Appendix 7 to Appendix 22, where the first via electrode has a first projecting portion that projects toward the second insulating layer with respect to a principal surface of the first insulating layer, and the thin film resistor covers the first projecting portion of the first via electrode.

[Appendix 24]

The electronic component according to any one of Appendix 7 to Appendix 23, where the second via electrode has a second projecting portion that projects toward the second insulating layer with respect to the principal surface of the first insulating layer, and the thin film resistor covers the second projecting portion of the second via electrode.

[Appendix 25]

The electronic component according to any one of Appendix 1 to Appendix 24, further including a semiconductor layer having a principal surface, where the first insulating layer is formed on the principal surface of the semiconductor layer.

[Appendix 26]

The electronic component according to Appendix 25, where the semiconductor layer includes a device region in which a functional device has been formed and an outside region outside the device region, and the thin film resistor is formed in the outside region in a plan view.

[Appendix 27]

The electronic component according to any one of Appendix 1 to Appendix 26, where the thin film resistor is made of a metal thin film including at least one among CrSi, TaN, and TiN.

[Appendix 28]

A method of producing an electronic component, the method including:

a step of forming a lower wiring layer by sputtering by use of an inert gas;

a first step of forming a first insulating layer so as to cover the lower wiring layer;

a second step of forming a barrier layer on the first insulating layer, the barrier layer obstructing transmission of compositions of the inert gas included in the first insulating layer; and a third step of forming a thin film resistor on the barrier layer so as to allow at least one part of the thin film resistor to overlap the barrier layer.

According to this method, when the lower wiring layer is formed by sputtering, an impurity included in the inert gas remains in the lower wiring layer as an impurity, and this impurity comes to be included in the first insulating layer formed in the first step. However, the barrier layer formed in the second step obstructs the transmission of the impurity, and therefore it is possible to suppress the movement of the impurity to the thin film resistor formed in the third step. As a result, the surface resistance of the thin film resistor becomes insusceptible to the impurity, and therefore it is possible to reduce the in-plane variation of the surface resistance.

[Appendix 29]

The method of producing an electronic component according to Appendix 28, where the lower wiring layer includes a first lower wiring layer and a second lower wiring layer formed with a predetermined region between the second lower wiring layer and the first lower wiring layer, and the first insulating layer is formed so as to have a concave portion on the predetermined region in the first step, the barrier layer is formed so as to be embedded in the concave portion in the second step, and the thin film resistor is formed on the barrier layer embedded in the concave portion in the third step.

[Appendix 30]

The method of producing an electronic component according to Appendix 28 or Appendix 29, where the first step includes a step of forming the first insulating layer by HDP-CDV (High Density Plasma Chemical Vapor Deposition), and the second step includes a step of forming the barrier layer by P-CDV (Plasma Chemical Vapor Deposition) while using a TEOS gas.

This application corresponds to Japanese Patent Application No. 2020-036117 filed in the Japan Patent Office on Mar. 3, 2020, the entire disclosure of which is incorporated herein by reference.

| | Reference Signs List |
|---|---|
| 1 | electronic component |
| 2 | semiconductor layer |
| 3 | first principal surface |
| 6 | device region |
| 7 | outside region |
| 17 | barrier layer |
| 17a | first part |
| 17b | second part |
| 15 | third insulating layer |
| 15a | first surface |
| 15b | concave portion |
| 15c | region |
| 15d | bottom surface |
| 15e | inclined surface |
| 16 | fourth insulating layer |
| 23 | first via electrode |
| 23c | first projecting portion of first via electrode |
| 24 | second via electrode |
| 24c | second projecting portion of second via electrode |
| 35 | thin film resistor |
| 35a | first end portion |
| 35b | second end portion |
| 41 | first lower wiring layer |
| 42 | second lower wiring layer |
| 61 | first upper wiring layer |
| 62 | second upper wiring layer |
| 83 | first long via electrode |
| 83c | lower part of first long via electrode |
| 83d | upper part of first long via electrode |
| 84 | second long via electrode |
| 84c | lower part of second long via electrode |
| 84d | upper part of second long via electrode |
| 101 | uppermost insulating layer |
| 102 | first pad opening |
| 103 | second pad opening |
| 150 | electronic component |
| 151 | electronic component |
| TL1 | first wiring thickness |
| TL2 | second wiring thickness |

The invention claimed is:

1. An electronic component comprising:
a first insulating layer that includes impurities;
a thin film resistor formed on the first insulating layer; and
a barrier layer that is formed in at least one part of a region between the thin film resistor and the first insulating layer and that obstructs transmission of the impurities, wherein
the first insulating layer includes a first surface and a concave portion that is hollowed with respect to the first surface,
the barrier layer is embedded in the concave portion, and
the barrier layer includes a first part embedded in the concave portion and a second part formed along the first surface of the first insulating layer from an upper area of the first part.

2. The electronic component according to claim 1, wherein the barrier layer overlaps an entirety of the thin film resistor.

3. An electronic component comprising:
a first insulating layer that includes impurities;
a thin film resistor formed on the first insulating layer; and
a barrier layer that is formed in at least one part of a region between the thin film resistor and the first insulating layer and that obstructs transmission of the impurities, wherein
the first insulating layer includes a first surface and a concave portion that is hollowed with respect to the first surface,
the barrier layer is embedded in the concave portion, and
the concave portion has a bottom surface and an inclined surface that connects the bottom surface and the first surface together.

4. An electronic component comprising:
a first insulating layer that includes impurities;
a thin film resistor formed on the first insulating layer; and
a barrier layer that is formed in at least one part of a region between the thin film resistor and the first insulating layer and that obstructs transmission of the impurities, wherein the impurities include Ar.

5. The electronic component according to claim 4, further comprising:
a second insulating layer that is formed on the first insulating layer and that covers the thin film resistor;
a first via electrode that is embedded in the first insulating layer and that is in contact with a first end portion of the thin film resistor; and
a second via electrode that is embedded in the first insulating layer and that is in contact with a second end portion on a side opposite to the first end portion in the thin film resistor.

6. The electronic component according to claim 5, further comprising:
a first lower wiring layer that is formed in a region on a side of the first insulating layer with respect to the thin film resistor and that is electrically connected to the first via electrode; and
a second lower wiring layer that is formed in a region on a side of the first insulating layer with respect to the thin film resistor and that is electrically connected to the second via electrode.

7. The electronic component according to claim 6, wherein the thin film resistor is connected in series with the first lower wiring layer and with the second lower wiring layer.

8. The electronic component according to claim 6, further comprising:
a first upper wiring layer that is formed on the second insulating layer and that is electrically connected to the first lower wiring layer; and
a second upper wiring layer that is formed on the second insulating layer and that is electrically connected to the second lower wiring layer.

9. The electronic component according to claim 8, wherein the thin film resistor is connected in series with the first upper wiring layer and with the second upper wiring layer.

10. The electronic component according to claim 8, wherein the first upper wiring layer is away from the thin film resistor in a plan view, and
the second upper wiring layer is away from the thin film resistor in a plan view.

11. The electronic component according to claim 8, wherein the first upper wiring layer forms an uppermost wiring layer, and
the second upper wiring layer forms an uppermost wiring layer.

12. The electronic component according to claim 8, wherein the first upper wiring layer has a thickness equal to or more than a thickness of the first lower wiring layer.

13. The electronic component according to claim 8, wherein the second upper wiring layer has a thickness equal to or more than a thickness of the second lower wiring layer.

14. The electronic component according to claim 8, further comprising:
a first long via electrode that is allowed to pass though and is embedded in the first insulating layer and the second insulating layer and that is electrically connected to the first lower wiring layer and to the first upper wiring layer; and
a second long via electrode that is allowed to pass though and is embedded in the first insulating layer and the second insulating layer and that is electrically connected to the second lower wiring layer and to the second upper wiring layer.

15. The electronic component according to claim 14, wherein the thin film resistor is placed on a straight line that connects the first long via electrode and the second long via electrode together in a plan view.

16. The electronic component according to claim 14, wherein the first long via electrode has a first lower part placed on a side of the first lower wiring layer with respect to the thin film resistor and a first upper part that is placed on a side of the first upper wiring layer with respect to the thin film resistor and that has a length equal to or more than a length of the first lower part.

17. The electronic component according to claim 14, wherein the second long via electrode has a second lower part placed on a side of the second lower wiring layer with respect to the thin film resistor and a second upper part that is placed on a side of the second upper wiring layer with respect to the thin film resistor and that has a length equal to or more than a length of the second lower part.

18. The electronic component according to claim 14, further comprising an insulating layer that covers the first upper wiring layer and the second upper wiring layer and that has a first pad opening by which the first upper wiring layer is exposed and a second pad opening by which the second upper wiring layer is exposed.

* * * * *